(12) United States Patent
Yamazaki et al.

(10) Patent No.: US 9,494,830 B2
(45) Date of Patent: Nov. 15, 2016

(54) SEQUENTIAL CIRCUIT AND SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Hiroyuki Miyake, Atsugi (JP); (Continued)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 85 days.

(21) Appl. No.: 14/290,263

(22) Filed: May 29, 2014

(65) Prior Publication Data
US 2014/0362324 A1 Dec. 11, 2014

(30) Foreign Application Priority Data
Jun. 5, 2013 (JP) .................................. 2013-119037

(51) Int. Cl.
*H01L 27/12* (2006.01)
*G02F 1/1343* (2006.01)
(Continued)

(52) U.S. Cl.
CPC ......... *G02F 1/1343* (2013.01); *G02F 1/13624* (2013.01); *G02F 1/136213* (2013.01); *G02F 2001/13685* (2013.01)

(58) Field of Classification Search
CPC .......................... G02F 1/1343; G02F 1/136213
(Continued)

(56) References Cited

U.S. PATENT DOCUMENTS 5,403,762 A 4/1995 Takemura
5,403,772 A 4/1995 Zhang et al.
(Continued)

FOREIGN PATENT DOCUMENTS

CN 101997005 A 3/2011
EP 1737044 A 12/2006
(Continued)

OTHER PUBLICATIONS

US 8,618,855, 12/2013, Umezaki (withdrawn)
(Continued)

*Primary Examiner* — Sang V Nguyen
(74) *Attorney, Agent, or Firm* — Robinson Intellectual Property Law Office; Eric J. Robinson

(57) ABSTRACT

The following semiconductor device provides high reliability and a narrower frame width. The semiconductor device includes a driver circuit and a pixel portion. The driver circuit has a first transistor including a first gate and a second gate electrically connected to each other with a semiconductor film sandwiched therebetween, and a second transistor electrically connected to the first transistor. The pixel portion includes a third transistor, a liquid crystal element, and a capacitor. The liquid crystal element includes a first transparent conductive film electrically connected to the third transistor, a second conductive film, and a liquid crystal layer. The capacitor includes the first conductive film, a third transparent conductive film, and a nitride insulating film. The nitride insulating film is positioned between the first transparent conductive film and the third transparent conductive film, and positioned between the semiconductor film and the second gate of the first transistor.

24 Claims, 36 Drawing Sheets

(72) Inventors: Kouhei Toyotaka, Atsugi (JP);
Masahiko Hayakawa, Tochigi (JP);
Daisuke Matsubayashi, Atsugi (JP);
Shinpei Matsuda, Atsugi (JP)

(51) Int. Cl.
*G02F 1/1362* (2006.01)
*G02F 1/1368* (2006.01)

(58) Field of Classification Search
USPC .................................................. 349/47
See application file for complete search history.

(56) References Cited

U.S. PATENT DOCUMENTS

| | | | |
|---|---|---|---|
| 5,528,032 A | 6/1996 | Uchiyama |
| 5,563,426 A | 10/1996 | Zhang et al. |
| 5,572,046 A | 11/1996 | Takemura |
| 5,604,360 A | 2/1997 | Zhang et al. |
| 5,731,856 A | 3/1998 | Kim et al. |
| 5,744,864 A | 4/1998 | Cillessen et al. |
| 5,847,410 A | 12/1998 | Nakajima |
| 5,888,857 A | 3/1999 | Zhang et al. |
| 6,140,165 A | 10/2000 | Zhang et al. |
| 6,140,198 A | 10/2000 | Liou |
| 6,294,274 B1 | 9/2001 | Kawazoe et al. |
| 6,323,071 B1 | 11/2001 | Zhang et al. |
| 6,338,991 B1 | 1/2002 | Zhang et al. |
| 6,413,805 B1 | 7/2002 | Zhang et al. |
| 6,479,331 B1 | 11/2002 | Takemura |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,756,816 B2 | 6/2004 | Miyake |
| 6,788,108 B2 | 9/2004 | Miyake et al. |
| 6,806,125 B2 | 10/2004 | Zhang et al. |
| 6,813,332 B2 | 11/2004 | Nagao et al. |
| 6,872,605 B2 | 3/2005 | Takemura |
| 6,875,628 B1 | 4/2005 | Zhang et al. |
| 6,928,136 B2 | 8/2005 | Nagao et al. |
| 6,958,750 B2 | 10/2005 | Azami et al. |
| 6,960,812 B2 | 11/2005 | Yamazaki et al. |
| 6,975,142 B2 | 12/2005 | Azami et al. |
| 6,987,283 B2 | 1/2006 | Zhang et al. |
| 7,049,190 B2 | 5/2006 | Takeda et al. |
| 7,057,598 B2 | 6/2006 | Azami et al. |
| 7,061,014 B2 | 6/2006 | Hosono et al. |
| 7,064,346 B2 | 6/2006 | Kawasaki et al. |
| 7,068,076 B2 | 6/2006 | Azami |
| 7,105,868 B2 | 9/2006 | Nause et al. |
| 7,202,863 B2 | 4/2007 | Kimura et al. |
| 7,205,610 B2 | 4/2007 | Koyama |
| 7,211,825 B2 | 5/2007 | Shih et al |
| 7,218,349 B2 | 5/2007 | Kimura |
| 7,238,558 B2 | 7/2007 | Takemura |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,391,051 B2 | 6/2008 | Zhang et al. |
| 7,402,506 B2 | 7/2008 | Levy et al. |
| 7,411,209 B2 | 8/2008 | Endo et al. |
| 7,432,737 B2 | 10/2008 | Yoshida |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,622,335 B2 | 11/2009 | Zhang et al. |
| 7,674,650 B2 | 3/2010 | Akimoto et al. |
| 7,687,808 B2 | 3/2010 | Umezaki |
| 7,732,819 B2 | 6/2010 | Akimoto et al. |
| 7,804,091 B2 | 9/2010 | Takechi et al. |
| 7,855,379 B2 | 12/2010 | Hayashi et al. |
| 7,932,888 B2 | 4/2011 | Miyake |
| 7,943,930 B2 | 5/2011 | Zhang et al. |
| 7,978,274 B2 | 7/2011 | Umezaki et al. |
| 7,998,372 B2 | 8/2011 | Yano et al. |
| 8,054,279 B2 | 11/2011 | Umezaki et al. |
| 8,062,935 B2 | 11/2011 | Zhang et al. |
| 8,088,652 B2 | 1/2012 | Hayashi et al. |
| 8,102,476 B2 | 1/2012 | Son et al. |
| 8,158,974 B2 | 4/2012 | Yano et al. |
| 8,164,256 B2 | 4/2012 | Sano et al. |
| 8,232,124 B2 | 7/2012 | Takechi et al. |
| 8,278,660 B2 | 10/2012 | Zhang et al. |
| 8,314,765 B2 | 11/2012 | Umezaki |
| 8,330,702 B2 | 12/2012 | Miyake et al. |
| 8,363,000 B2 | 1/2013 | Umezaki |
| 8,369,478 B2 | 2/2013 | Miyake |
| 8,415,198 B2 | 4/2013 | Itagaki et al. |
| 8,415,665 B2 | 4/2013 | Kimura et al. |
| 8,427,417 B2 | 4/2013 | Koyama |
| 8,436,349 B2 | 5/2013 | Sano et al. |
| 8,476,625 B2 | 7/2013 | Kimura |
| 8,541,944 B2 | 9/2013 | Sano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218221 A1 | 11/2003 | Wager, III et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170067 A1 | 8/2006 | Maekawa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0115219 A1 | 5/2007 | Inoue |
| 2007/0141784 A1 | 6/2007 | Wager, III et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |

(56) References Cited

U.S. PATENT DOCUMENTS

| | | |
|---|---|---|
| 2008/0166834 A1 | 7/2008 | Kim et al. |
| 2008/0176364 A1 | 7/2008 | Yang et al. |
| 2008/0182358 A1 | 7/2008 | Cowdery-Corvan et al. |
| 2008/0191332 A1 | 8/2008 | Koyama et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0303020 A1 | 12/2008 | Shin et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0045397 A1 | 2/2009 | Iwasaki |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0101895 A1 | 4/2009 | Kawamura et al. |
| 2009/0114910 A1 | 5/2009 | Chang |
| 2009/0114911 A1 | 5/2009 | Maekawa et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0237000 A1 | 9/2009 | Inoue |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0026619 A1 | 2/2010 | Umezaki |
| 2010/0051937 A1 | 3/2010 | Kaji et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0134396 A1 | 6/2010 | Umezaki |
| 2010/0163874 A1 | 7/2010 | Koyama et al. |
| 2010/0245304 A1 | 9/2010 | Umezaki |
| 2011/0018915 A1 | 1/2011 | Umezaki et al. |
| 2011/0031497 A1* | 2/2011 | Yamazaki .......... H01L 27/1225 257/59 |
| 2011/0032435 A1 | 2/2011 | Kimura |
| 2011/0199807 A1 | 8/2011 | Saito et al. |
| 2011/0204928 A1 | 8/2011 | Umezaki et al. |
| 2011/0215787 A1 | 9/2011 | Shionoiri et al. |
| 2011/0279438 A1 | 11/2011 | Ito |
| 2011/0285675 A1 | 11/2011 | Amano et al. |
| 2012/0026774 A1 | 2/2012 | Shionoiri |
| 2012/0062811 A1* | 3/2012 | Miyake ............ G02F 1/136213 349/39 |
| 2012/0168748 A1 | 7/2012 | Yano et al. |
| 2012/0286263 A1 | 11/2012 | Miyake |
| 2012/0286855 A1 | 11/2012 | Umezaki |
| 2012/0294080 A1 | 11/2012 | Endo |
| 2012/0319107 A1 | 12/2012 | Miyake |
| 2013/0026929 A1* | 1/2013 | Kasai ..................... G09G 3/003 315/160 |
| 2013/0049806 A1* | 2/2013 | Koyama .......... H03K 19/01714 326/68 |
| 2013/0082760 A1* | 4/2013 | Umezaki ............ H01L 27/1255 327/404 |
| 2013/0140617 A1 | 6/2013 | Umezaki |
| 2013/0162305 A1 | 6/2013 | Watanabe |
| 2013/0223584 A1* | 8/2013 | Umezaki ................ G11C 19/28 377/64 |
| 2013/0278324 A1 | 10/2013 | Kaneyasu et al. |
| 2014/0002426 A1 | 1/2014 | Tanada et al. |
| 2014/0042443 A1 | 2/2014 | Yamazaki |
| 2014/0061636 A1 | 3/2014 | Miyake et al. |
| 2014/0061654 A1 | 3/2014 | Yamazaki et al. |
| 2014/0361290 A1 | 12/2014 | Yamazaki et al. |

FOREIGN PATENT DOCUMENTS

| | | |
|---|---|---|
| EP | 2226847 A | 9/2010 |
| EP | 2579237 A | 4/2013 |
| GB | 2425401 | 10/2006 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-198806 A | 8/1993 |
| JP | 05-251705 A | 9/1993 |
| JP | 07-104312 A | 4/1995 |
| JP | 07-226373 A | 8/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-325798 A | 11/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2007-096055 A | 4/2007 |
| JP | 2007-115808 A | 5/2007 |
| JP | 2007-194594 A | 8/2007 |
| JP | 2007-220817 A | 8/2007 |
| JP | 2008-060419 A | 3/2008 |
| JP | 2010-277652 A | 12/2010 |
| JP | 2011-054946 A | 3/2011 |
| JP | 2012-083738 A | 4/2012 |
| WO | WO-2004/114391 | 12/2004 |

OTHER PUBLICATIONS

Nakamura M. et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, July 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", Journal of the SID, 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B, Mg, Mn, Fe, Ni, Cu,or Zn]at Temperatures over 1000° C", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnOm (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World'S Largest (15-Inch) XGA AMLCD Panel Using IgZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

(56) References Cited

OTHER PUBLICATIONS

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc AMOLED", AM-FPD '08 Oxide TFTs and Their Application for Large Size Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2014/064799) Dated Aug. 12, 2014.

Written Opinion (Application No. PCT/JP2014/064799) Dated Aug. 12, 2014.

* cited by examiner

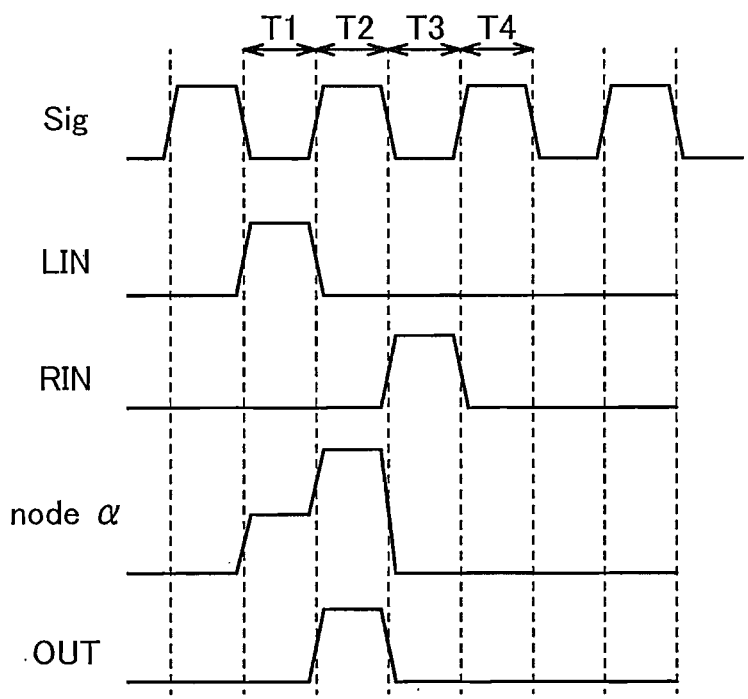

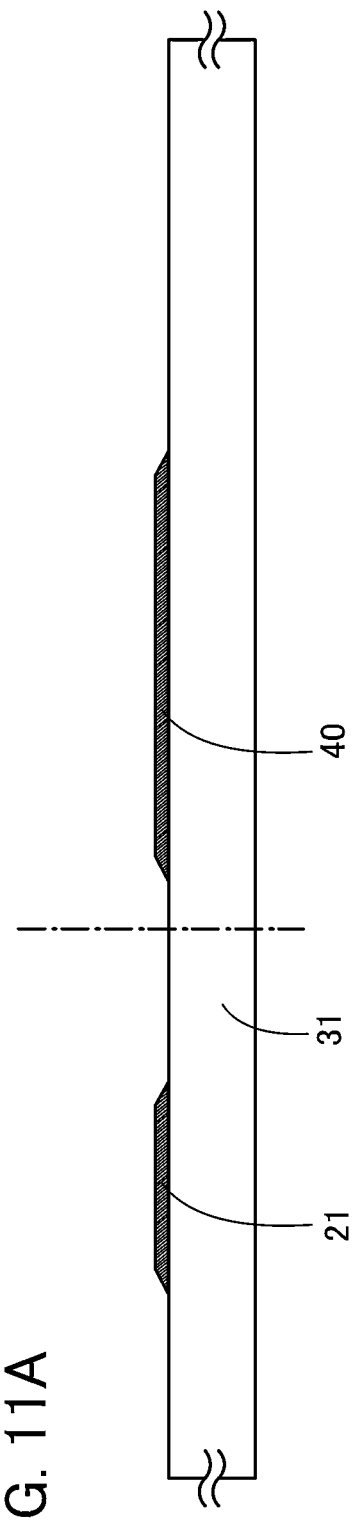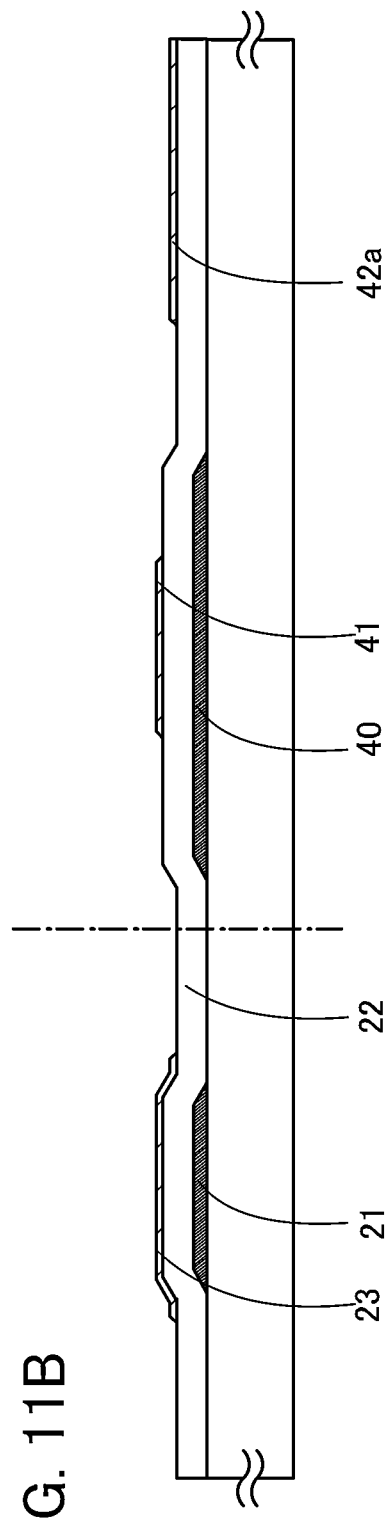

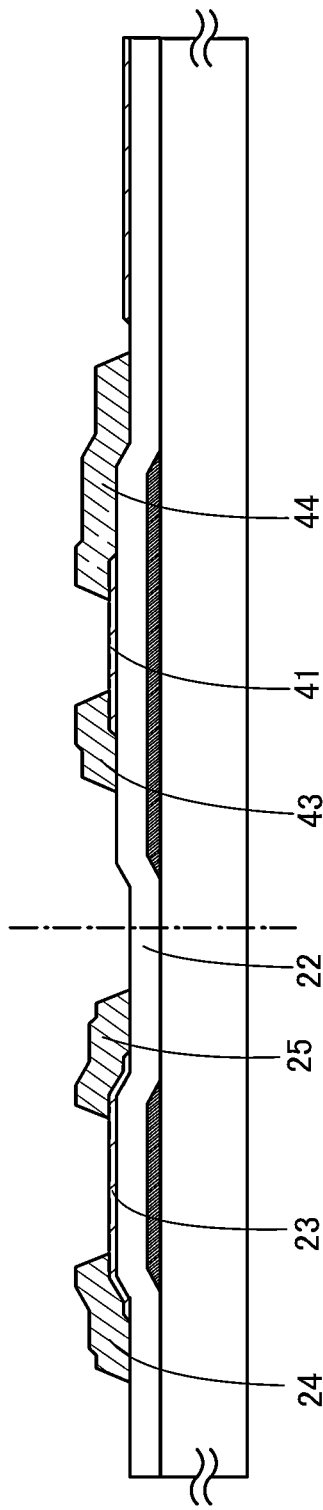
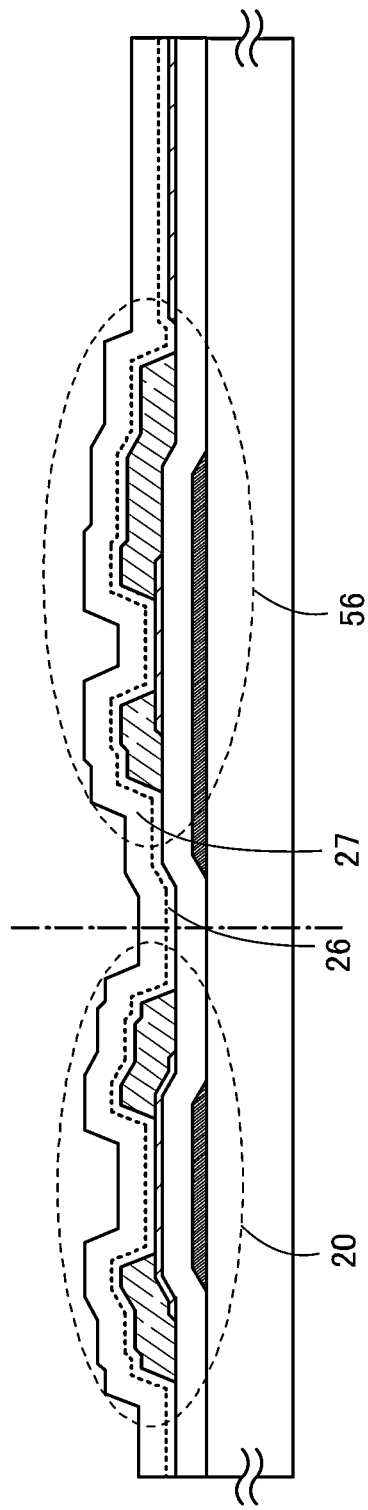
FIG. 12A
FIG. 12B

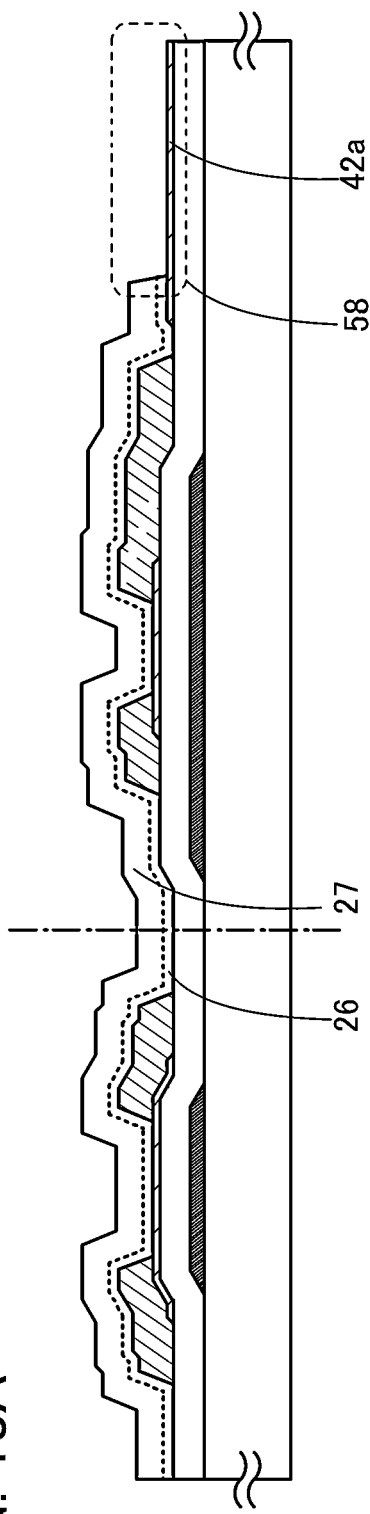
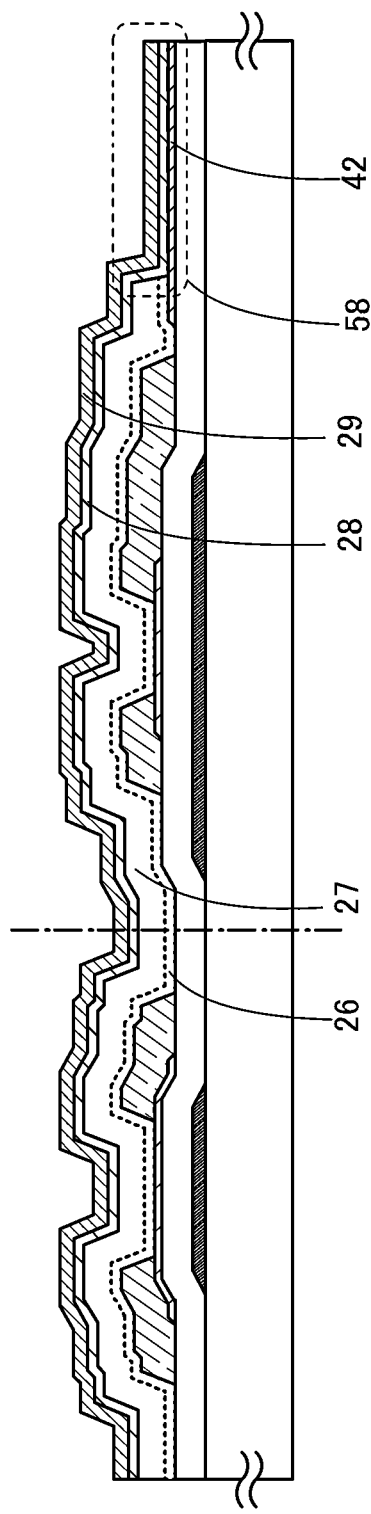
FIG. 13A
FIG. 13B

FIG. 22A
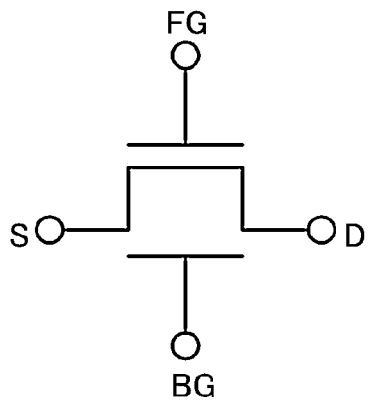
FIG. 22B1
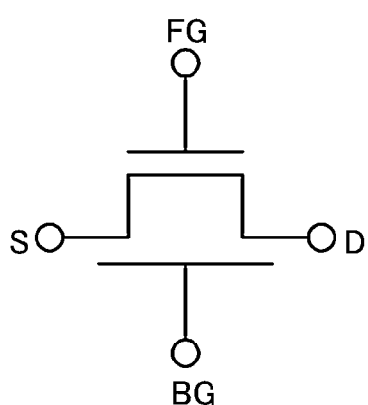
FIG. 22B2
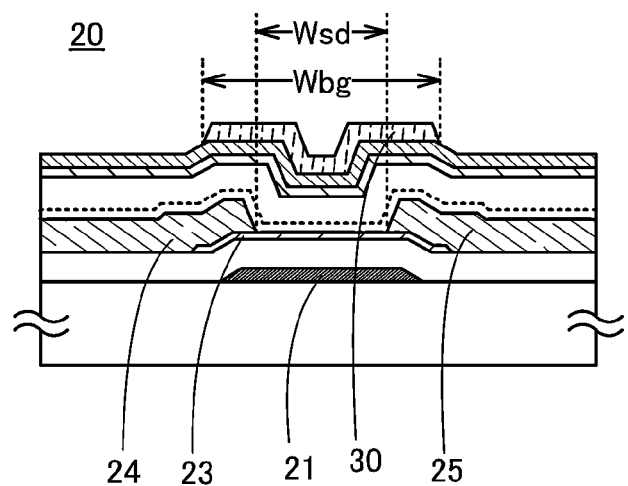
FIG. 22C1
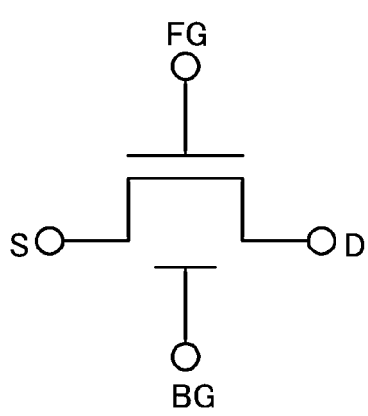
FIG. 22C2
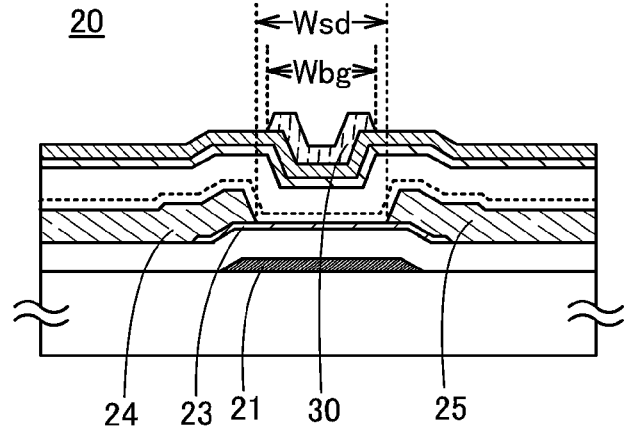

22  23a 23b 23c
         23

24  22  23a 23b 23c  25
             23

Off-State

On-State

SEQUENTIAL CIRCUIT AND SEMICONDUCTOR DEVICE

TECHNICAL FIELD

The present invention relates to a semiconductor device. In particular, the present invention relates to a sequential circuit using unipolar transistors, and a semiconductor device such as a semiconductor display device using the sequential circuit.

BACKGROUND ART

Semiconductor display devices, such as liquid crystal display devices and EL display devices, used in portable electronic devices have been required to reduce an area other than a pixel portion (i.e., to narrow a frame width). A system-on-panel obtained by forming a pixel portion and some of or all driver circuits over one substrate is effective in meeting the above need. In the case of the system-on-panel, like the pixel portion, the driver circuit preferably includes unipolar transistors because the panel can be manufactured at low cost. Patent Documents 1 and 2 disclose techniques for formation of various circuits such as inverters and shift registers that are used in driver circuits of semiconductor display devices and include unipolar transistors.

REFERENCE

Patent Document

[Patent Document 1] Japanese Published Patent Application No. 2001-325798
[Patent Document 2] Japanese Published Patent Application No. 2010-277652

DISCLOSURE OF INVENTION

In the case of a transmissive liquid crystal display device that is a semiconductor device, if the percentage of a region transmitting light in a pixel, i.e., the aperture ratio is increased, light emitted from a backlight can be efficiently utilized; accordingly, power consumption can be reduced. However, if priority is put on the increase in the aperture ratio when determining the pixel layout, the size of semiconductor elements such as a transistor and a capacitor included in the pixel needs to be reduced. A capacitor with small capacitance has disadvantages such as difficulty in controlling the alignment of liquid crystal molecules without decreasing driving frequency and a short period for holding a potential of an image signal, resulting in degradation in image quality.

Semiconductor display devices have been required to have a narrower frame width. In addition, the semiconductor display devices have been required to ensure reliability because in a driver circuit of a semiconductor display device including unipolar transistors, in some cases, deterioration of the electrical characteristics of the transistor, e.g., a shift in threshold voltage, is found in a sequential circuit that outputs a signal having a pulse.

In view of the above technical background, an object of one embodiment of the present invention is to provide a semiconductor device that can reduce power consumption without reducing image quality. Another object of one embodiment of the present invention is to provide a semiconductor device that has high reliability and can achieve a reduced frame width.

In a semiconductor device of one embodiment of the present invention, a capacitor is included in a pixel. The capacitor includes at least a metal oxide film that has conductivity and transmits visible light, a pixel electrode that transmits visible light, and a nitride insulating film between the metal oxide film and the pixel electrode. The capacitor having the above structure transmits visible light. Accordingly, the required amount of capacitance for high image quality can be secured and the aperture ratio of the pixel can be increased; thus, light loss can be reduced in a panel and power consumption of the semiconductor device can be reduced.

Note that in the case of using a metal oxide film and a pixel electrode as a pair of electrodes of a capacitor as described above, to increase the capacitance of the capacitor, a resin film of acrylic or other materials is preferably not provided between the metal oxide film and the pixel electrode. However, in the case where the resin film is not provided, a distance between a region in the vicinity of a surface, which is far from a gate electrode, of a semiconductor film (a back channel region) and a surface of an element substrate in which a transistor is formed is smaller than that in the case where the resin film is provided. For this reason, when a positive fixed charge is generated in the vicinity of the surface of the element substrate because of moisture and the like in the air attached on the surface, a negative charge is easily generated in the back channel region due to the fixed charge. Therefore, the longer a period during which a potential of the gate electrode is lower than that of a source electrode or a drain electrode is, the easier the threshold voltage of a transistor is shifted in a negative direction, which has been empirically found. It is found that particularly in the case where the resin film is not provided, a shift in the threshold voltage in the negative direction is likely to be larger than that in the case where the resin film is provided.

In view of the above, in one embodiment of the present invention, some transistors included in a sequential circuit, a buffer, and the like in a driver circuit, which have threshold voltage easily shifted in a negative direction, each include a gate electrode on the back channel region side of a semiconductor film in addition to a normal gate electrode. The gate electrode on the back channel region side is electrically connected to the normal gate electrode.

The gate electrode provided on the back channel region side can prevent generation of a negative charge in the back channel region and suppress a shift in the threshold voltage of the transistor in a negative direction. Furthermore, the gate electrode on the back channel region side is electrically connected to the normal gate electrode and the same potential is applied to the pair of electrodes instead of applying a constant potential to the gate electrode on the back channel region side, whereby a channel formation region can be increased to increase the drain current. Thus, a decrease in on-state current can be suppressed and the transistor can be reduced in size, resulting in a reduction in the area of the driver circuit.

One embodiment of the present invention makes it possible to provide a semiconductor device that can reduce power consumption without reducing image quality. Another embodiment of the present invention makes it possible to provide a semiconductor device that has high reliability and can achieve a reduced frame width.

BRIEF DESCRIPTION OF DRAWINGS

FIG. 3 illustrates a timing diagram.

FIGS. 11A and 11B illustrate a method for manufacturing an element substrate.

FIGS. 12A and 12B illustrate the method for manufacturing the element substrate.

FIGS. 13A and 13B illustrate the method for manufacturing the element substrate.

FIGS. 22A, 22B1, 22B2, 22C1, and 22C2 illustrate circuit symbols and structures of transistors.

BEST MODE FOR CARRYING OUT THE INVENTION

Figure 1A:
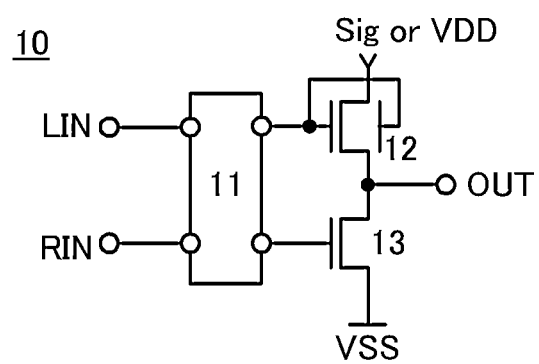
FIGS. 1A and 1B each illustrate a configuration of a sequential circuit.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

The present invention encompasses in its category, any semiconductor device using a transistor, such as an integrated circuit, an RF tag, and a semiconductor device. The integrated circuits include, in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). Further, the semiconductor display device includes, in its category, semiconductor display devices in which circuit elements including semiconductor films are included in driver circuits, such as liquid crystal display devices, light-emitting devices in which a light-emitting element typified by an organic light-emitting element is provided in each pixel, electronic paper, digital micromirror devices (DMDs), plasma display panels (PDPs), and field emission displays (FEDs).

In this specification, the semiconductor display device includes in its category, panels in which a display element such as a liquid crystal element or a light-emitting element is provided for each pixel, and modules in which an IC or the like including a controller is mounted on the panel. Furthermore, an element substrate corresponding to one mode before a display element is completed in a manufacturing process of a semiconductor display device falls into the category of the semiconductor display device of one embodiment of the present invention. In the element substrate, each of a plurality of pixels are provided with a transistor, electrodes used for a display element, such as a pixel electrode and a common electrode, and a capacitor.

In addition, the semiconductor display device of one embodiment of the present invention may include a touch panel which is a position input device capable of detecting a position pointed at with a finger, a stylus, or the like and generating a signal including the positional information.

Note that "connection" in this specification means electrical connection and corresponds to the state in which current, voltage, or potential can be supplied or transmitted. Accordingly, a connection state means not only a state of direct connection but also a state of indirect connection through a circuit element such as a wiring, a resistor, a diode, or a transistor so that current, voltage, or a potential can be supplied or transmitted. In addition, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

Note that a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

The terms "source" and "drain" of a transistor interchange with each other depending on the conductivity type of the transistor or levels of potentials applied to terminals. In general, in an n-channel transistor, a terminal to which a low potential is applied is called a source, and a terminal to which a high potential is applied is called a drain. Further, in a p-channel transistor, a terminal to which a low potential is applied is called a drain, and a terminal to which a high potential is applied is called a source. In this specification, although connection relation of the transistor is described assuming that the source and the drain are fixed in some cases for convenience, actually, the names of the source and the drain interchange with each other depending on the relation of the potentials.

<Configuration Example 1 of Sequential Circuit>

FIG. 1A illustrates a configuration example of a sequential circuit of one embodiment of the present invention. A sequential circuit 10 in FIG. 1A includes a circuit 11, a transistor 12, and a transistor 13. The circuit 11 has a function of controlling potentials of gates of the transistors 12 and 13 in accordance with potentials of a signal LIN and a signal RIN.

The transistor 12 has a function of controlling the electrical connection between an output terminal OUT and a wiring to which the signal Sig or a high-level potential VDD is applied. The transistor 13 has a function of controlling the electrical connection between the output terminal OUT and a wiring to which a low-level potential VSS is applied. Specifically, one of a source and a drain of the transistor 12 is connected to the wiring to which the signal Sig or the high-level potential VDD is applied, and one of a source and a drain of the transistor 13 is connected to the wiring to which the low-level potential VSS is applied. As the signal Sig, a signal with a duty ratio of approximately 0.5, such as a clock signal, can be used. The duty ratio is the ratio of a pulse width to a pulse period. The other of the source and the drain of the transistor 12 and the other of the source and the drain of the transistor 13 are each connected to the output terminal OUT.

The circuit 11 controls the potentials of the gates of the transistor 12 and the transistor 13 to turn on/off the transistor 12 and turn on/off the transistor 13. When the transistor 12 is on and the transistor 13 is off, the wiring to which the signal Sig or the potential VDD is applied is connected to the output terminal OUT. When the transistor 12 is off and the transistor 13 is on, the wiring to which the potential VSS is applied is connected to the output terminal OUT.

In the case where an output signal having a potential of the output terminal OUT of the sequential circuit 10 is supplied to a wiring called a bus line that is connected to a plurality of pixels, such as a scan line, the duty ratio of the output signal is extremely smaller than that of the clock signal and other signals. In this case, the transistor 12 is continuously off while a pulse does not appear; therefore, a period during which the transistor 12 is off is extremely longer than a period during which the transistor 13 is off. In addition, the signal Sig or the potential VDD is applied to the one of the source and the drain of the transistor 12, so that a period during which the potential of the gate is lower than that of the source or the drain is long in the transistor 12 as compared to the transistor 13, which indicates that the threshold voltage of the transistor 12 is easily shifted in a negative direction.

In view of the above, in one embodiment of the present invention, the transistor 12 includes a pair of gate electrodes that are electrically connected to each other and overlap with each other with a semiconductor film provided therebetween. With the transistor 12 including the pair of gate electrodes electrically connected to each other, even when a positive fixed charge is generated in the vicinity of the surface of the element substrate, a negative charge can be prevented from being generated in the vicinity of the surface of the semiconductor film due to the fixed charge, resulting in suppression of a shift in the threshold voltage of the transistor 12 in a negative direction. Thus, the reliability of the sequential circuit 10 can be increased, leading to an increase in the reliability of a semiconductor device using the sequential circuit 10.

In the case where the pair of gate electrodes is electrically connected to each other, the same potential is applied to the pair of gate electrodes, which is different from the case where a constant potential is applied to one of the pair of gate electrodes. Thus, a channel formation region is increased, which makes is possible to increase drain current of the transistor 12. Consequently, a decrease in on-state current can be suppressed and the transistor 12 can be reduced in size; thus, the area of the sequential circuit 10 can be reduced, resulting in a reduction in the area of a driver circuit using the sequential circuit 10. In particular, the transistor 12 provided on the output terminal side of the sequential circuit 10 needs to have a higher capacity for supplying voltage than a transistor used in the circuit 11 does; therefore, it can be said that the case where the transistor 12 includes the pair of gate electrodes enables the area of the sequential circuit or the driver circuit to be small as compared to the case where any of the other transistors in the sequential circuit 10 includes the pair of electrodes.

Furthermore, with the pair of gate electrodes electrically connected to each other, a depletion layer is easily formed in the semiconductor film, which makes it possible to improve the subthreshold value (S value) of the transistor 12.

Figure 1B:
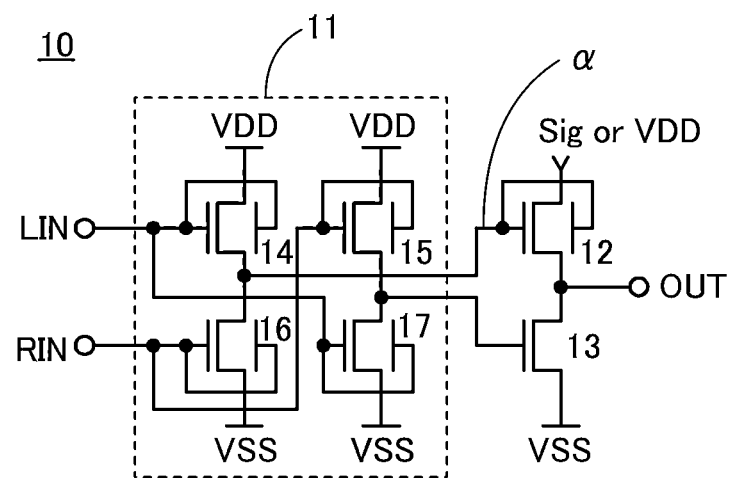

Next, FIG. 1B illustrates a specific configuration example of the sequential circuit 10 illustrated in FIG. 1A. Like the sequential circuit 10 in FIG. 1A, the sequential circuit 10 in FIG. 1B includes the circuit 11, the transistor 12, and the transistor 13. In FIG. 1B, the circuit 11 includes transistors 14, 15, 16, and 17.

The on/off state of the transistor 14 is determined by the potential of the signal LIN. When the transistor 14 is on, the wiring to which the potential VDD is applied is electrically connected to the gate of the transistor 12. The on/off state of the transistor 15 is determined by the potential of the signal RIN. When the transistor 15 is on, the wiring to which the potential VDD is applied is electrically connected to the gate of the transistor 13. The on/off state of the transistor 16 is determined by the potential of the signal RIN. When the transistor 16 is on, the wiring to which the potential VSS is applied is electrically connected to the gate of the transistor 12. The on/off state of the transistor 17 is determined by the potential of the signal LIN. When the transistor 17 is on, the wiring to which the potential VSS is applied is electrically connected to the gate of the transistor 13.

An operation example of the sequential circuit 10 in FIG. 1B is described. Here, description is given of the case where the one of the source and the drain of the transistor 12 is connected to the wiring to which the signal Sig is applied. Further, FIG. 3 illustrates an example of a timing diagram of the sequential circuit 10 in FIG. 1B. Note that in the timing diagram in FIG. 3, the transistors 12 to 17 are all n-channel transistors. In FIG. 3, a node α denotes the gate of the transistor 12.

As illustrated in FIG. 3, in a period T1, the potential of the signal Sig is at a low level, the potential of the signal LIN is at a high level, and the potential of the signal RIN is at a low level. As a result, in the period T1, the transistors 14 and 17 are turned on, and the transistors 15 and 16 are turned off. Consequently, a potential lower than the potential VDD by the threshold voltage of the transistor 14 is applied to the node α. In addition, the potential VSS is applied to the gate of the transistor 13, so that the transistor 13 is turned off.

Next, as illustrated in FIG. 3, in a period T2, the potential of the signal Sig is at a high level, the potential of the signal LIN is at a low level, and the potential of the signal RIN is at a low level. Thus, in the period T2, the transistors 14 to 17 are turned off, so that the node α is in a floating state. In an ideal case where parasitic capacitance of the node α is extremely smaller than capacitance between the source and the gate of the transistor 12, the potential of the node α is increased by the amount of change in the potential of the signal Sig generated between the periods T1 and T2, i.e., a difference between a low-level potential and a high-level potential of the signal Sig. When the potential of the node α is increased, the gate voltage of the transistor 12 becomes sufficiently higher than the threshold voltage of the transistor 12, whereby the high-level potential of the signal Sig is applied to the output terminal OUT.

Note that the increase in the potential of the node α depends on the capacitance ratio between the parasitic capacitance of the node α and the capacitance C between a source and a gate of the transistor 14. Specifically, as the parasitic capacitance of the node α is lower with respect to the capacitance C, the increase in the potential at the node α is larger. Conversely, as the parasitic capacitance of the node α is higher with respect to the capacitance C, the increase in the potential at the node α is smaller. Therefore, it is preferable that the capacitance C between the source and the gate of the transistor 14 is set higher than the parasitic capacitance of the node α so that the potential of the node α is increased to make the gate voltage sufficiently higher than the threshold voltage of the transistor 12.

Next, as illustrated in FIG. 3, in a period T3, the potential of the signal Sig is at a low level, the potential of the signal LIN is at a low level, and the potential of the signal RIN is at a high level. As a result, in the period T3, the transistors 14 and 17 are turned off, and the transistors 15 and 16 are turned on. Thus, the potential VSS is applied to the node α, so that the transistor 12 is turned off. In addition, the potential VDD is applied to the gate of the transistor 13, so that the transistor 13 is turned on. Accordingly, the potential VSS is applied to the output terminal OUT.

Then, as illustrated in FIG. 3, in a period T4, the potential of the signal Sig is at a high level, the potential of the signal LIN is at a low level, and the potential of the signal RIN is at a low level. Thus, in the period T4, the transistors 14 to 17 are turned off. As a result, the transistor 12 remains off and the transistor 13 remains on; accordingly, the potential VSS is applied to the output terminal OUT.

The operation in the periods T1 to T4 allows pulse signals to be output from the output terminal OUT of the sequential circuit 10. Note that in the case where an output signal having a potential of the output terminal OUT of the sequential circuit 10 is supplied to a wiring called a bus line that is connected to a plurality of pixels, such as a scan line, as in the transistor 12, in each of the transistors 14 to 17, a period during which the potential of a gate is lower than that of a source or a drain is long as compared to the transistor 13, which indicates that the threshold voltage is easily shifted in a negative direction in the transistors 14 to 17.

In view of the above, in one embodiment of the present invention, at least one of the transistors 14 to 17 may include a pair of gate electrodes that are electrically connected to each other and overlap with each other with a semiconductor film provided therebetween. FIG. 1B illustrates the transistors 14 to 17 each include a pair of gate electrodes electrically connected to each other. With the transistors 14 to 17 each including the pair of gate electrodes electrically connected to each other, a shift in the threshold voltage in a negative direction can be suppressed in the transistors 14 to 17. Thus, the reliability of the sequential circuit 10 can be increased, leading to an increase in the reliability of a semiconductor device using the sequential circuit 10.

In addition, a decrease in the on-state current can be suppressed and the transistors 14 to 17 can be reduced in size; thus, the area of the sequential circuit 10 can be reduced, resulting in a reduction in the area of a driver circuit using the sequential circuit 10.

Furthermore, with the pair of gate electrodes electrically connected to each other, a depletion layer is easily formed in the semiconductor film, which makes it possible to improve the subthreshold values (S values) of the transistors 14 to 17.

<Structure Example of Transistor>

Figure 2A:
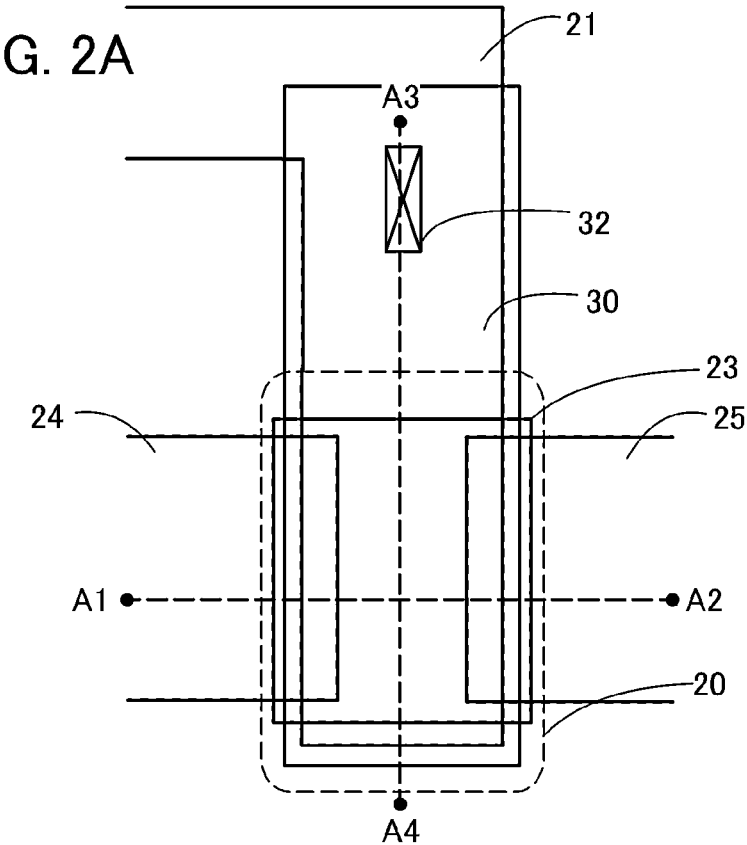
FIGS. 2A to 2C illustrate a structure of a transistor.
Figure 2B:
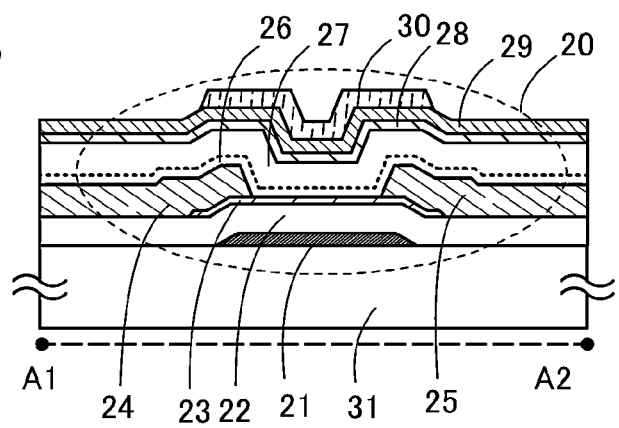
Figure 2C:
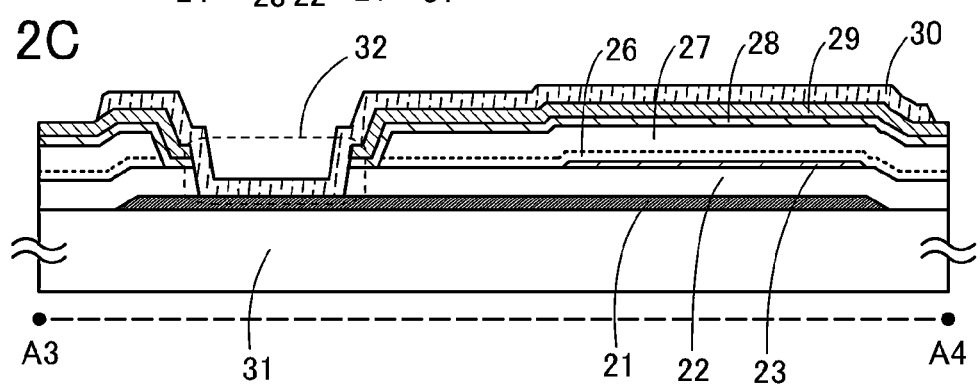

Next, FIGS. 2A to 2C illustrate a specific structure example of a transistor 20 that includes a pair of gate electrodes electrically connected to each other and can be used as the transistor 12 and the transistors 14 to 17 illustrated in FIGS. 1A and 1B. FIG. 2A is a top view of the transistor 20. Note that insulating films such as a gate insulating film are not illustrated in FIG. 2A in order to clarify the layout of the transistor 20. FIG. 2B is a cross-sectional view along the dashed line A1-A2 in the top view in FIG. 2A. FIG. 2C is a cross-sectional view along the dashed line A3-A4 in the top view in FIG. 2A.

As illustrated in FIGS. 2A to 2C, over a substrate 31 having an insulating surface, the transistor 20 includes a conductive film 21 serving as a gate electrode, an insulating film 22 that is over the conductive film 21 and serves as a gate insulating film, an oxide semiconductor film 23 that is over the insulating film 22 and overlaps with the conductive film 21, and a conductive film 24 and a conductive film 25 that are electrically connected to the oxide semiconductor film 23 and serve as a source electrode and a drain electrode.

In FIGS. 2A to 2C, an insulating film 26 and an insulating film 27 are stacked in this order over the oxide semiconductor film 23 and the conductive films 24 and 25. The transistor 20 may include the insulating films 26 and 27. Although the insulating films 26 and 27 are stacked in this order in FIGS. 2A to 2C, an insulating film or a stack of three or more insulating films may be used instead of the insulating films 26 and 27.

Furthermore, a nitride insulating film 28 and an insulating film 29 are stacked in this order over the insulating films 26 and 27. The insulating film 29 is not necessarily provided. Note that the insulating film 29 and the nitride insulating film 28 serve as a dielectric film of a capacitor in the pixel that is described later. The nitride insulating film 28 tends to have a higher dielectric constant and larger internal stress than those of an oxide insulating film such as a silicon oxide film. For this reason, in the case where the nitride insulating film 28 is used alone as the dielectric film of the capacitor without the insulating film 29 and the thickness of the nitride insulating film 28 is small, the capacitance value of the capacitor becomes too large, which makes it difficult to increase the speed of writing an image signal to a pixel with low power consumption. In reverse, when the thickness of the nitride insulating film 28 is large, internal stress is too large and degradation of the characteristics of a semiconductor element formed using a semiconductor film, such as a change in threshold voltage of a transistor, might occur. When the internal stress of the nitride insulating film 28 is too large, the nitride insulating film 28 is easily peeled off from the substrate 31, which prevents an improvement in yield. However, when the insulating film 29 is formed using an insulator such as silicon oxide with a dielectric constant lower than that of the nitride insulating film 28, and used together with the nitride insulating film 28 as the dielectric film of the capacitor in the pixel, the dielectric constant of the dielectric film can be adjusted to a desirable value without increasing the thickness of the nitride insulating film 28.

The insulating film 22, the insulating film 26, the insulating film 27, the nitride insulating film 28, and the insulating film 29 include an opening 32. The opening 32 is provided in a region overlapping with the conductive film 21, and the oxide semiconductor film 23, the conductive film 24, and the conductive film 25 are not provided in the region.

Furthermore, the transistor 20 includes a conductive film 30 serving as a gate electrode over the insulating film 29. Alternatively, the transistor 20 includes the conductive film 30 over the nitride insulating film 28 when the insulating film 29 is not provided. The conductive film 30 is provided to overlap with the conductive film 21 and the oxide semiconductor film 23. Thus, the transistor 20 includes a pair of gate electrodes electrically connected to each other and overlapping with each other with the oxide semiconductor film 23 that is a semiconductor film provided therebetween. The conductive film 30 is electrically connected to the conductive film 21 in the opening 32. The conductive film 30 transmits visible light.

Note that FIG. 2C illustrates the case where an opening is formed in the insulating films 26 and 27, the nitride insulating film 28 and the insulating film 29 are formed, and then the opening 32 is formed in the insulating film 22, the nitride insulating film 28, and the insulating film 29 to overlap with the opening. However, in one embodiment of the present invention, the opening 32 may be formed, for example, by etching the insulating film 22, the insulating film 26, the insulating film 27, the nitride insulating film 28, and the insulating film 29 with the use of one mask. Note that in the pixel, a pixel electrode is provided over the insulating film 29 (or over the nitride insulating film 28 when the insulating film 29 is not provided). In the case where the pixel electrode is electrically connected to a conductive film provided between the insulating film 22 and the insulating films 26 and 27 in an opening formed in the insulating film 26, the insulating film 27, the nitride insulating film 28, and the insulating film 29, the thicknesses of the insulating films removed by etching in the opening 32 are different from those in the opening for the pixel electrode. For this reason, when the opening 32 and the opening for the pixel electrode are formed with the use of one mask, problems might occur; for example, part of the conductive film between the insulating film 22 and the insulating films 26 and 27 is excessively etched in the opening for the pixel electrode or the insulating films are etched insufficiently so that the conductive film 21 is not exposed in the opening 32. However, in the case where an opening is formed in the insulating films 26 and 27 and then, the opening 32 is formed in the insulating film 22, the nitride insulating film 28, and the insulating film 29 to obtain the structure illustrated in the cross-sectional view in FIG. 2C, the thicknesses of the insulating films removed by etching in the opening are less likely to be different from those in the opening 32 even when the opening and the opening 32 are formed with the use of one mask. Consequently, the problems are less likely to occur, resulting in an improvement in yield.

Furthermore, in the transistor 20 illustrated in FIGS. 2A to 2C, the conductive film 21 and the conductive film 30 overlap with end portions of the oxide semiconductor film 23 that do not overlap with the conductive film 24 and the conductive film 25, i.e., end portions of the oxide semiconductor film 23 that are in a region different from a region where the conductive film 24 and the conductive film 25 are located. When the end portions of the oxide semiconductor film 23 are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potentials of the conductive film 21 and the conductive film 30 because the end portions of the oxide semiconductor film 23 that do not overlap with the conductive film 24 and the conductive film 25 overlap with the conductive film 21 and the conductive film 30 in the transistor 20 illustrated in FIGS. 2A to 2C. Consequently, current that flows between the conductive film 24 and the conductive film 25 through the end portions of the oxide semiconductor film 23 can be controlled by the potential applied to the conductive film 21 and the conductive film 30.

Specifically, when a potential at which the transistor 20 is turned off is applied to the conductive film 21 and the conductive film 30, off-state current that flows between the conductive film 24 and the conductive film 25 through the end portions can be low. For this reason, in the transistor 20, even when the distance between the conductive film 24 and the conductive film 25 in each of the end portions of the oxide semiconductor film 23 is reduced as a result of reducing the channel length to obtain high on-state current, the transistor 20 can have low off-state current. Consequently, with the short channel length, the transistor 20 can have high on-state current when in an on state and low off-state current when in an off state. To obtain high on-state current, the channel length is preferably 0.5 $\mu$m or greater and 4.5 $\mu$m or less, further preferably 1 $\mu$m or greater and 4 $\mu$m or less, still further preferably 1 $\mu$m or greater and 3.5 $\mu$m or less, still further preferably 1 $\mu$m or greater and 2.5 $\mu$m or less. The most preferable channel length is 2 $\mu$m.

Figure 25:
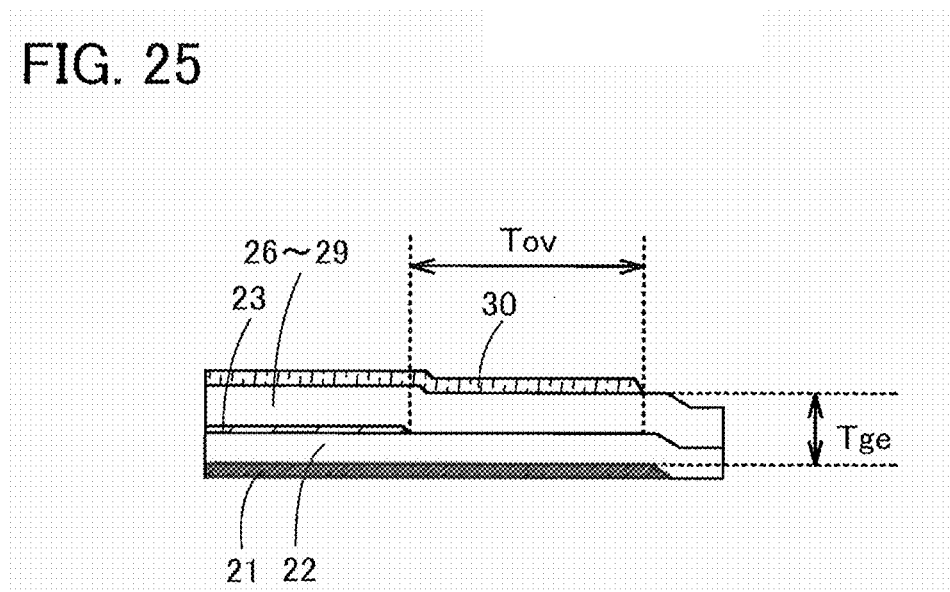
FIG. 25 is a cross-sectional view of an end portion of an oxide semiconductor film in a transistor.

FIG. 25 illustrates an example of a cross-sectional view of an end portion of the oxide semiconductor film 23 in the transistor 20. Note that FIG. 25 illustrates the case where the end portion of the oxide semiconductor film 23 overlaps with the conductive film 21 in a channel width direction which corresponds to the direction along the dashed line A3-A4 in FIG. 2A. In FIG. 25, the insulating film 26, the insulating film 27, the nitride insulating film 28, and the insulating film 29 are collectively illustrated as an insulating film.

In FIG. 25, Tov denotes the distance between the end portion of the oxide semiconductor film 23 and an end portion of the conductive film 30, and Tge denotes the distance between the conductive film 21 and the conductive film 30. In one embodiment of the present invention, Tov is preferably more than or equal to 1.0 times as large as Tge, in which case current that flows between the conductive film 24 and the conductive film 25 through the end portions of the oxide semiconductor film 23 can be controlled. In addition, Tov is preferably less than or equal to 7.5 times as large as Tge, in which case the current can be controlled in the above manner and the transistor 20 can be further reduced in size.

Specifically, when a potential at which the transistor 20 is turned on is applied to the conductive film 21 and the conductive film 30, current that flows between the conductive film 24 and the conductive film 25 through the end portions can be high. The current contributes to an increase in the field-effect mobility and an increase in on-state current of the transistor 20. When the end portions of the oxide semiconductor film 23 overlap with the conductive film 21 and the conductive film 30, carriers flow not only at the interfaces between the oxide semiconductor film 23 and the insulating films 22 and 26 but also in a wide region in the oxide semiconductor film 23, which results in an increase in the amount of carriers that move in the transistor 20. As a result, the on-state current of the transistor 20 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but the field-effect mobility in a saturation region of a transistor.

The transistor 20 in FIGS. 2A to 2C has a structure in which an insulating film (protective insulating film) that protects a surface of the oxide semiconductor film 23 from etching at the time of forming the conductive film 24 and the conductive film 25 is not provided (i.e., a channel-etched structure), which is different from a structure in which the protective insulating film is provided (i.e., a channel protective structure).

In the case of a channel-protective transistor, to protect the surface of the oxide semiconductor film 23, end portions of the conductive film 24 and the conductive film 25 need to be located over the protective insulating film. For this reason, in alignment of a mask used in the etching for forming the conductive films 24 and 25, the channel-protective transistor requires much higher accuracy than a channel-etched transistor does. Therefore, in the case of the channel-protective transistor, to locate the end portions of the conductive film 24 and the conductive film 25 more surely over the protective insulating film, the distance between the end portions of the conductive film 24 and the conductive film 25 in a channel length direction is preferably shortened, which enables a decrease in yield to be suppressed. However, when the distance between the end portions of the conductive film 24 and the conductive film 25 is shortened, a region where the conductive films 24 and 25 overlap with the oxide semiconductor film 23 is increased; thus, an electric field to be applied from the conductive film 30 serving as a gate to the oxide semiconductor film 23 is likely to be blocked by the conductive film 24 and the conductive film 25. Note that the channel length direction corresponds to a direction in which carriers move between the conductive film 24 and the conductive film 25 at the shortest distance.

On the other hand, in the case of the transistor 20 with the channel-etched structure, high accuracy is not needed for alignment of a mask used in the etching for forming the conductive film 24 and the conductive film 25 unlike in the case of the channel-protective transistor. For this reason, in the channel-etched transistor 20, a decrease in yield can be suppressed even when the distance between the end portions of the conductive film 24 and the conductive film 25 is longer than that in the case of the channel-protective transistor. Therefore, a region where the conductive films 24 and 25 overlap with the oxide semiconductor film 23 can be made small, so that an electric field to be applied from the conductive film 30 to the oxide semiconductor film 23 is less likely to be blocked by the conductive film 24 and the conductive film 25. Consequently, high on-state current of the channel-etched transistor 20 can be obtained easily compared with that of the channel-protective transistor, and even when the channel length is shortened, off-state current that flows through the end portions of the oxide semiconductor film 23 in the channel-etched transistor can be lower than in the channel-protective transistor.

In addition, the protective insulating film is exposed to plasma in the etching for forming the conductive film 24 and the conductive film 25, so that oxygen is easily eliminated and an oxygen vacancy is easily formed. Thus, it can be said that the protective insulating film has poor ability to supply an adequate amount of oxygen to the oxide semiconductor film 23 in contact with the protective insulating film to reduce oxygen vacancies in the oxide semiconductor film 23. In contrast, in the channel-etched transistor 20, part of the oxide semiconductor film 23 that does not overlap with the conductive film 24 and the conductive film 25 is exposed to plasma in the etching for forming the conductive film 24 and the conductive film 25. However, the insulating films 26 and 27 having ability to supply an adequate amount of oxygen to the oxide semiconductor film 23 are formed after the conductive film 24 and the conductive film 25 are formed, whereby oxygen vacancies in the oxide semiconductor film 23 can be reduced. As a result, the channel-etched transistor 20 can have reliability higher than that of the channel-protective transistor.

Particularly in the case where a c-axis aligned crystalline oxide semiconductor (CAAC-OS) film is used as the oxide semiconductor film 23 in the channel-etched transistor 20, part of the oxide semiconductor film 23 that does not overlap with the conductive film 24 or the conductive film 25 is less likely to be removed by the etching for forming the conductive film 24 and the conductive film 25 than in the case where the oxide semiconductor film 23 is an amorphous oxide semiconductor film or a microcrystalline oxide semiconductor film. Therefore, the transistor 20 in which the CAAC-OS film is used as the oxide semiconductor film 23 can have higher reliability. The CAAC-OS film, the amorphous oxide semiconductor film, and the microcrystalline oxide semiconductor film are described later in detail.

Figure 36A:
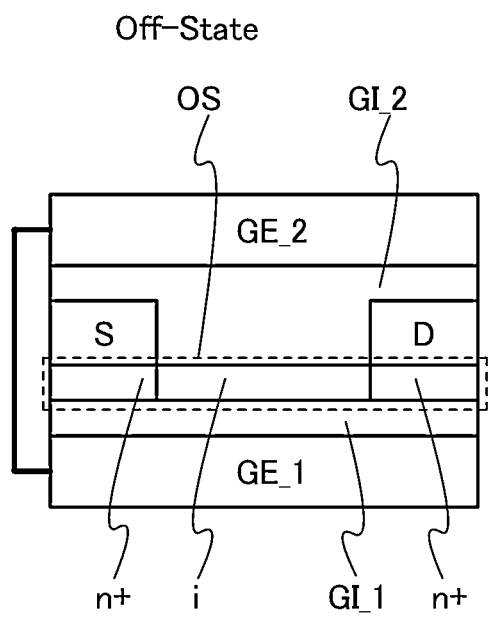
FIGS. 36A to 36C illustrate flow of carriers in a transistor in an off state and an on state.
Figure 36B:
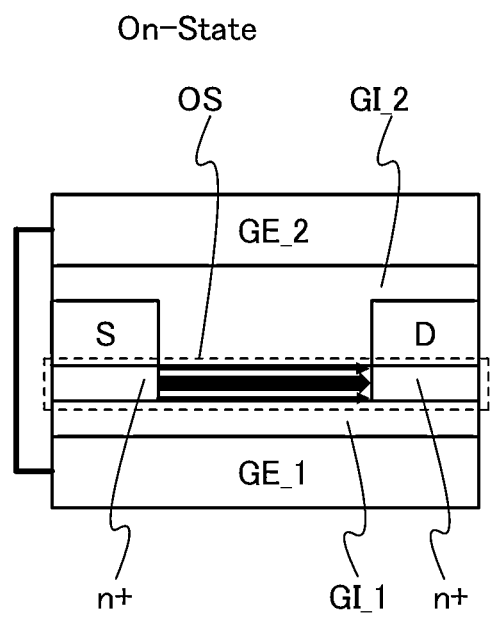

Note that a transistor including an oxide semiconductor film is an accumulation-type transistor. Here, carrier flow in the transistor including an oxide semiconductor film in an off state and in an on state is described with reference to schematic diagrams illustrated in FIGS. 36A to 36C. FIGS. 36A and 36B are cross-sectional views in the channel length direction and FIG. 36C is a cross-sectional view in the channel width direction.

Figure 36C:
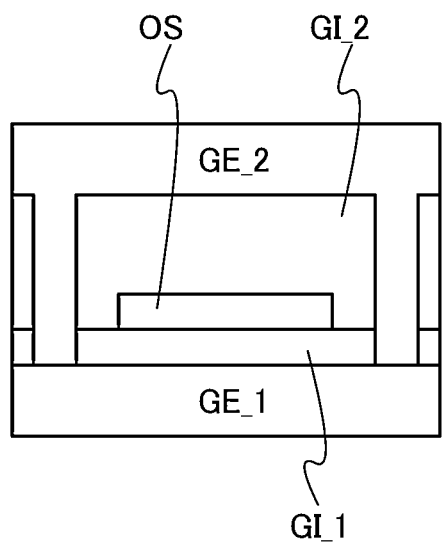

The transistor including an oxide semiconductor film illustrated in FIGS. 36A to 36C includes a gate electrode GE_1, a gate insulating film GI_1 over the gate electrode GE_1, an oxide semiconductor film OS over the gate insulating film GI_1, electrodes S and D over the oxide semiconductor film OS, a gate insulating film GI_2 over the oxide semiconductor film OS and the electrodes S and D, and a gate electrode GE_2 over the gate insulating film GI_2. The oxide semiconductor film OS includes a channel region i, and low-resistance regions n+ in contact with the electrodes S and D. The gate electrode GE_1 and the gate electrode GE_2 are connected to each other as illustrated in FIG. 36C.

In the case where the transistor is in an off state, electrons are forced away from the channel region i of the oxide semiconductor film OS when negative voltage is applied to the gate electrodes GE_1 and GE_2, so that the channel region i is completely depleted as illustrated in FIG. 36A. As a result, the off-state current of the transistor becomes extremely low.

In contrast, in the case of an on state, electrons are accumulated from the low-resistance region n$^+$ in contact with the electrode S to the low-resistance region n$^+$ in contact with the electrode D, and a current path is formed as indicated by arrows in FIG. 36B. As illustrated in FIG. 36C, the gate electrodes GE_1 and GE_2 are set to the same potential, side surfaces of the oxide semiconductor film OS face the gate electrode GE_2, and the gate electrodes GE_1 and GE_2 surround the oxide semiconductor film OS in the channel width direction with the gate insulating film GI_1 provided between the oxide semiconductor film OS and the gate electrode GE_1 and the gate insulating film GI_2 provided between the oxide semiconductor film OS and the gate electrode GE_2. In that case, carriers flow not only at the interfaces between the oxide semiconductor film OS and the gate insulating films GI_1 and GI_2 but also in a wide region in the oxide semiconductor film OS as illustrated in FIG. 36B, which results in an increase in the amount of carriers that move in the transistor. As a result, the on-state current of the transistor is increased, and the field-effect mobility is increased to greater than or equal to 10 $cm^2/V \cdot s$ or to greater than or equal to 20 $cm^2/V \cdot s$, for example. Note that here, the field-effect mobility is not an approximate value of the mobility as the physical property of the oxide semiconductor film but the field-effect mobility in a saturation region of the transistor. Note that an increase in field-effect mobility becomes significant when the channel length L of the transistor is greater than or equal to 0.5 μm and less than or equal to 6.5 μm, preferably greater than 1 μm and less than 6 μm, further preferably greater than 1 μm and less than or equal to 4 μm, still further preferably greater than 1 μm and less than or equal to 3.5 μm, yet still further preferably greater than 1 μm and less than or equal to 2.5 μm. Further, with a small channel length greater than or equal to 0.5 μm and less than or equal to 6.5 μm, the channel width can also be small, in which case the area of the transistor can be reduced even when a region which is a connection portion of the gate electrode GE_1 and the gate electrode GE_2 is provided as illustrated in FIG. 36C.

Figure 19A:
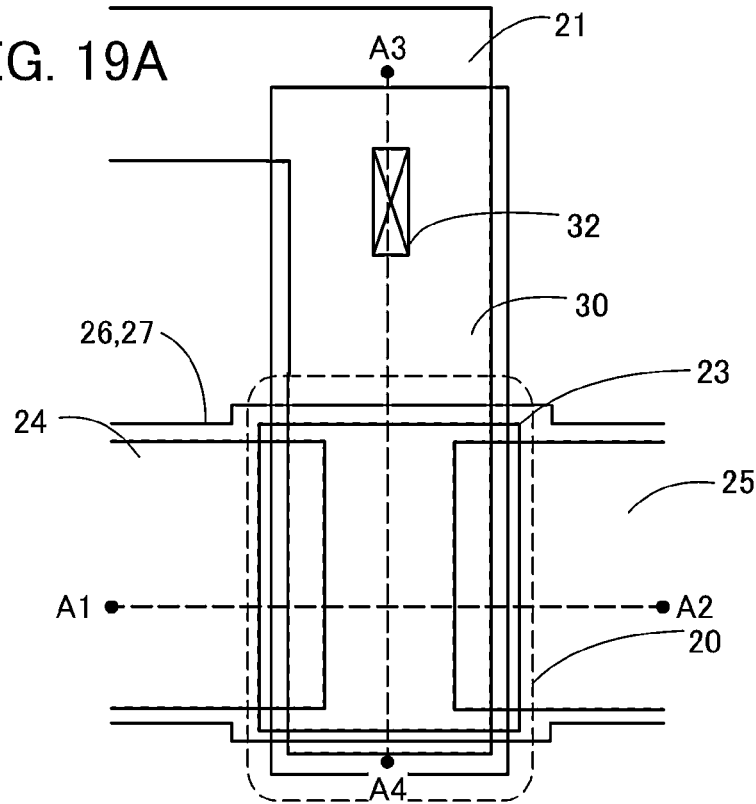
FIGS. 19A to 19C illustrate a structure of a transistor.
Figure 19B:
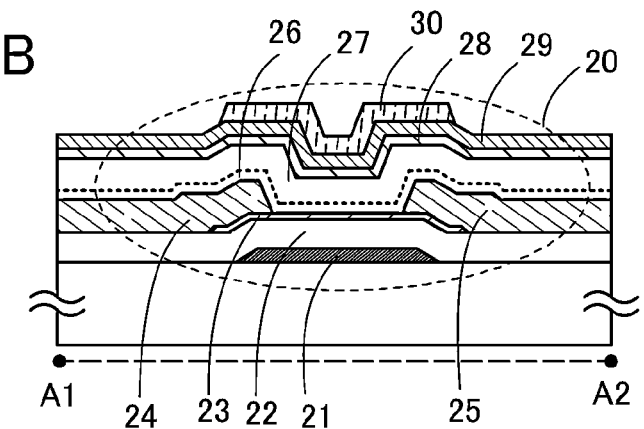
Figure 19C:
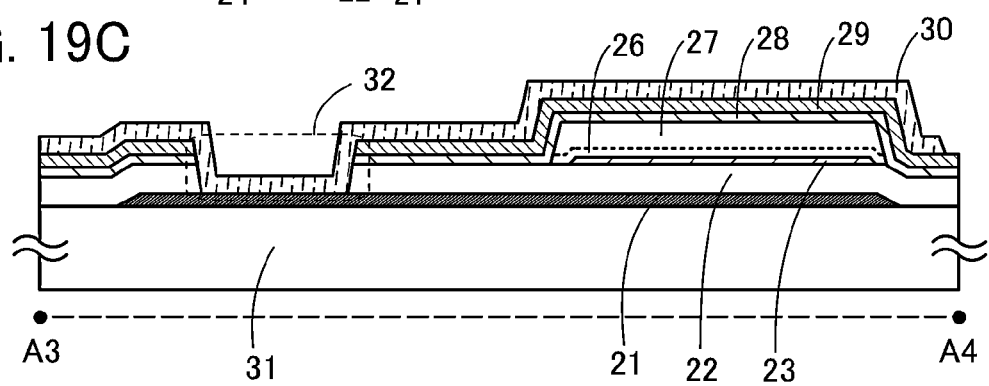

Next, FIGS. 19A to 19C illustrate a specific structure example of the transistor 20 including the pair of gate electrodes electrically connected to each other. FIG. 19A is a top view of the transistor 20. Note that insulating films other than the insulating films 26 and 27, such as a gate insulating film, are not illustrated in FIG. 19A in order to clarify the layout of the transistor 20. FIG. 19B is a cross-sectional view along the dashed line A1-A2 in the top view in FIG. 19A. FIG. 19C is a cross-sectional view along the dashed line A3-A4 in the top view in FIG. 19A.

The transistor 20 in FIGS. 19A to 19C differs from the transistor 20 in FIGS. 2A to 2C in that the insulating film 26 and the insulating film 27 are partly removed on the periphery of the transistor 20. Specifically, in FIGS. 19A to 19C, the insulating film 26 and the insulating film 27 are partly removed to cover at least end portions of the oxide semiconductor film 23 that do not overlap with the conductive film 24 or the conductive film 25. In the transistor 20 in FIGS. 19A to 19C with this structure, the conductive film 30 serving as the gate can be close to the end portions of the oxide semiconductor film 23 in the vicinity of end portions of the insulating film 26 and the insulating film 27. The end portions of the oxide semiconductor film 23 easily have n-type conductivity as described above. However, current that flows between the conductive film 24 and the conductive film 25 through the end portions of the oxide semiconductor film 23 can be controlled by the potential applied to the conductive film 30. This is because the strength of the electric field applied from the conductive film 30 to the end portions of the oxide semiconductor film 23 can be increased by making the conductive film 30 close to the end portions of the oxide semiconductor film 23. As a result, the transistor 20 can have low off-state current and high on-state current even when the channel length of the transistor 20 is shortened.

Note that in each of the transistors 20 illustrated in FIGS. 2A to 2C and FIGS. 19A to 19C, end portions of the conductive film 30 are provided to overlap with the oxide semiconductor film 23 in the channel length direction; however, end portions of the oxide semiconductor film 23 may be provided to overlap with the conductive film 30 in the channel length direction.

Figure 20A:
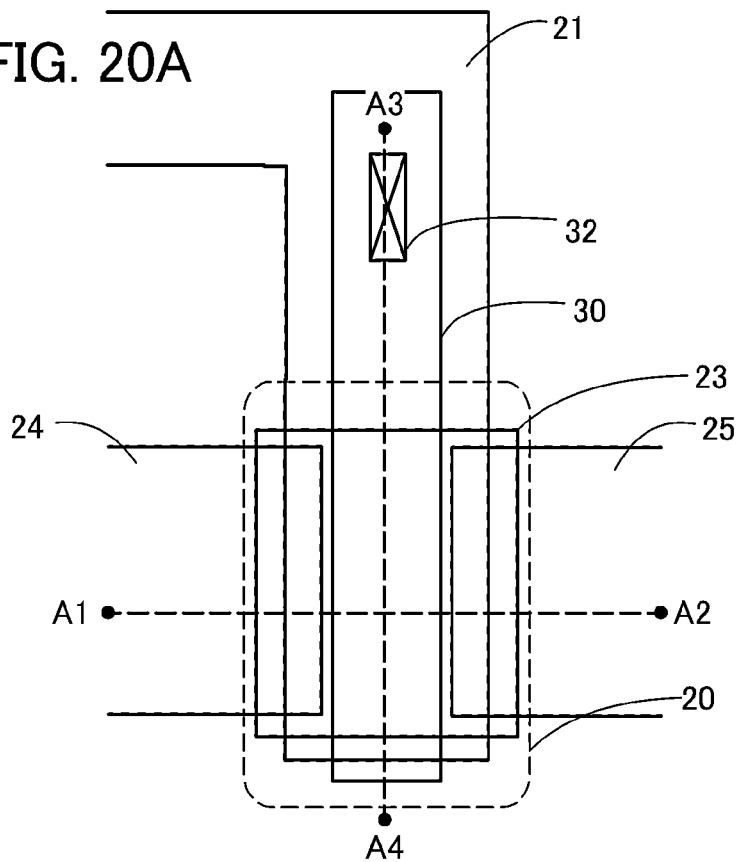
FIGS. 20A to 20C illustrate a structure of a transistor.
Figure 20B:
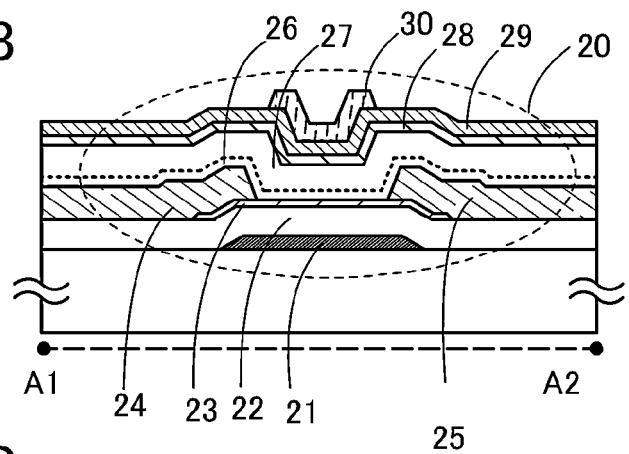
Figure 20C:
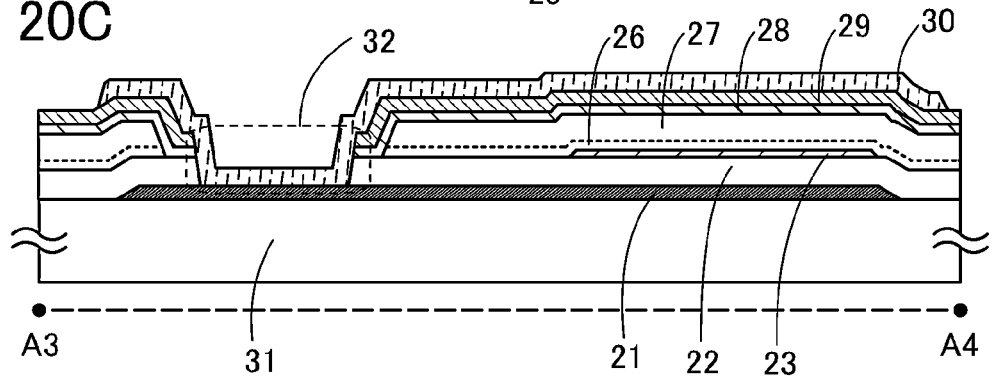

Next, FIGS. 20A to 20C illustrate a specific structure example of the transistor 20 including the pair of gate electrodes electrically connected to each other. FIG. 20A is a top view of the transistor 20. Note that insulating films such as a gate insulating film are not illustrated in FIG. 20A in order to clarify the layout of the transistor 20. FIG. 20B is a cross-sectional view along the dashed line A1-A2 in the top view in FIG. 20A. FIG. 20C is a cross-sectional view along the dashed line A3-A4 in the top view in FIG. 20A.

The transistor 20 in FIGS. 20A to 20C differs from the transistor 20 in FIGS. 2A to 2C in that the conductive film 30 does not overlap with the conductive film 24 or the conductive film 25 in a region where the oxide semiconductor film 23 is provided. In other words, the transistor 20 in FIGS. 20A to 20C differs from the transistor 20 in FIGS. 2A to 2C in that the conductive film 30 and the conductive films 24 and 25 are provided in different regions in a region where the oxide semiconductor film 23 is provided.

Figure 21A:
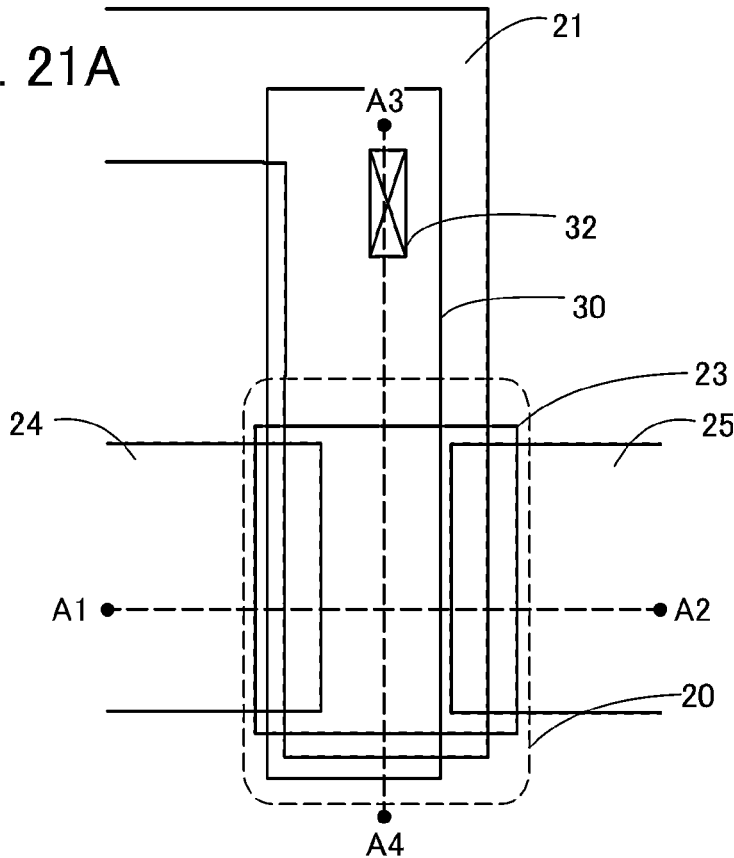
FIGS. 21A to 21C illustrate a structure of a transistor.
Figure 21B:
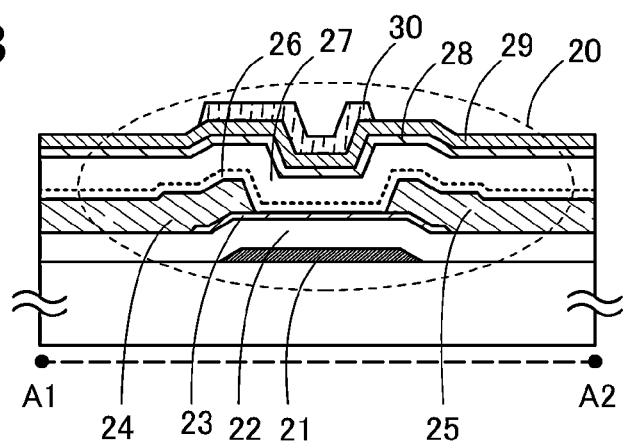
Figure 21C:
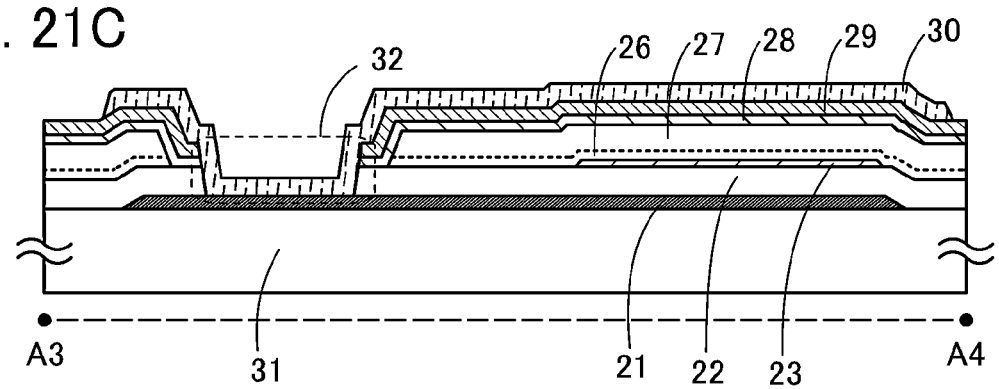

Next, FIGS. 21A to 21C illustrate a specific structure example of the transistor 20 including the pair of gate electrodes electrically connected to each other. FIG. 21A is a top view of the transistor 20. Note that insulating films such as a gate insulating film are not illustrated in FIG. 21A in order to clarify the layout of the transistor 20. FIG. 21B is a cross-sectional view along the dashed line A1-A2 in the top view in FIG. 21A. FIG. 21C is a cross-sectional view along the dashed line A3-A4 in the top view in FIG. 21A.

The transistor 20 in FIGS. 21A to 21C differs from the transistor 20 in FIGS. 2A to 2C in that the conductive film 30 overlaps with the conductive film 24 and does not overlap with the conductive film 25 in a region where the oxide semiconductor film 23 is provided. In other words, the transistor 20 in FIGS. 21A to 21C differs from the transistor 20 in FIGS. 2A to 2C in that in a region where the oxide semiconductor film 23 is provided, the conductive film 30 is partly provided in a region where the conductive film 24 is provided and not provided in a region where the conductive film 25 is provided.

Figure 24A:
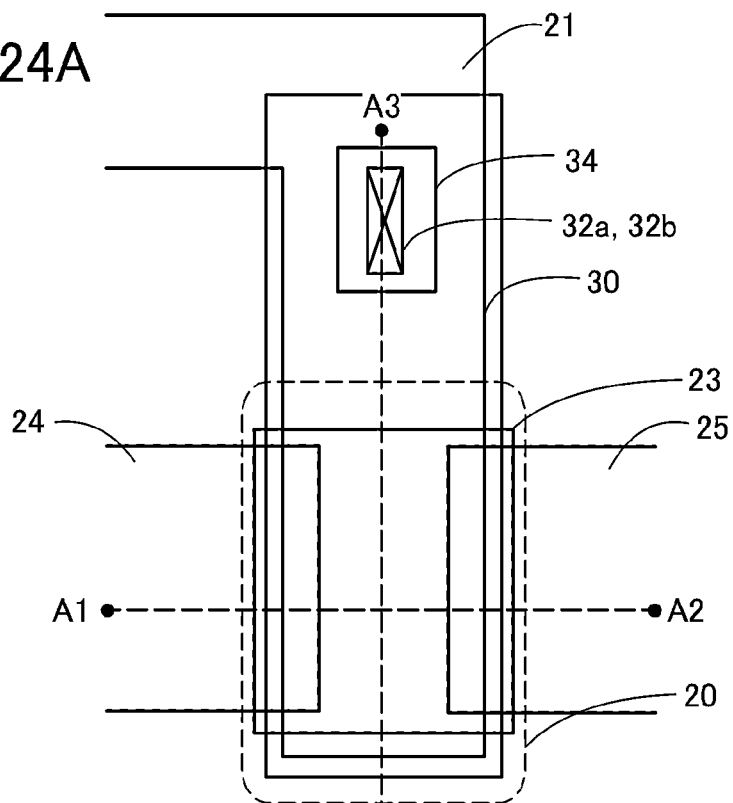
FIGS. 24A to 24C illustrate a structure of a transistor.
Figure 24B:
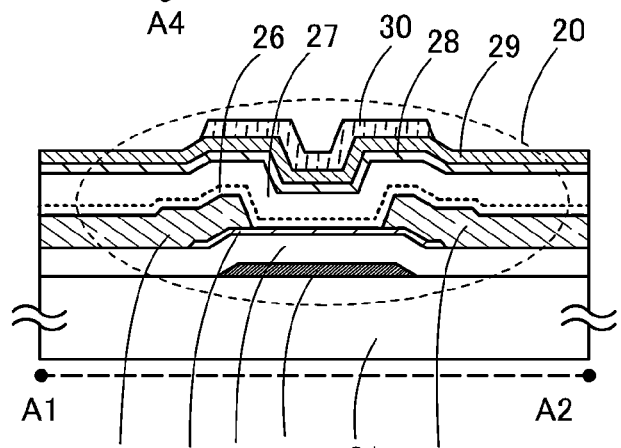
Figure 24C:
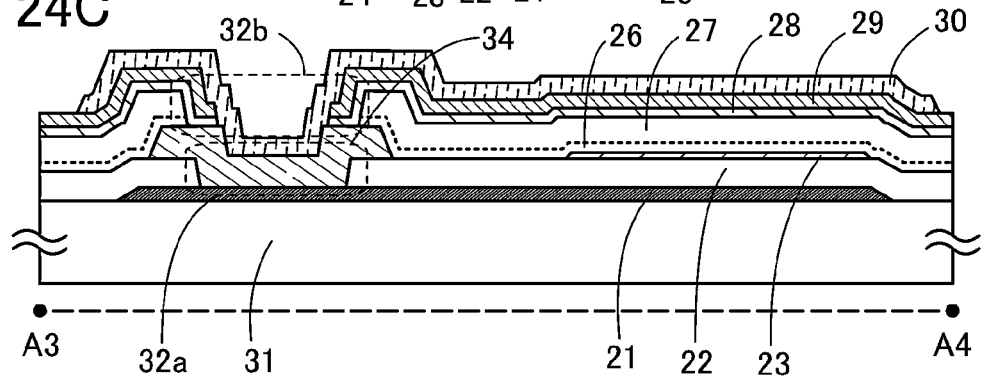

Next, FIGS. 24A to 24C illustrate a specific structure example of the transistor 20 including the pair of gate electrodes electrically connected to each other. FIG. 24A is a top view of the transistor 20. Note that insulating films such as a gate insulating film are not illustrated in FIG. 24A in order to clarify the layout of the transistor 20. FIG. 24B is a cross-sectional view along the dashed line A1-A2 in the top view in FIG. 24A. FIG. 24C is a cross-sectional view along the dashed line A3-A4 in the top view in FIG. 24A.

The transistor 20 in FIGS. 24A to 24C differs from the transistor 20 in FIGS. 2A to 2C in that the conductive film 21 and the conductive film 30 are electrically connected to each other with a conductive film 34 provided therebetween. Specifically, the conductive film 34 is formed over the insulating film 22 and in contact with the conductive film 21 in an opening 32a formed in the insulating film 22. The conductive film 30 is in contact with the conductive film 34 in an opening 32b formed in the insulating film 26, the insulating film 27, the nitride insulating film 28, and the insulating film 29.

In the transistor 20 illustrated in any of FIGS. 20A to 20C, FIGS. 21A to 21C, and FIGS. 24A to 24C, the insulating film 26 and the insulating film 27 may be partly removed, as in the transistor illustrated in FIGS. 19A to 19C.

Figure 23A:
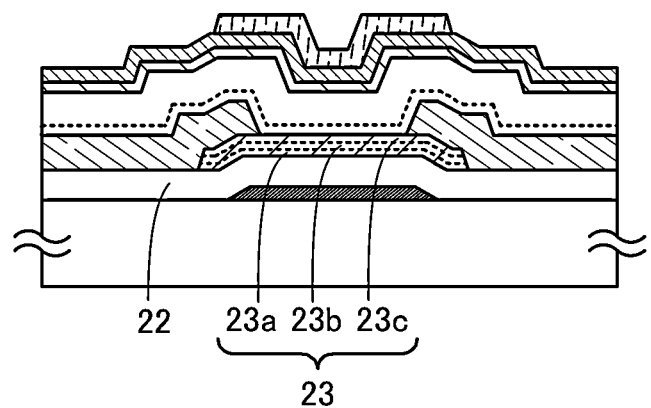
FIGS. 23A and 23B illustrate cross-sectional structures of transistors.

In the transistor 20 illustrated in any of FIGS. 2A to 2C, FIGS. 19A to 19C, FIGS. 20A to 20C, and FIGS. 21A to 21C, the oxide semiconductor film 23 is not limited to a single oxide semiconductor film and may have a stacked structure including a plurality of oxide semiconductor films. FIG. 23A illustrates an example of the oxide semiconductor film 23 formed using a stack of three oxide semiconductor films. Specifically, in the transistor 20 in FIG. 23A, as the oxide semiconductor film 23, oxide semiconductor films 23a to 23c are stacked in this order from the insulating film 22 side.

Each of the oxide semiconductor films 23a and 23c is an oxide film that contains at least one of metal elements contained in the oxide semiconductor film 23b and whose conduction band minimum is closer to the vacuum level than that in the oxide semiconductor film 23b by higher than or equal to 0.05 eV, 0.07 eV, 0.1 eV, or 0.15 eV and lower than or equal to 2 eV, 1 eV, 0.5 eV, or 0.4 eV. Furthermore, the oxide semiconductor film 23b preferably contains at least indium, in which case the carrier mobility of the oxide semiconductor film 23b is increased.

Figure 23B:
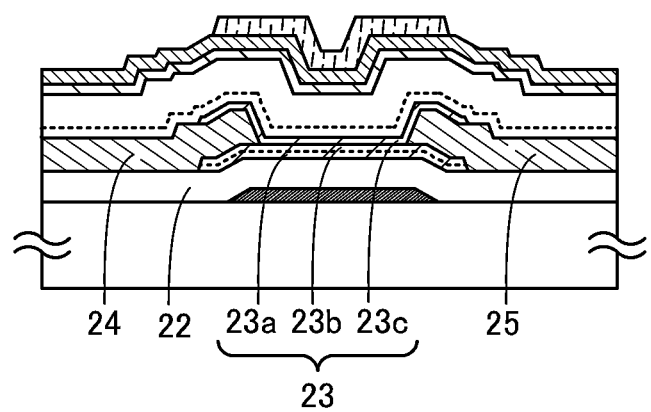

Note that as illustrated in FIG. 23B, the oxide semiconductor film 23c may be provided over the conductive films 24 and 25 to overlap with the insulating film 22.

Next, FIG. 22A illustrates a circuit symbol of the transistor which includes the pair of gate electrodes overlapping with each other with the semiconductor film provided therebetween. In the circuit symbol in FIG. 22A, the pair of gate electrodes, the source electrode, and the drain electrode are represented by FG and BG, S, and D, respectively. In the circuit symbol in FIG. 22A, a positional relationship between the conductive film 30 serving as the gate electrode and the conductive films 24 and 25 serving as the source and drain electrodes is not limited.

FIG. 22B1 illustrates a circuit symbol of the transistor 20 in which the conductive films 24 and 25 serving as the source and drain electrodes partly overlap with the conductive film 30 serving as the gate electrode over the oxide semiconductor film 23. In the circuit symbol in FIG. 22B1, similarly in the circuit symbol in FIG. 22A, the pair of gate electrodes, the source electrode, and the drain electrode are represented by FG and BG, S, and D, respectively.

FIG. 22B2 illustrates an example of a cross-sectional view of the transistor 20 corresponding to the circuit symbol in FIG. 22B1. In the channel length direction of the transistor 20 illustrated in FIG. 22B2, a distance Wsd between the conductive films 24 and 25 is shorter than a distance Wbg between end portions of the conductive film 30. Further, in the cross-sectional view in the channel length direction, the end portions of the conductive film 30 overlap with the conductive films 24 and 25.

FIG. 22C1 illustrates a circuit symbol of the transistor 20 in which the conductive films 24 and 25 serving as the source and drain electrodes do not overlap with the conductive film 30 serving as the gate electrode over the oxide semiconductor film 23. In the circuit symbol in FIG. 22C1, similarly in the circuit symbol in FIG. 22A, the pair of gate electrodes, the source electrode, and the drain electrode are represented by FG and BG, S, and D, respectively.

FIG. 22C2 illustrates an example of a cross-sectional view of the transistor 20 corresponding to the circuit symbol in FIG. 22C1. In the channel length direction of the transistor 20 illustrated in FIG. 22C2, the distance Wsd between the conductive films 24 and 25 is longer than the distance Wbg between end portions of the conductive film 30. Further, in the cross-sectional view in the channel length direction, the end portions of the conductive film 30 do not overlap with the conductive films 24 and 25.

In the drawings attached to this specification, the circuit symbol in FIG. 22A can represent the transistor 20 having a structure represented by the circuit symbol in FIG. 22B1 and the transistor 20 having a structure represented by the circuit symbol in FIG. 22C1.

<Measurement of Electrical Characteristics of Transistor>

Next, description is given of results from measurement of the electrical characteristics of a transistor irradiated with light. The transistor includes a channel formation region in an oxide semiconductor film.

First, described is a structure of a transistor used in the measurement. A first transistor including a gate electrode and a second transistor including a pair of gate electrodes overlapping with each other with a semiconductor film provided therebetween were used in the measurement.

The first transistor includes, on an insulating surface, a gate electrode and a gate insulating film over the gate electrode. A 200-nm-thick tungsten film was used as the gate electrode. A 400-nm-thick silicon nitride film and a 50-nm-thick silicon oxynitride film were stacked as the gate insulating film in this order over the gate electrode. The first transistor further includes a 35-nm-thick In—Ga—Zn-based oxide semiconductor film which overlaps with the gate electrode with the gate insulating film provided therebetween. The first transistor further includes, over the oxide semiconductor film, a source electrode and a drain electrode formed by stacking a 50-nm-thick tungsten film, a 400-nm-thick aluminum film, and a 200-nm-thick titanium film in this order. In addition, over the oxide semiconductor film, the source electrode, and the drain electrode, a 50-nm-thick silicon oxynitride film, a 400-nm-thick silicon oxynitride film, and a 100-nm-thick silicon nitride film were stacked in this order.

The second transistor differs from the first transistor in that a gate electrode is further included over the silicon nitride film. A 100-nm-thick indium tin oxide film to which silicon oxide was added was used as the gate electrode. In the second transistor, the gate electrode using the tungsten film was electrically connected to the gate electrode using the indium tin oxide film to which silicon oxide was added.

Note that in each of the first transistor and the second transistor, the In—Ga—Zn-based oxide semiconductor film was formed by a sputtering method using a target with a composition of In:Ga:Zn=1:1:1 (atomic ratio). In each of the first transistor and the second transistor, the 50-nm-thick silicon oxynitride film was formed by a plasma CVD method in the following conditions: silane with a flow rate of 20 sccm and dinitrogen monoxide with a flow rate of 3000 sccm were used as the source gases, the pressure in a treatment chamber was 200 Pa, the substrate temperature was 350° C., and a high-frequency power of 150 W (with a high power density of $2.5 \times 10^{-2}$ W/cm$^2$) was supplied to parallel plate electrodes with a high-frequency power supply of 27.12 MHz. In each of the first transistor and the second transistor, the 400-nm-thick silicon oxynitride film was formed by a plasma CVD method in the following conditions: silane with a flow rate of 160 sccm and dinitrogen monoxide with a flow rate of 4000 sccm were used as the source gases, the pressure in a treatment chamber was 200 Pa, the substrate temperature was 220° C., and a high-frequency power of 1500 W (with a high power density of $2.5\times10^{-2}$ W/cm$^2$) was supplied to parallel plate electrodes with a high-frequency power supply of 27.12 MHz. Furthermore, in each of the first transistor and the second transistor, the 100-nm-thick silicon nitride film was formed by a plasma CVD method in the following conditions: silane with a flow rate of 50 sccm, nitrogen with a flow rate of 5000 sccm, and ammonia with a flow rate of 100 sccm were used as the source gases, the pressure in a treatment chamber was 100 Pa, the substrate temperature was 350° C., and a high-frequency power of 1000 W (with a high power density of $1.6\times10^{-1}$ W/cm$^2$) was supplied to parallel plate electrodes with a high-frequency power supply of 27.12 MHz.

The first transistor and the second transistor each had a channel length L of 6 μm and a channel width W of 50 μm.

The electrical characteristics of the first transistor and the second transistor were each measured in the following manner: a drain current was measured before a stress application step (Measurement 1) and then the drain current was measured after the stress application step (Measurement 2). In the stress application step, the substrate temperature was kept at 60° C. and a gate voltage $V_g$ was kept at −30 V for one hour in a dark room without light irradiation. Specifically, in Measurements 1 and 2, the drain current was measured at a substrate temperature of 60° C. in a dark room without light irradiation. For the measurements, the gate voltage $V_g$ was changed by 0.25 V in the range of −15 V to 30 V, and a voltage $V_{ds}$ between the source and drain electrodes was 0.1 V or 10 V.

Figure 17A:
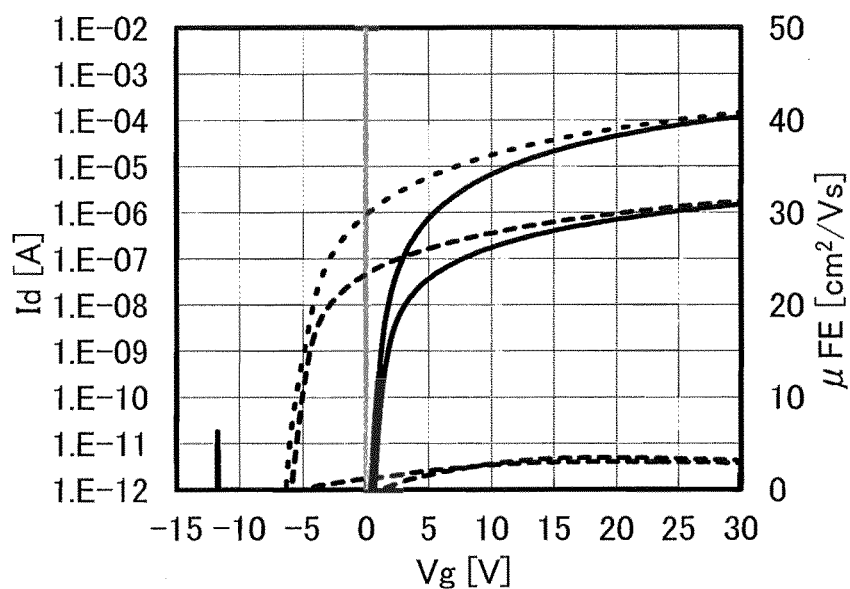
FIGS. 17A and 17B show the electrical characteristics of transistors.
Figure 17B:
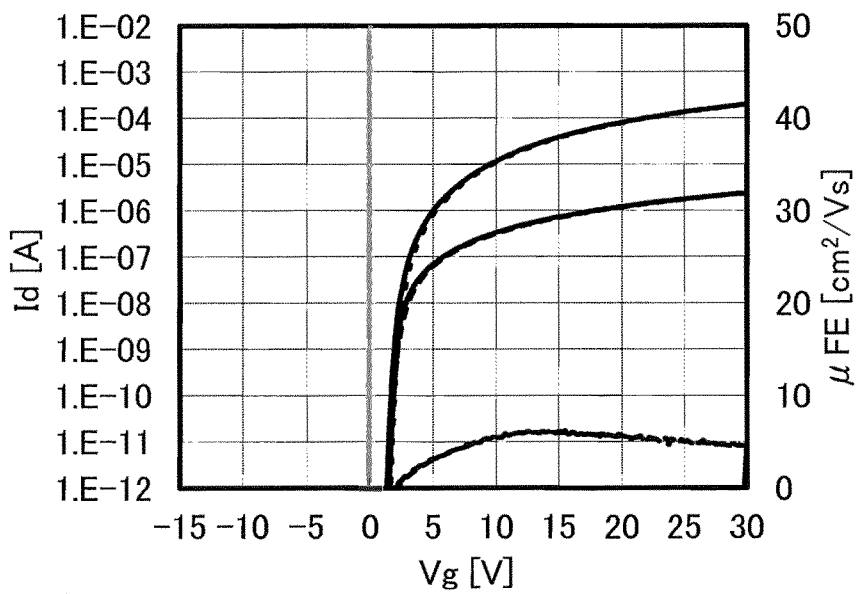

FIG. 17A shows the relationship between the gate voltage $V_g$ and a drain current $I_d$ of the first transistor, which were obtained by the measurement. FIG. 17A further shows field-effect mobility $\mu_{FE}$ obtained by calculation at a voltage $V_{ds}$ of 10 V. FIG. 17B shows the relationship between the gate voltage $V_g$ and a drain current $I_d$ of the second transistor, which were obtained by the measurement. FIG. 17B further shows field-effect mobility $\mu_{FE}$ obtained by calculation at a voltage $V_{ds}$ of 10 V. FIGS. 17A and 17B show that the second transistor has the drain current $I_d$ and the field-effect mobility $\mu_{FE}$ larger than those of the first transistor.

Table 1 shows the threshold voltage ($V_{th}$) and a shift value (Shift) of each of the first transistor (Single Gate) and the second transistor (Dual Gate), which were obtained in the measurements. Note that the shift value is defined as the value of gate voltage at the time when drain current rises. Specifically, in a plot showing the relationship between gate voltage in a linear scale and drain current in a logarithmic scale, the shift value can be defined as the voltage at the intersection of a tangent where slope change in drain current is the steepest and a graduation line corresponding to a drain current of 1.E-12 [A]. The shift value is a value at the time when the voltage $V_{ds}$ is 10 V.

TABLE 1

|  | Single Gate | | Dual Gate | |
| --- | --- | --- | --- | --- |
|  | $V_{th}$ | Shift | $V_{th}$ | Shift |
| Initial value | 4.29 | 0.47 | 4.03 | 1.31 |
| Variation value (Δ value) | −4.48 | −6.80 | 0.27 | 0.25 |

As shown in Table 1, through the stress application step, the threshold voltage was shifted by −4.48 V and the shift value was shifted by −6.80 V in the first transistor, and the threshold voltage was shifted by 0.27 V and the shift value was shifted by 0.25 V in the second transistor. Thus, it is found that shifts in the threshold voltage and the shift value of the second transistor in a negative direction can be smaller than those of the first transistor.

Consequently, the measurements suggest that with a pair of gate electrodes overlapping with each other with a semiconductor film provided therebetween, a shift in the threshold voltage of a transistor in a negative direction can be suppressed. In addition, it is found that application of the same potential to the pair of gate electrodes enables an increase in drain current.

<Comparison Between Channel-Etched Transistor and Channel-Protective Transistor Operated by Dual-Gate Driving>

Here, the field-effect mobility $\mu_{FE}$ and the on-state current $I_{on}$ of the channel-etched transistor are compared with those of the channel-protective transistor. Note that the transistors are operated by dual-gate driving (also called dual-gate transistors). In each of the transistors, gate electrodes facing each other with an oxide semiconductor film provided therebetween are connected to each other and have the same potential.

Figure 29A:
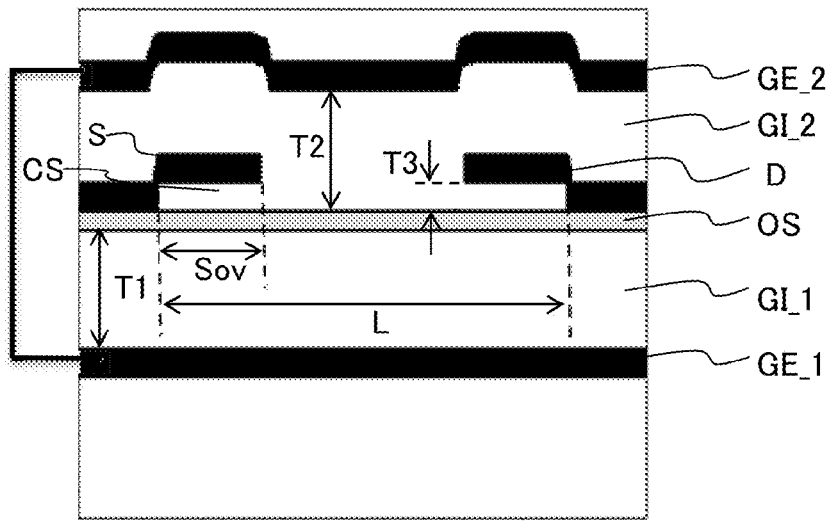
FIG. 29A illustrates a structure of a transistor used for calculation.

Electrical characteristics of the channel-etched transistor and the channel-protective transistor were calculated. FIG. 29A illustrates a structure of the channel-protective transistor used for the calculation. Note that a device simulation software "Atlas" manufactured by Silvaco Data Systems Inc. was used for the calculation.

In the channel-protective transistor, a gate insulating film GI_1 is formed over a gate electrode GE_1, an oxide semiconductor film OS is formed over the gate insulating film GI_1, and a source electrode S and a drain electrode D are formed over the gate insulating film GI_1 and the oxide semiconductor film OS. Note that a channel protective film CS is formed between the oxide semiconductor film OS and end portions of the source electrode S and the drain electrode D. In addition, a gate insulating film GI_2 is formed over the oxide semiconductor film OS, the source electrode S, the drain electrode D, and the channel protective film CS; and a gate electrode GE_2 is formed over the gate insulating film GI_2. The gate electrode GE_1 is connected to the gate electrode GE_2 in an opening (not illustrated) formed in the gate insulating film GI_1 and the gate insulating film GI_2.

In the channel-etched transistor, a channel protective film CS is not provided, and end portions of a source electrode S and a drain electrode D are in contact with an oxide semiconductor film OS.

Calculation conditions are shown in Table 2.

TABLE 2

| | |
| --- | --- |
| Channel length (L) | 10 μm |
| Channel width (W) | 100 μm |
| Thickness of GI_1 (T1) | 450 nm |
| Thickness of GI_2 (T2) | 450 nm |
| Thickness of channel protective film CS (T3) | 100 nm |
| Dielectric constants of GI_1, GI_2, and CS (Er) | 3.9 |
| Thickness of OS | 35 nm |
| Mobility of OS | 10 cm$^2$/V · sec |
| Dielectric constant of OS (Er) | 15 |
| Donor density of OS under SD | $1 \times 10^{19}$/cm$^3$ |
| Donor density of OS in channel region | $6.6 \times 10^{-9}$/cm$^3$ |

As a comparison example of the dual-gate transistor which is illustrated in FIG. 29A, a transistor operated by a single-gate driving (also called a single-gate transistor) that does not include a gate electrode GE_2 was used and subjected to calculation in the manner similar to that of the dual-gate transistor.

Figure 29B:
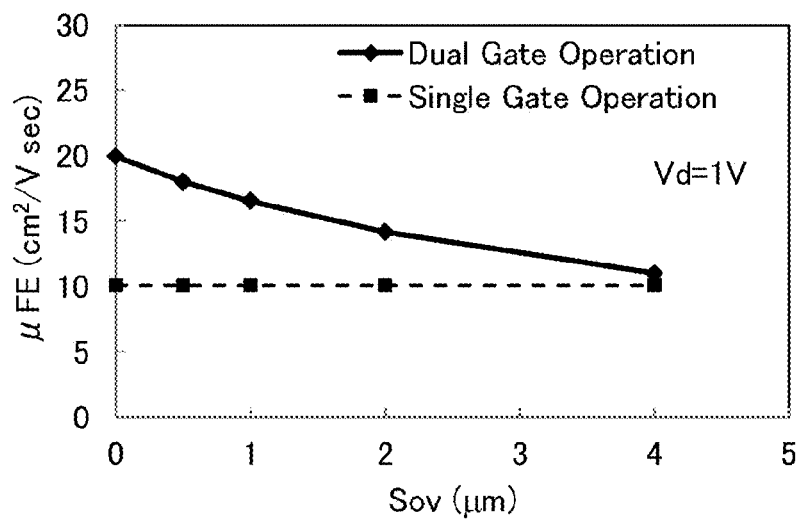
FIGS. 29B and 29C show field-effect mobility and on-state current obtained by the calculation.
Figure 29C:
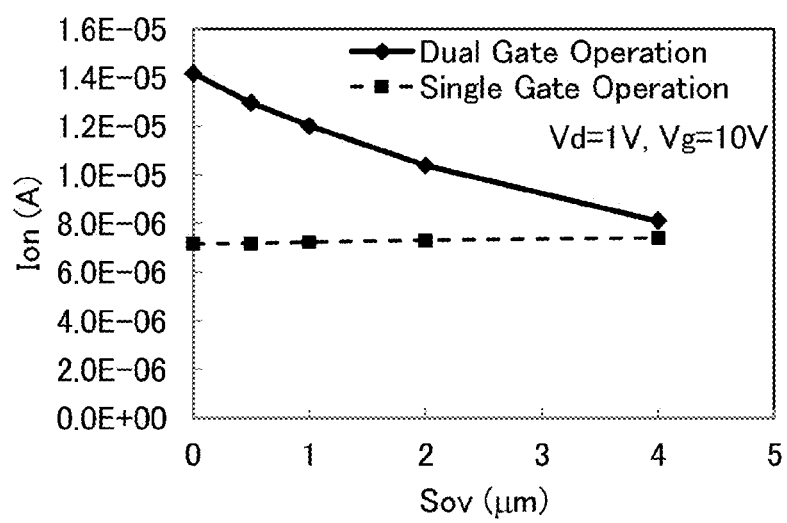

In the channel-protective transistor, Sov denotes the length of a region where the source electrode S or the drain electrode D overlaps with the oxide semiconductor film OS with the channel protective film CS provided therebetween. A region which is in the source electrode S or the drain electrode D and overlaps with the oxide semiconductor film OS with the channel protective film CS provided therebetween is referred to as an Sov region. FIG. 29B shows the calculation result of the relationship between Sov and field-effect mobility. FIG. 29C shows the calculation result of the relationship between Sov and on-state current.

Furthermore, the field-effect mobility and the on-state current of the channel-etched transistor were calculated on the assumption that Sov was 0 µm. The calculation result of the field-effect mobility and that of the on-state current are shown in FIGS. 29B and 29C, respectively.

Note that FIG. 29B shows the result at a drain voltage $V_d$ of 1 V. FIG. 29C shows the result at a drain voltage $V_d$ of 1 V and a gate voltage $V_g$ of 10 V.

As shown in FIG. 29B, the field-effect mobility of the channel-etched transistor (Sov=0 µm) operated by the dual-gate driving is approximately twice that of the channel-etched transistor operated by the single-gate driving. In contrast, the field-effect mobility of the channel-protective transistor operated by the dual-gate driving is decreased as the Sov becomes larger.

As shown in FIG. 29C, the on-state current of the channel-etched transistor (Sov=0 µm) operated by the dual-gate driving is approximately twice that of the transistor operated by the single-gate driving. In contrast, the on-state current of the channel-protective transistor operated by the dual-gate driving is decreased as the Sov becomes larger.

In the channel-protective transistor, the Sov regions of the source electrode S and the drain electrode D block an electric field of the gate electrode GE_2. Accordingly, a region whose carrier density cannot be controlled by the voltage of the gate electrode GE_2 is increased in the oxide semiconductor film OS. It is probable that the field-effect mobility and the on-state current are thus decreased as the Sov becomes larger. In view of the above, the channel-etched dual-gate transistor is much more effective in increasing the field-effect mobility and the on-state current than the channel-protective dual-gate transistor is.

<Improvement in Current Drive Capability Due to Dual-Gate Driving>

Description is given of an improvement in the current drive capability of a dual-gate transistor due to a small channel length L. In the transistor, gate electrodes facing each other with an oxide semiconductor film provided therebetween are connected to each other and have the same potential.

<<Saturation Mobility of Ideal Model>>

Figure 30:
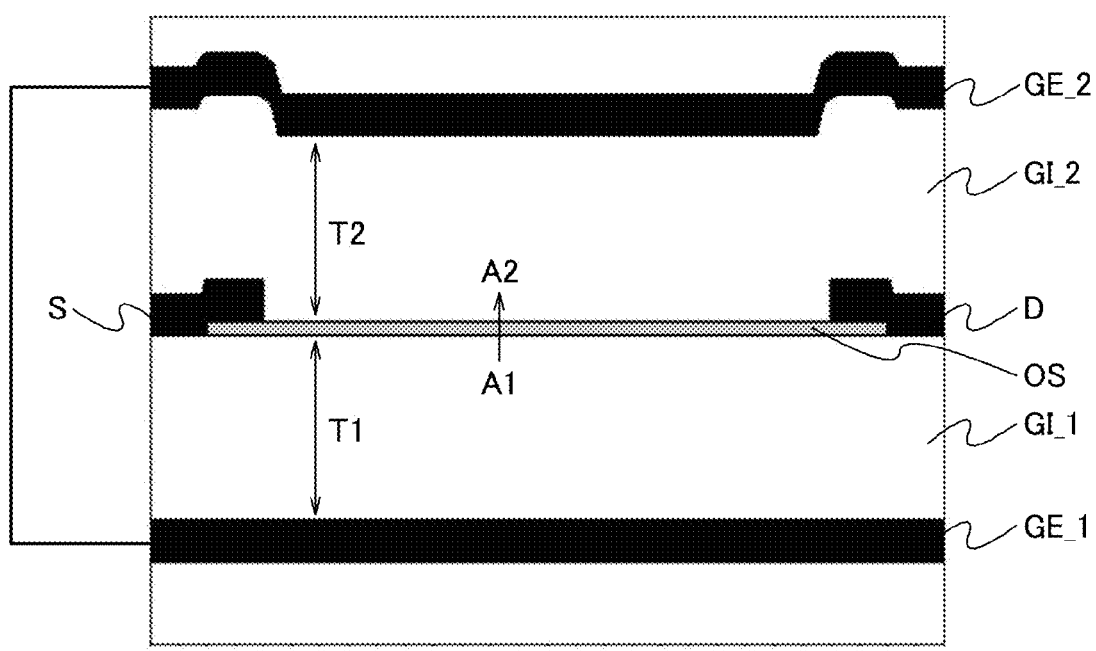
FIG. 30 illustrates a model of a transistor used for calculation.

First, calculation was performed on an ideal model regardless of effects of an interface state, interface scattering, and the like. FIG. 30 illustrates a model of a transistor used for the calculation. Note that a device simulation software "Atlas" manufactured by Silvaco Data Systems Inc. was used for the calculation.

In the transistor illustrated in FIG. 30, a gate insulating film GI_1 is formed over a gate electrode GE_1; an oxide semiconductor film OS is formed over the gate insulating film GI_1; a source electrode S and a drain electrode D are formed over the gate insulating film GI_1 and the oxide semiconductor film OS; a gate insulating film GI_2 is formed over the oxide semiconductor film OS, the source electrode S, and the drain electrode D; and a gate electrode GE_2 is formed over the gate insulating film GI_2. The gate electrode GE_1 is connected to the gate electrode GE_2 in an opening (not illustrated) formed in the gate insulating film GI_1 and the gate insulating film GI_2.

Calculation conditions are shown in Table 3.

TABLE 3

| | |
|---|---|
| Channel length | 2 µm, 3 µm, 6 µm, or 10 µm |
| Channel width | 50 µm |
| Thickness of GI_1 (T1) | 450 nm |
| Thickness of GI_2 (T2) | 450 nm |
| Dielectric constants of GI_1 and GI_2 (Er) | 3.9 |
| Thickness of OS | 35 nm |
| Mobility of OS | 10 cm$^2$/V · sec |
| Dielectric constant of OS (Er) | 15 |
| Donor density of OS under SD | 1 × 10$^{19}$/cm$^3$ |
| Donor density of OS in channel region | 6.6 × 10$^{-9}$/cm$^3$ |
| Drain voltage | 1 V or 10 V |

The gate electrode GE_1 and the gate electrode GE_2 are connected to each other and therefore have potentials equal to each other at all times. Furthermore, an effect in a channel width direction is not considered because a two-dimensional simulation was performed on the model. Saturation mobility $\mu_{FE}$ was obtained by substituting a value of $V_g$-$I_d$ characteristics at a drain voltage $V_d$ of 10 V into Formula 1. Note that here, field-effect mobility in a saturation region is described as the saturation mobility. The maximum value of the saturation mobility obtained by calculation is an index of current drive capability in the saturation region (gate voltage $V_g$<drain voltage $V_d$+threshold voltage $V_{th}$), and is not an approximate value of the mobility as the physical property of the oxide semiconductor film.

[Formula 1]

$$\mu_{FE} = \left(\frac{d\sqrt{I_d}}{dV_g}\right)^2 \frac{2L}{C_{Bottom}W} \quad (1)$$

In Formula 1, W represents the channel width of a transistor and $C_{Bottom}$ represents capacitance per unit area between the gate electrode GE_1 and the oxide semiconductor film OS. In the case of the dual-gate transistor, capacitance is also formed between the gate electrode GE_2 and the oxide semiconductor film OS; however, since the saturation mobility is used as an index for comparison of current drive capabilities, the capacitance on the gate electrode GE_2 side in the dual-gate transistor is not considered, and Formula 1 is used for both the dual-gate transistor and the single-gate transistor.

Figure 31A:
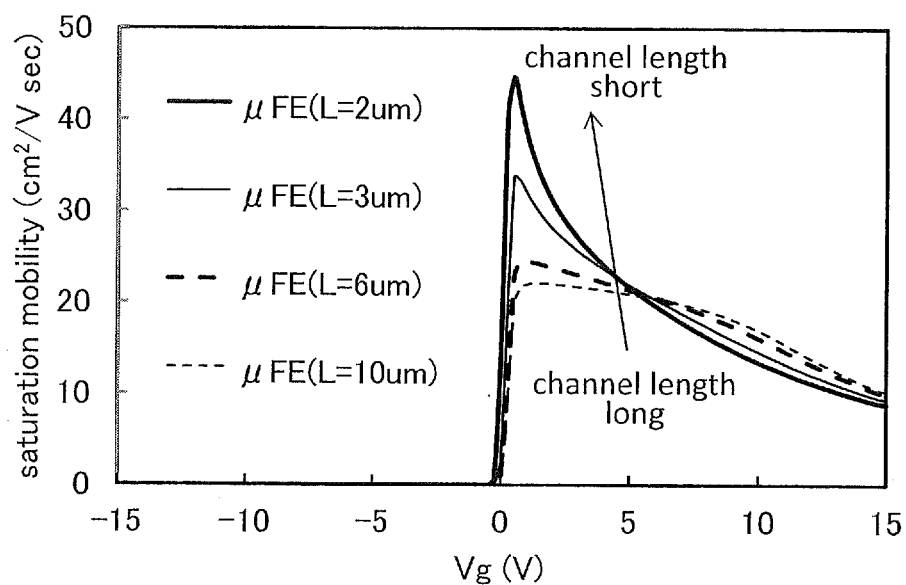
FIGS. 31A and 31B each show the channel length dependence of saturation mobility obtained by calculation.
Figure 31B:
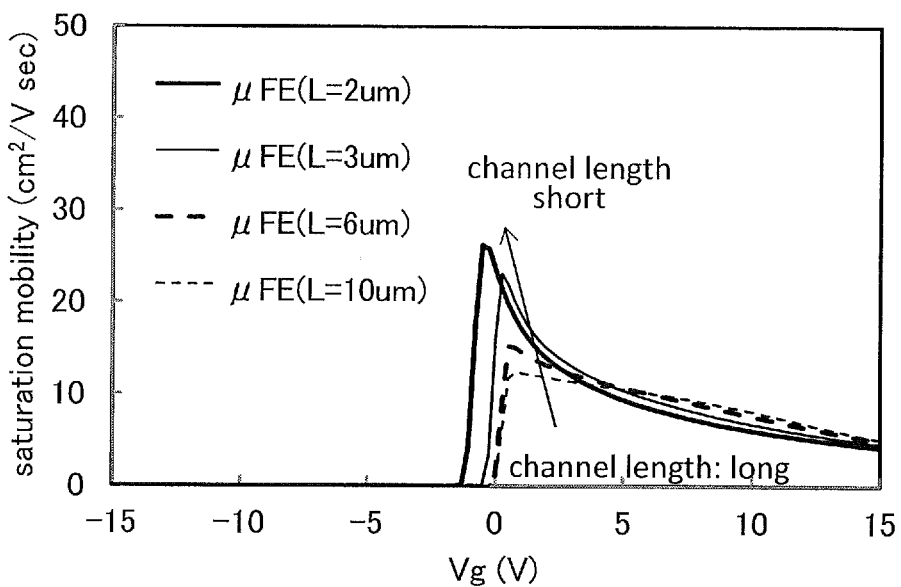

FIG. 31A shows calculation result of the dual-gate transistor, and FIG. 31B shows calculation result of the single-gate transistor that does not include a gate electrode GE_2.

FIGS. 31A and 31B show that the saturation mobility has a sharp peak in both of the dual-gate transistor and the single-gate transistor. The peak value of the saturation mobility is increased as the channel length L becomes smaller.

Description is given below of whether an increase in the saturation mobility with decreasing the channel length L corresponds to the improvement in the current drive capability of the transistor.

Figure 32:
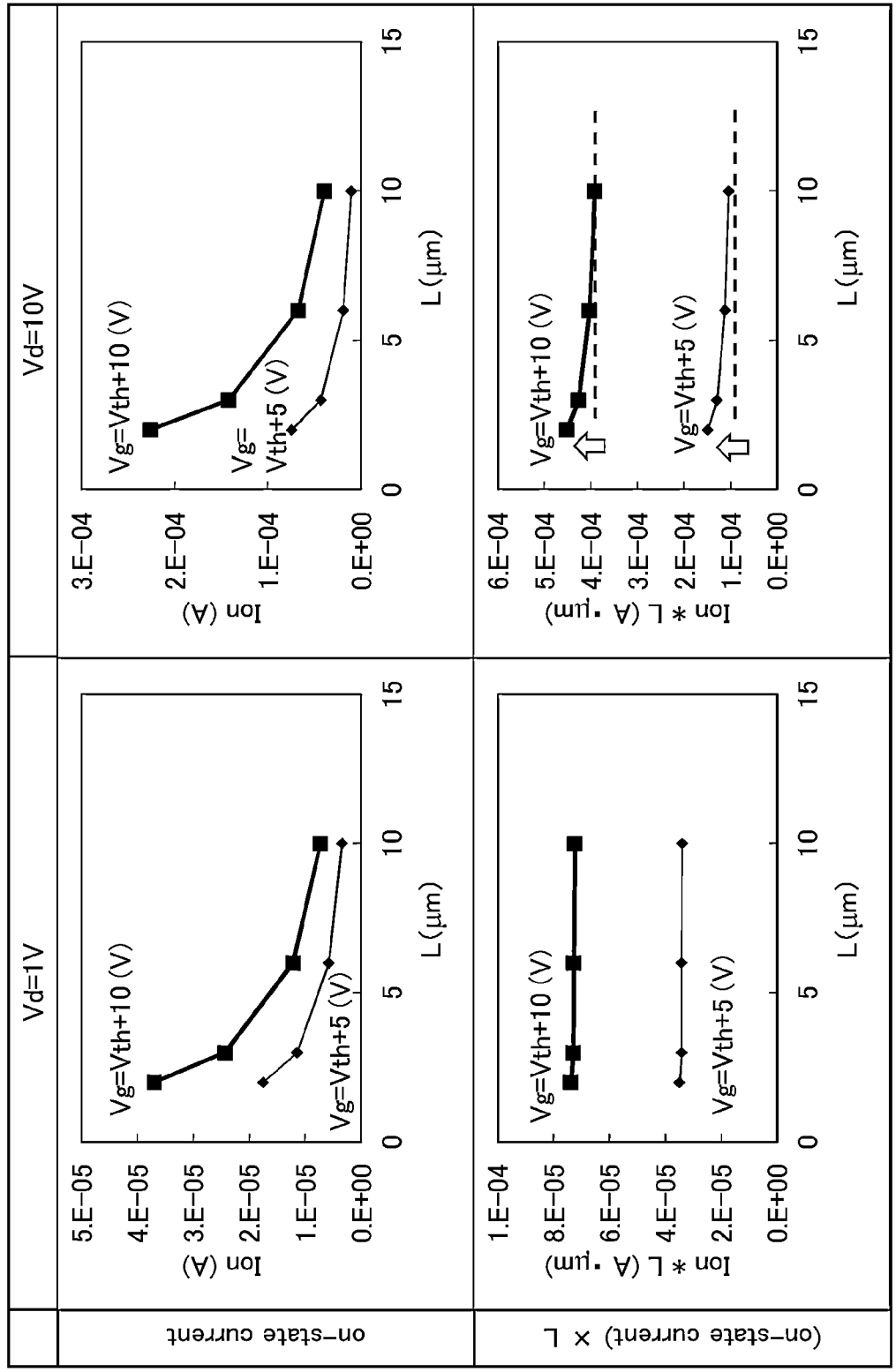
FIG. 32 shows the channel length dependence of on-state current obtained by calculation.

FIG. 32 shows on-state current versus channel length plots at gate voltages $V_g$ of $(V_{th}+5)$ V and $(V_{th}+10)$ V, which are obtained from the calculation result of the ideal model. In FIG. 32, the top plots each show on-state current and the bottom plots each show a value obtained by multiplying the on-state current by the channel length. Note that in FIG. 32, the left plots show the calculation results at a drain voltage $V_d$ of 1 V and the right plots show the calculation results at a drain voltage $V_d$ of 10 V.

In FIG. 32, the on-state current is inversely proportional to the channel length L. This is because the on-state current is inversely proportional to the channel length L.

When the on-state current is completely inversely proportional to the channel length, a value obtained by multiplying the on-state current by the channel length is constant regardless of the channel length. In FIG. 32, a value obtained by multiplying the on-state current by the channel length at a drain voltage $V_d$ of 1 V is substantially constant to the channel length L. In contrast, a value obtained by multiplying the on-state current by the channel length at a drain voltage $V_d$ of 10 V is increased as the channel length L becomes smaller. This suggests that in the case of a drain voltage $V_d$ of 10 V, an effective channel length which is described later is smaller than the channel length (a distance between the source electrode S and the drain electrode D) determined in FIG. 30.

<<Theory of Bulk Current>>

The reason why a peak of the saturation mobility is caused at low gate voltage in the transistor in the ideal condition is described below.

It is assumed that in the transistor illustrated in FIG. 30, the density of electrons in the oxide semiconductor film OS is constant in the thickness direction of the oxide semiconductor film OS and represented by a value $n_0(y)$; y represents a given position in the oxide semiconductor film OS in the channel length direction. Potential $\phi$ in the thickness direction of the oxide semiconductor film OS is represented by Formula 2, which is constant. Note that it is assumed that a gate voltage $V_g\_1$ of the gate electrode GE_1 and a gate voltage $V_g\_2$ of the gate electrode GE_2 are equal to each other, and a flat band voltage on the gate electrode GE_1 side and a flat band voltage on the gate electrode GE_2 side are collectively referred to as a flat band voltage $V_{FB}$.

[Formula 2]

$$\phi - V(y) = V_g - V_{FB} - V(y) \quad (2)$$

In this case, in an accumulation-type transistor including an oxide semiconductor film, a drain current $I_d$ can be approximated by only a bulk current $I_{bulk}$ as shown in Formula 3.

[Formula 3]

$$I_d \cong I_{bulk} = \frac{Wt}{L_{eff}} \mu k_B T [n_0(0) - n_0(L_{eff})] \quad (3)$$

Note that in Formula 3, t represents the thickness of the oxide semiconductor film, $\mu$ represents the electron mobility of the oxide semiconductor film, $k_B$ represents the Boltzmann's constant, T represents the absolute temperature, and $L_{eff}$ represents an effective channel length. The effective channel length refers to the distance between an n region which extends under the source electrode and an n region which extends under the drain electrode in the oxide semiconductor film. The effective channel length becomes smaller than the channel length particularly in the case where the channel length is small or the drain voltage is high.

Note that $n_0(0)$ represents the electron density of a source-electrode-side end portion of a region determined by the effective channel length, which can be represented by Formula 4. Further, $n_0(L_{eff})$ represents the electron density of a drain-electrode-side end portion of the region determined by the effective channel length, which can be represented by Formula 5. In Formulae 4 and 5, $N_D$ represents the donor density of the channel region in the oxide semiconductor film and q represents elementary charge.

[Formula 4]

$$n_0(0) = N_D e^{q\phi/k_BT} = N_D e^{q(V_g - V_{FB})/k_BT} \quad (4)$$

[Formula 5]

$$n_0(L_{eff}) = N_D e^{q(\phi - V_d)/k_BT} = N_D e^{q(V_g - V_{FB} - V_d)/k_BT} \quad (5)$$

When a saturation region satisfies $V_d > V_g - V_{th}$ and $V_g > V_{th}$, the drain voltage $V_d$ can be expressed by $V_g - V_{th}$; hence, Formula 3 is modified as Formula 6.

[Formula 6]

$$I_d = \frac{Wt}{L_{eff}} \mu k_B T N_D e^{-qV_{FB}/k_BT} \left( e^{qV_g/k_BT} - e^{qV_{th}/k_BT} \right) \quad (6)$$

Saturation mobility $\mu_{FE}^{sat}$ to the drain current $I_d$ obtained by Formula 6 is represented by Formula 7.

[Formula 7]

$$\mu_{FE}^{sat} \equiv \left( \frac{d\sqrt{I_d}}{dV_g} \right)^2 \frac{2L}{C_{GI}W} = \frac{Lt\mu q^2 N_D e^{-qV_{FB}/k_BT}}{2L_{eff} C_{GI} k_B T} \frac{e^{qV_g/k_BT}}{1 - e^{q(V_g - V_{th})/k_BT}} \quad (7)$$

In Formula 7, a denominator is 0 when $V_g$ is $V_{th}$, in which case the saturation mobility $\mu_{FE}^{sat}$ diverges to infinity. This is the cause of the peak of the saturation mobility at low gate voltage $V_g$, which is shown in FIGS. 31A and 31B. That is, the more the drain current is affected by the bulk current which flows inside the oxide semiconductor film OS, the clearer the peak is as shown in the saturation mobility observed in the case of a channel length of 2 μm in FIGS. 31A and 31B.

In addition, the saturation mobility is probably increased when the effective channel length $L_{eff}$ is smaller than the channel length L. In the oxide semiconductor film OS, when the n regions are formed in the vicinities of regions of the oxide semiconductor film OS each of which is in contact with the source electrode S or the drain electrode D, the effective channel length $L_{eff}$ becomes smaller than the channel length L, for example. This effect is apparent from the saturation mobility $\mu_{FE}^{sat}$ shown in Formula 7 that is proportional to $L/L_{eff}$.

<<Current Density in Oxide Semiconductor Film OS>>

The effect of the bulk current on saturation mobility is a phenomenon peculiar to a transistor including an oxide semiconductor film, which is an accumulation-type device. The effect of the bulk current is small in a transistor including a silicon film as a semiconductor film, which is an inversion-type device.

Figure 33A:
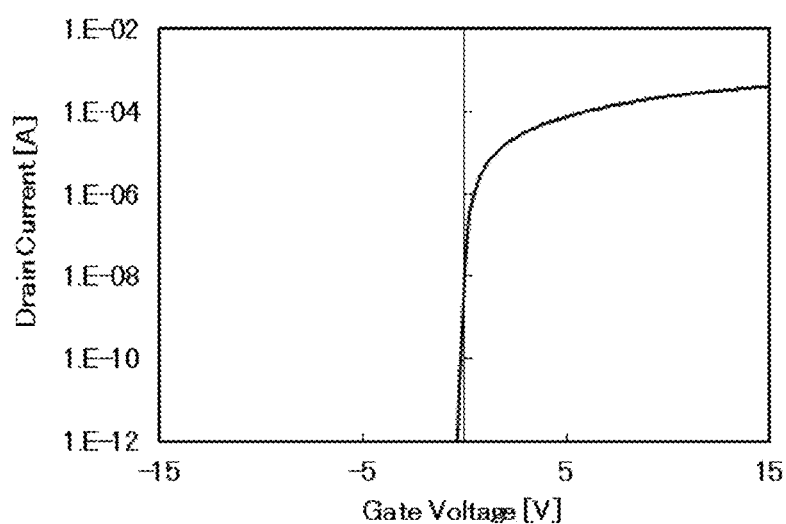
FIG. 33A shows $V_g$-$I_d$ characteristics obtained by calculation and FIGS. 33B and 33C show the current distribution in an oxide semiconductor film obtained by calculation.
Figure 33B:
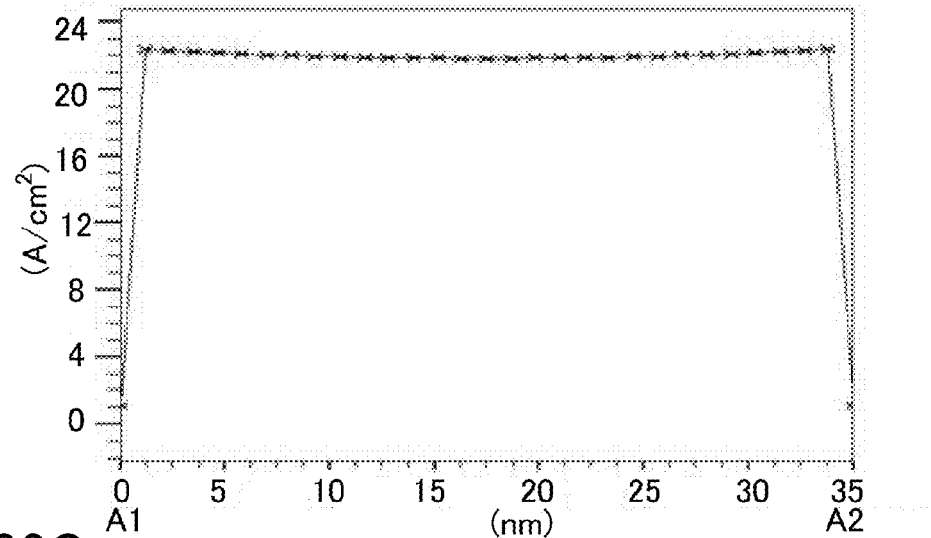
Figure 33C:
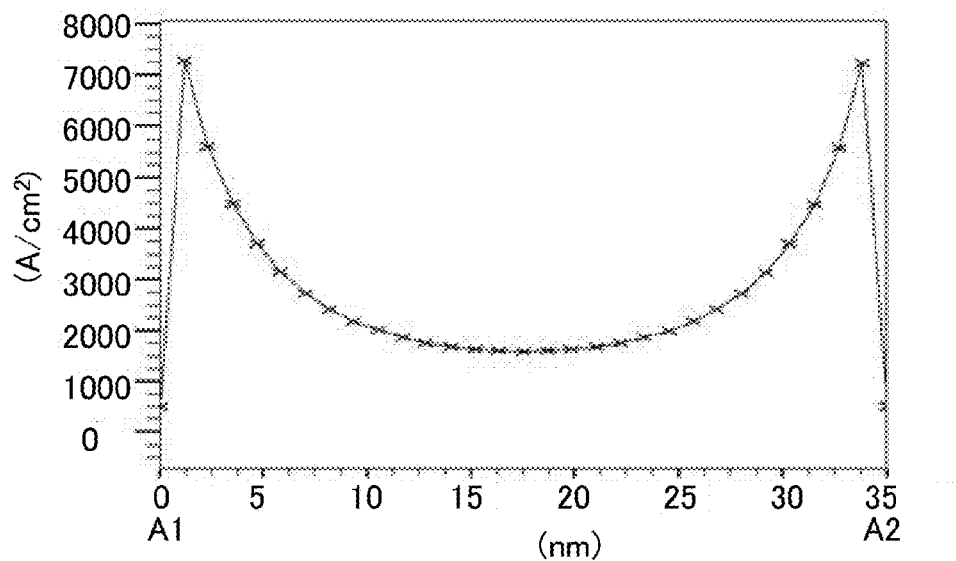

FIGS. 33B and 33C are plots of current density distributions obtained by device simulation. FIG. 33A illustrates $V_g - I_d$ characteristics obtained by calculation with a drain voltage of 10 V. FIGS. 33B and 33C each show a current density distribution in the oxide semiconductor film in a cross-sectional direction along A1-A2 in FIG. 30. FIG. 33B shows the current density distribution in a saturation region ($V_g$=0.5 V), and FIG. 33C shows the current density distribution in a linear region ($V_g$=15 V). Note that in the calculation, a transistor had a channel length L of 2 μm and a channel width W of 50 μm, and the drain voltage $V_d$ was 10 V.

FIG. 33B shows that the current density distribution in the oxide semiconductor film OS is almost uniform in the saturation region (at low gate voltage $V_g$). In contrast, FIG. 33C shows that current flowing in the vicinity of a surface of the oxide semiconductor film OS is dominant in the linear region (at high gate voltage $V_g$). Since the current density distribution is almost uniform in the oxide semiconductor film OS in the saturation region as shown in FIG. 33B, a cause of the peak in the saturation mobility is the bulk current.

Figure 34A:
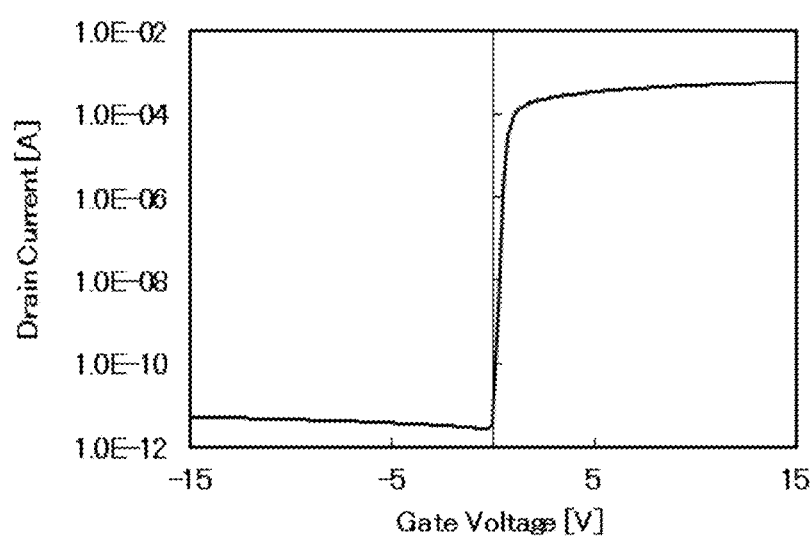
FIG. 34A shows $V_g$-$I_d$ characteristics obtained by calculation and FIGS. 34B and 34C show the current distribution in a silicon film obtained by calculation.
Figure 34B:
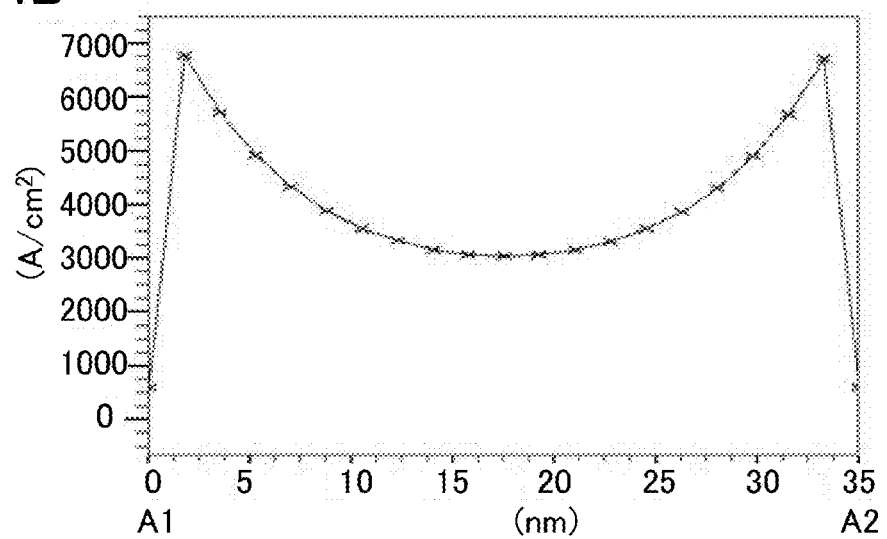
Figure 34C:
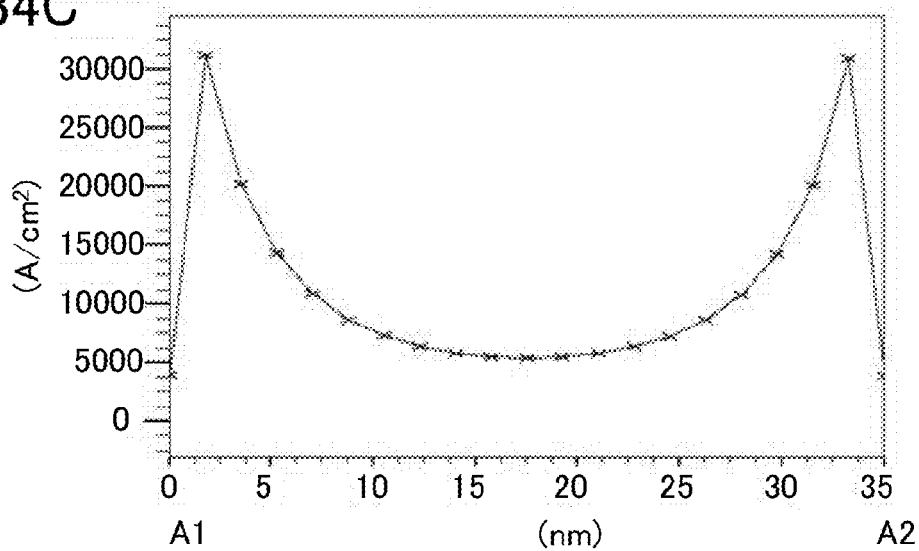

FIGS. 34B and 34C each show a current density distribution in a semiconductor film of an inversion-type device, which is obtained by device simulation. FIGS. 34A to 34C show the calculation results of a transistor obtained by replacing the oxide semiconductor film OS with a semiconductor film (silicon film) including an n-p-n junction in the transistor illustrated in FIG. 30. A channel region of the semiconductor film is assumed to have an acceptor impurity with a density of $1\times17/cm^3$.

FIG. 34A illustrates $V_g$–$I_d$ characteristics obtained by calculation with a drain voltage of 10 V. FIGS. 34B and 34C each show a current density distribution in the semiconductor film in a cross-sectional direction along A1-A2 in FIG. 30. FIG. 34B shows the current density distribution in a saturation region ($V_g$=0.5 V), and FIG. 34C shows the current density distribution in a linear region ($V_g$=15 V). Note that in the calculation, a transistor had a channel length L of 2 μm and a channel width W of 50 μm, and the drain voltage $V_d$ was 10 V.

Unlike in the transistor including the oxide semiconductor film that is an accumulation-type device, in the transistor including the semiconductor film that is an inversion-type device, current flowing through a surface of the semiconductor film is increased even at around the threshold voltage as shown in FIG. 34B. The effect of the bulk current in the inversion-type device is smaller than that in the accumulation-type device.

The above results show that in a transistor including an oxide semiconductor film that is an accumulation-type device in the ideal condition, the saturation mobility has a sharp peak due to the bulk current.

As the channel length L becomes smaller, the peak value of the saturation mobility due to the bulk current is increased. This is probably because the effective channel length $L_{eff}$ becomes smaller than the channel length L due to formation of the n regions in the vicinities of the regions of the oxide semiconductor film OS each of which is in contact with the source electrode S or the drain electrode D. Furthermore, it is probable that when the channel length L is small, the effective channel length $L_{eff}$ becomes smaller than the channel length L by a phenomenon (conduction band lowering effect: CBL effect) in which the conduction band minimum (Ec) of the oxide semiconductor film OS is reduced and the conduction band minimum gets closer to the Fermi energy because of the effect of the source electrode S and the drain electrode D. As shown in Formula 7, as the effective channel length $L_{eff}$ becomes small, the saturation mobility is increased in proportion to $L/L_{eff}$. This effect becomes significant as the channel length L becomes small; therefore, it is probable that the saturation mobility is increased as the channel length L becomes small.

<<Model Assuming Shallow Electron Trap Level>>

Next, to approximate the saturation mobility of the transistor in the ideal condition to that of an actual transistor, calculation was performed on the assumption that there is an acceptor level that is negatively charged when trapping an electron, i.e., a shallow electron trap level, at the interface between the gate insulating film GI_1 and the oxide semiconductor film OS in the transistor with the ideal model. Calculation results are shown in FIGS. 35A to 35C.

Figure 35A:
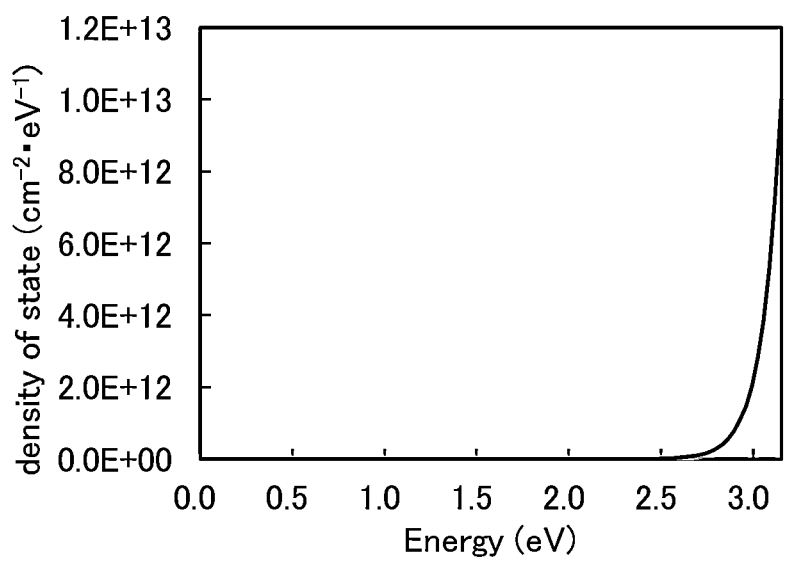
FIG. 35A shows an electron trap used for calculation and FIGS. 35B and 35C each show the channel length dependence of saturation mobility obtained by calculation.

FIG. 35A shows density of state (DOS) of the electron trap level which is assumed to be at the interface between the gate insulating film GI_1 and the oxide semiconductor film OS.

Next, the saturation mobilities of a dual-gate transistor and a single-gate transistor were calculated. FIG. 35B shows the calculation result of the dual-gate transistor, and FIG. 35C shows the calculation result of the single-gate transistor.

Figure 35B:
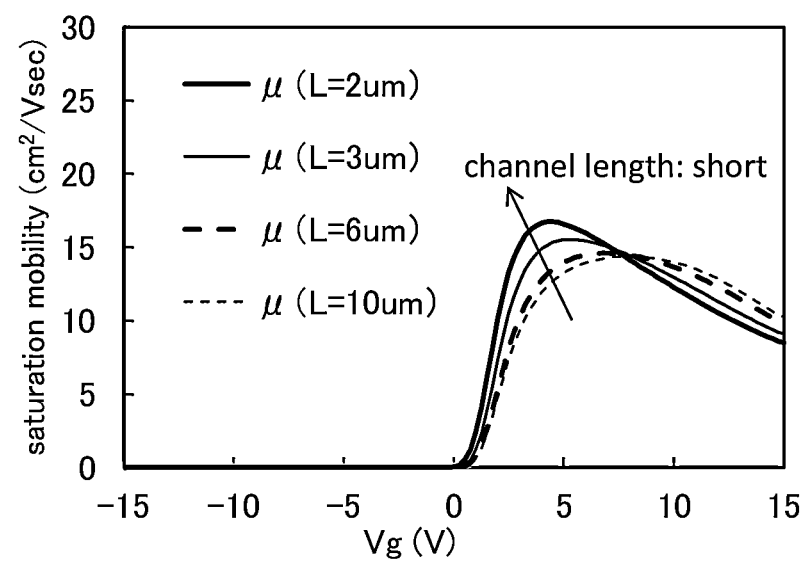
Figure 35C:
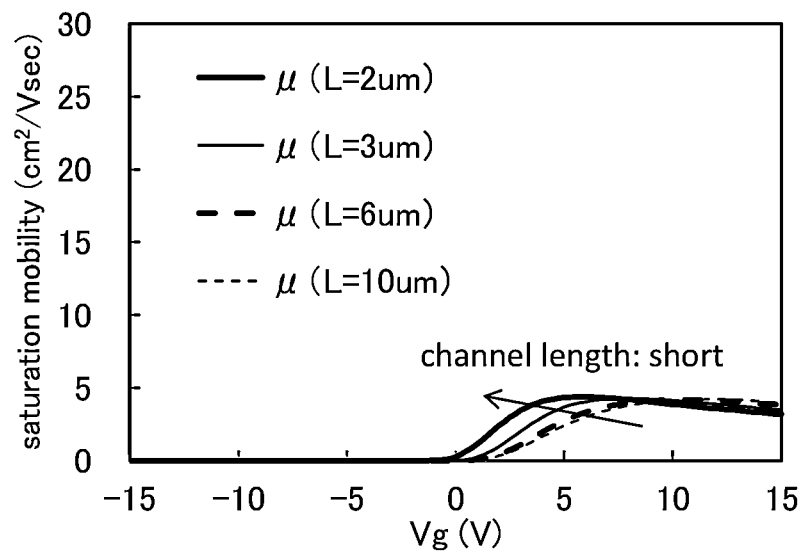

As shown in FIGS. 35B and 35C, unlike in the saturation mobility of the transistor in the ideal condition, a sharp peak is not observed in the saturation mobilities of the dual-gate transistor and the single-gate transistor. In FIG. 35C, the peak values of the saturation mobilities are each around 5 $cm^2$/V·sec, which shows that the saturation mobility of the transistor in the single-gate driving does not depend too much on the channel length L. In contrast, the peak values of the saturation mobilities of the dual-gate transistor are each greater than or equal to 15 $cm^2$/V·sec and a little less than 20 $cm^2$/V·sec, and are increased as the channel length L becomes small. These results are similar to those in Example described later.

Consequently, it is found that the saturation mobility is increased as the channel length L becomes small in a dual-gate transistor.

<Structure Example of Semiconductor Display Device>

Next, a structure example of a semiconductor display device of one embodiment of the present invention is described.

Figure 6A:
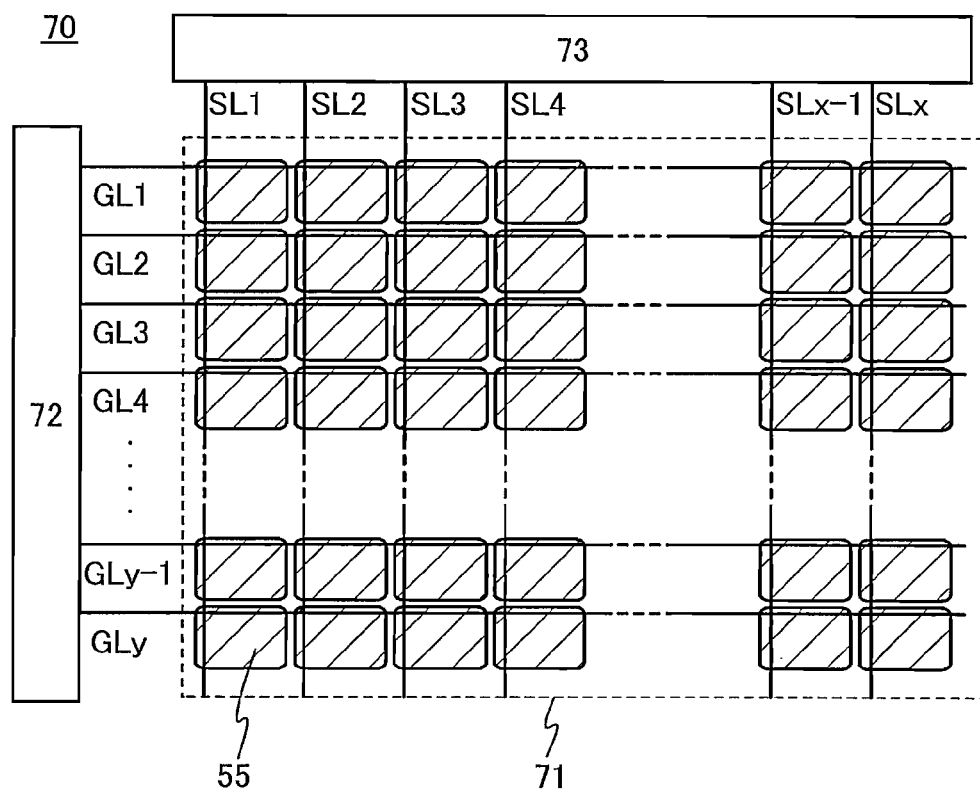
FIGS. 6A to 6C are diagrams illustrating a structure and configurations of a semiconductor display device.

In a semiconductor display device 70 illustrated in FIG. 6A, a pixel portion 71 includes a plurality of pixels 55, wirings GL (wirings GL1 to GLy, y: a natural number) for selecting the pixels 55 in each row, and wirings SL (wirings SL1 to SLx, x: a natural number) for supplying image signals to the selected pixels 55. The input of signals to the wirings GL is controlled by a driver circuit 72. The input of image signals to the wirings SL is controlled by a driver circuit 73. Each of the plurality of pixels 55 is connected to at least one of the wirings GL and at least one of the wirings SL.

Note that the kinds and number of the wirings in the pixel portion 71 can be determined by the structure, number, and position of the pixels 55. Specifically, in the pixel portion 71 illustrated in FIG. 6A, the pixels 55 are arranged in a matrix of x columns and y rows, and the wirings SL1 to SLx and the wirings GL1 to GLy are provided in the pixel portion 71.

Although FIG. 6A illustrates the case where the driver circuits 72 and 73 and the pixel portion 71 are formed over one substrate, the driver circuits 72 and 73 may be formed over a substrate different from a substrate over which the pixel portion 71 is formed.

Figure 6B:
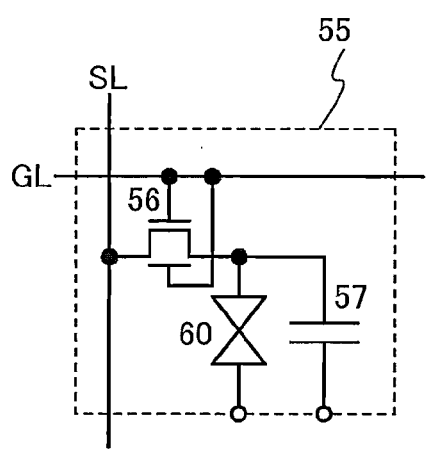

FIG. 6B illustrates an example of a configuration of the pixel 55. Each of the pixels 55 includes a liquid crystal element 60, a transistor 56 that controls the supply of an image signal to the liquid crystal element 60, and a capacitor 57 that holds voltage between a pixel electrode and a common electrode of the liquid crystal element 60. The liquid crystal element 60 includes the pixel electrode, the common electrode, and a liquid crystal layer containing a liquid crystal material to which voltage between the pixel electrode and the common electrode is applied.

The transistor 56 controls whether to supply the potential of the wiring SL to the pixel electrode of the liquid crystal element 60. A predetermined potential is applied to the common electrode of the liquid crystal element 60.

The connection state between the transistor 56 and the liquid crystal element 60 is specifically described below. In FIG. 6B, a gate of the transistor 56 is connected to any one of the wirings GL1 to GLy. One of a source and a drain of the transistor 56 is connected to any one of the wirings SL1 to SLx, and the other is connected to the pixel electrode of the liquid crystal element 60.

The transmittance of the liquid crystal element 60 changes when the alignment of liquid crystal molecules included in the liquid crystal layer changes in accordance with the level of voltage applied between the pixel electrode and the common electrode. Accordingly, when the transmittance of the liquid crystal element 60 is controlled by the potential of an image signal supplied to the pixel electrode, gray-scale images can be displayed. In each of the plurality of pixels 55 included in the pixel portion 71, the gray level of the liquid crystal element 60 is adjusted in response to an image signal containing image data; thus, an image is displayed on the pixel portion 71.

FIG. 6B illustrates an example in which the one transistor 56 is used as a switch for controlling the input of an image signal to the pixel 55. However, a plurality of transistors functioning as one switch may be used in the pixel 55.

In one embodiment of the present invention, the transistor 56 with extremely low off-state current is preferably used as the switch for controlling the input of an image signal to the pixel 55. With the transistor 56 having extremely low off-state current, leakage of charge through the transistor 56 can be prevented. Thus, the potential of an image signal that is applied to the liquid crystal element 60 and the capacitor 57 can be held more reliably. Accordingly, changes in transmittance of the liquid crystal element 60 due to leakage of charge in one frame period are prevented, so that the quality of an image to be displayed can be improved. Since leakage of charge through the transistor 56 can be prevented when the transistor 56 has low off-state current, the supply of a power supply potential or a signal to the driver circuit 72 and the driver circuit 73 may be stopped in a period during which a still image is displayed. With the above configuration, the number of times of writing image signals to the pixel portion 71 can be reduced, and thus power consumption of the semiconductor display device can be reduced.

A transistor including a semiconductor film containing an oxide semiconductor has extremely low off-state current, and therefore is suitable for the transistor 56, for example.

In addition, FIG. 6B illustrates the case where the transistor 56 includes a pair of gate electrodes overlapping with each other with a semiconductor film provided therebetween. The pair of gate electrodes is electrically connected to each other. In one embodiment of the present invention, the above structure allows the on-state current and the reliability of the transistor 56 to be increased.

Figure 6C:
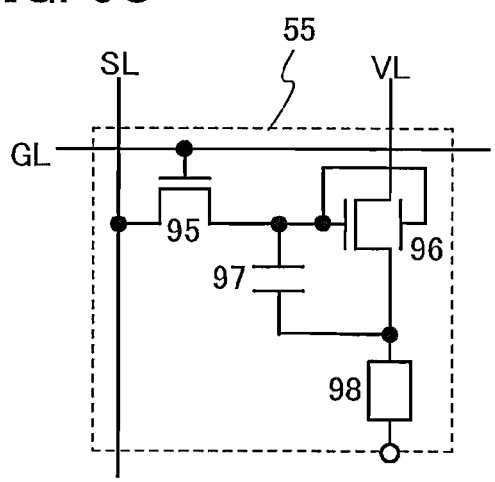

Next, FIG. 6C illustrates another example of the pixel 55. The pixel 55 includes a transistor 95 controlling input of an image signal to the pixel 55, a light-emitting element 98, a transistor 96 controlling the value of current supplied to the light-emitting element 98 in response to an image signal, and a capacitor 97 for holding the potential of an image signal.

Examples of the light-emitting element 98 include an element whose luminance is controlled by current or voltage, such as a light-emitting diode (LED) or an organic light-emitting diode (OLED). For example, an OLED includes at least an EL layer, an anode, and a cathode. The EL layer is formed using a single layer or a plurality of layers between the anode and the cathode, at least one of which is a light-emitting layer containing a light-emitting substance.

From the EL layer, electroluminescence is obtained by current supplied when a potential difference between the cathode and the anode is higher than or equal to the threshold voltage of the light-emitting element 98. As electroluminescence, there are luminescence (fluorescence) at the time of returning from a singlet-excited state to a ground state and luminescence (phosphorescence) at the time of returning from a triplet-excited state to a ground state.

The potential of one of the anode and the cathode of the light-emitting element 98 is controlled in response to an image signal input to the pixel 55. The one of the anode and the cathode whose potential is controlled in response to an image signal is used as a pixel electrode, and the other is used as a common electrode. A predetermined potential is applied to the common electrode of the light-emitting element 98, and the luminance of the light-emitting element 98 is determined by a potential difference between the pixel electrode and the common electrode. Thus, the luminance of the light-emitting element 98 is controlled by the potential of the image signal, so that the light-emitting element 98 can express gray level. In each of the plurality of pixels 55 included in the pixel portion, the gray level of the light-emitting element 98 is adjusted in response to an image signal containing image data; thus, an image is displayed on the pixel portion 71.

Next, connection between the transistor 95, the transistor 96, the capacitor 97, and the light-emitting element 98 which are included in the pixel 55 is described.

One of a source and a drain of the transistor 95 is connected to the wiring SL, and the other is connected to a gate of the transistor 96. A gate of the transistor 95 is connected to the wiring GL. One of a source and a drain of the transistor 96 is connected to a power supply line VL, and the other is connected to the light-emitting element 98. Specifically, the other of the source and the drain of the transistor 96 is connected to any one of the anode and the cathode of the light-emitting element 98. A predetermined potential is applied to the other of the anode and the cathode of the light-emitting element 98.

In addition, FIG. 6C illustrates the case where the transistor 96 includes a pair of gate electrodes overlapping with each other with a semiconductor film provided therebetween. The pair of gate electrodes is electrically connected to each other. In one embodiment of the present invention, the above structure allows the on-state current and the reliability of the transistor 96 to be increased.

<Structure of Pixel>

Figure 4:
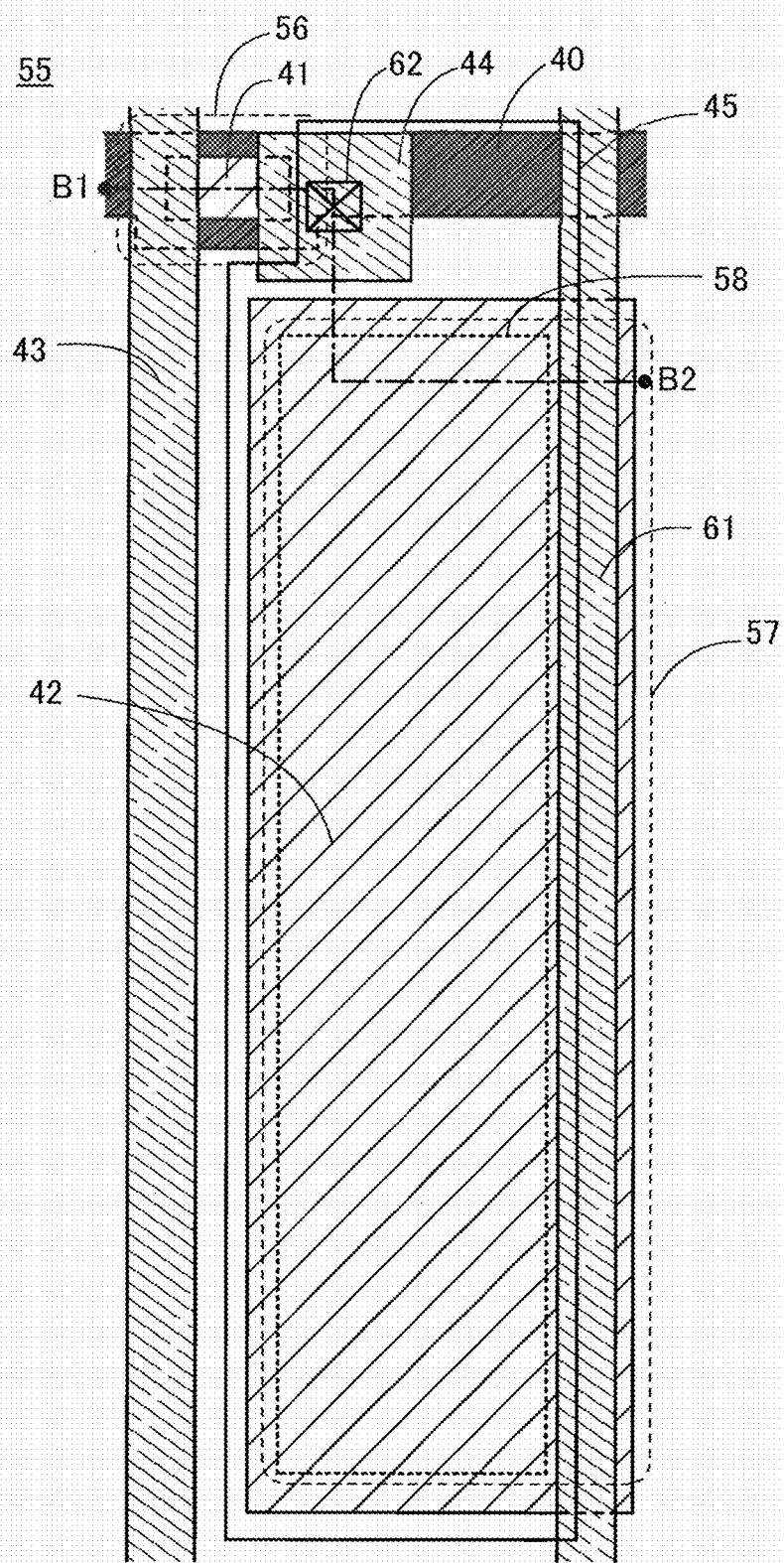
FIG. 4 is a top view of a pixel.
Figure 5:
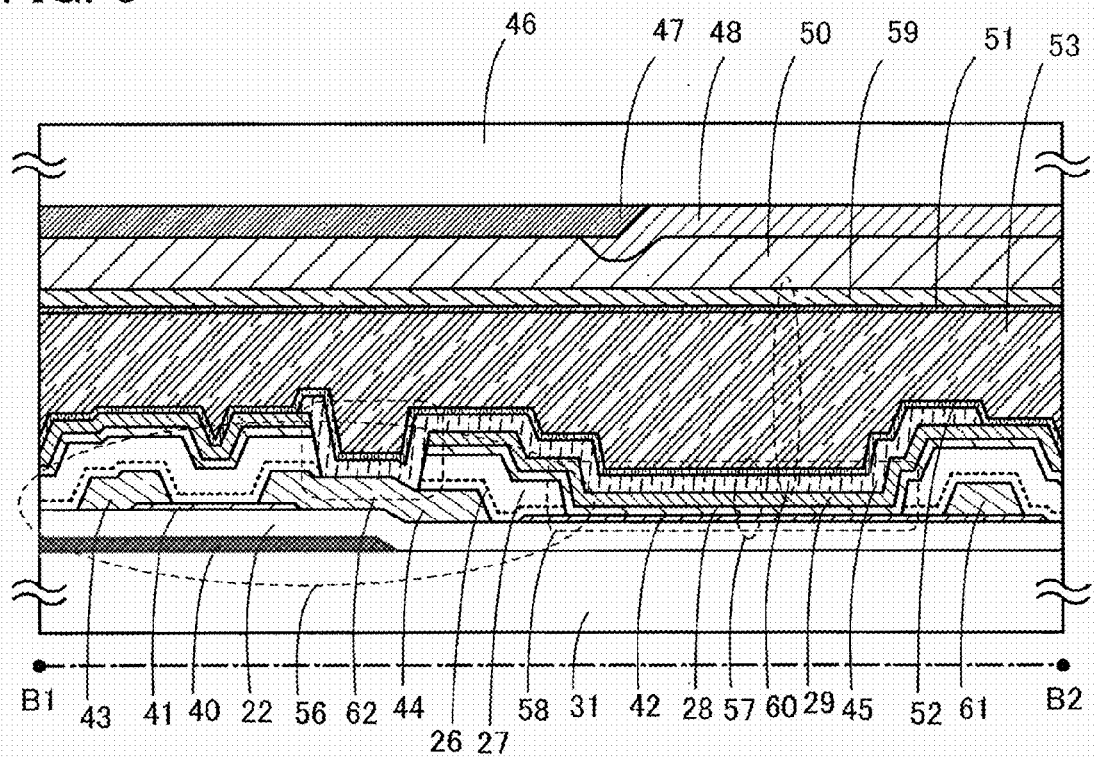
FIG. 5 is a cross-sectional view of a pixel.

Next, description is given of a structure example of the pixel 55 in a liquid crystal display device which is an example of the semiconductor display device 70 illustrated in FIG. 6A. FIG. 4 illustrates, as an example, a top view of the pixel 55 formed over the substrate 31 together with the transistor 20 in FIGS. 2A to 2C. The insulating films are not illustrated in FIG. 4 in order to clarify the layout of the pixel 55. FIG. 5 is a cross-sectional view of the liquid crystal display device using an element substrate including the pixel 55 illustrated in FIG. 4. In the liquid crystal display device in FIG. 5, the element substrate including the substrate 31 corresponds to a cross-sectional view along the dashed line B1-B2 in FIG. 4.

The pixel 55 illustrated in FIG. 4 and FIG. 5 includes the transistor 56 and the capacitor 57. In FIG. 5, the pixel 55 includes the liquid crystal element 60.

Over the substrate 31 having an insulating surface, the transistor 56 includes a conductive film 40 serving as a gate electrode, the insulating film 22 that is over the conductive film 40 and serves as a gate insulating film, an oxide semiconductor film 41 that is over the insulating film 22 and overlaps with the conductive film 40, and a conductive film 43 and a conductive film 44 that are electrically connected to the oxide semiconductor film 41 and serve as a source electrode and a drain electrode. The conductive film 40 serves as the wiring GL illustrated in FIG. 6B. The conductive film 43 serves as the wiring SL illustrated in FIG. 6B.

The pixel 55 includes a metal oxide film 42 over the insulating film 22. The metal oxide film 42 is a conductive film that transmits visible light. A conductive film 61 electrically connected to the metal oxide film 42 is provided over the metal oxide film 42. The conductive film 61 serves as a wiring that supplies a predetermined potential to the metal oxide film 42.

In FIG. 5, the insulating film 26 and the insulating film 27 are stacked in this order provided over the oxide semiconductor film 41, the conductive film 43, the conductive film 44, the metal oxide film 42, and the conductive film 61. The transistor 56 may include the insulating films 26 and 27. Although the insulating films 26 and 27 are stacked in this order in FIG. 5, an insulating film or a stack of three or more insulating films may be used instead of the insulating films 26 and 27.

An opening 58 is provided in the insulating films 26 and 27 to overlap with the metal oxide film 42. The opening 58 is provided in a region overlapping with the metal oxide film 42, and the oxide semiconductor film 41, the conductive film 43, and the conductive film 44 are not provided in the region.

In FIG. 5, the nitride insulating film 28 and the insulating film 29 are stacked in this order over the insulating film 26 and the insulating film 27 and over the metal oxide film 42 in the opening 58.

Note that by forming an oxide semiconductor film over the insulating film 22 and forming the nitride insulating film 28 to be in contact with the oxide semiconductor film, the conductivity of the oxide semiconductor film can be increased. In that case, the oxide semiconductor film with high conductivity can be used as the metal oxide film 42. The conductivity of the oxide semiconductor film is increased probably because oxygen vacancies are formed in the oxide semiconductor film at the time of forming the opening 58 or the nitride insulating film 28, and hydrogen diffused from the nitride insulating film 28 is bonded to the oxygen vacancies to form a donor. Specifically, the resistivity of the metal oxide film 42 is higher than or equal to $1\times10^{-3}$ Ω·cm and lower than $1\times10^{4}$ Ω·cm, preferably higher than or equal to $1\times10^{-3}$ Ω·cm and lower than $1\times10^{-1}$ Ω·cm.

It is preferable that the metal oxide film 42 have a higher hydrogen concentration than the oxide semiconductor film 41. In the metal oxide film 42, the hydrogen concentration measured by secondary ion mass spectrometry (SIMS) is greater than or equal to $8\times10^{19}$ atoms/cm$^3$, preferably greater than or equal to $1\times10^{20}$ atoms/cm$^3$, more preferably greater than or equal to $5\times10^{20}$ atoms/cm$^3$. In the oxide semiconductor film 41, the hydrogen concentration measured by SIMS is less than $5\times10^{19}$ atoms/cm$^3$, preferably less than $5\times10^{18}$ atoms/cm$^3$, further preferably less than or equal to $1\times10^{18}$ atoms/cm$^3$, still further preferably less than or equal to $5\times10^{17}$ atoms/cm$^3$, still further preferably less than or equal to $1\times10^{16}$ atoms/cm$^3$.

For the nitride insulating film 28, silicon nitride, silicon nitride oxide, aluminum nitride, or aluminum nitride oxide can be used, for example. In comparison with an oxide insulating film such as a silicon oxide film and an aluminum oxide film, the nitride insulating film 28 containing any of the above materials can further prevent impurities from outside, such as water, alkali metal, and alkaline-earth metal, from being diffused into the oxide semiconductor film 41.

Furthermore, an opening 62 is provided in the nitride insulating film 28 and the insulating film 29 to overlap with the conductive film 44. A conductive film 45 that transmits visible light and serves as a pixel electrode is provided over the nitride insulating film 28 and the insulating film 29. The conductive film 45 is electrically connected to the conductive film 44 in the opening 62. The conductive film 45 overlaps with the metal oxide film 42 in the opening 58. A portion where the conductive film 45 and the metal oxide film 42 overlap with each other with the nitride insulating film 28 and the insulating film 29 sandwiched therebetween serves as the capacitor 57.

In the capacitor 57, the metal oxide film 42 and the conductive film 45 serving as a pair of electrodes and the nitride insulating film 28 and the insulating film 29 collectively serving as a dielectric film transmit visible light. This means that the capacitor 57 transmits visible light. Thus, the aperture ratio of the pixel 55 can be higher than that of a pixel including a capacitor having a property of transmitting less visible light. Therefore, the required capacitance for high image quality can be secured and the aperture ratio of the pixel can be increased; thus, light loss can be reduced in a panel and power consumption of a semiconductor device can be reduced.

Note that as described above, the insulating film 29 is not necessarily provided. However, with the use of the insulating film 29 using an insulator, which has a dielectric constant lower than that of the nitride insulating film 28, as a dielectric film together with the nitride insulating film 28, the dielectric constant of the dielectric film of the capacitor 57 can be adjusted to a desired value without increasing the thickness of the nitride insulating film 28.

An alignment film 52 is provided over the conductive film 45.

A substrate 46 is provided to face the substrate 31. A shielding film 47 blocking visible light and a coloring layer 48 transmitting visible light in a specific wavelength range are provided on the substrate 46. A resin film 50 is provided on the shielding film 47 and the coloring layer 48, and a conductive film 59 serving as a common electrode is provided on the resin film 50. An alignment film 51 is provided on the conductive film 59.

Between the substrate 31 and the substrate 46, a liquid crystal layer 53 containing a liquid crystal material is sandwiched between the alignment film 52 and the alignment film 51. The liquid crystal element 60 includes the conductive film 45, the conductive film 59, and the liquid crystal layer 53.

Although a twisted nematic (TN) mode is used as a method for driving the liquid crystal in FIG. 4 and FIG. 5, the following can be used as a method for driving the liquid crystal: a fringe field switching (FFS) mode, a super twisted nematic (STN) mode, a vertical alignment (VA) mode, a multi-domain vertical alignment (MVA) mode, an in-plane-switching (IPS) mode, an optically compensated birefringence (OCB) mode, a blue phase mode, a transverse bend alignment (TBA) mode, a VA-IPS mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, an advanced super view (ASV) mode, and the like.

In the liquid crystal display device of one embodiment of the present invention, the liquid crystal layer can be formed using, for example, a liquid crystal material classified into a thermotropic liquid crystal or a lyotropic liquid crystal. As another example of a liquid crystal material used for the liquid crystal layer, the following can be given: a nematic liquid crystal, a smectic liquid crystal, a cholesteric liquid crystal, or a discotic liquid crystal. Further alternatively, a liquid crystal material categorized by a ferroelectric liquid crystal or an anti-ferroelectric liquid crystal can be used. Further alternatively, a liquid crystal material categorized by a high-molecular liquid crystal such as a main-chain high-molecular liquid crystal, a side-chain high-molecular liquid crystal, or a composite-type high-molecular liquid crystal, or a low-molecular liquid crystal can be used. Further alternatively, a liquid crystal material categorized by a polymer dispersed liquid crystal (PDLC) can be used.

Alternatively, liquid crystal exhibiting a blue phase for which an alignment film is unnecessary may be used for the liquid crystal layer. A blue phase is one of liquid crystal phases, which is generated just before a cholesteric phase changes into an isotropic phase while temperature of cholesteric liquid crystal is increased. Since the blue phase is only generated within a narrow range of temperature, a chiral material or an ultraviolet curable resin is added so that the temperature range is improved. The liquid crystal composition which includes a liquid crystal exhibiting a blue phase and a chiral material is preferable because it has a small response time of less than or equal to 1 msec, has optical isotropy, which makes the alignment process unneeded, and has a small viewing angle dependence.

Although a liquid crystal display device using a color filter to display a color image is illustrated in FIG. 5 as an example, the liquid crystal display device of one embodiment of the present invention may display a color image by sequentially lighting a plurality of light sources having different hues.

<Configuration Example 2 of Sequential Circuit>

Next, a configuration example of the sequential circuit of one embodiment of the present invention different from that in FIGS. 1A and 1B is described.

Figure 7A:
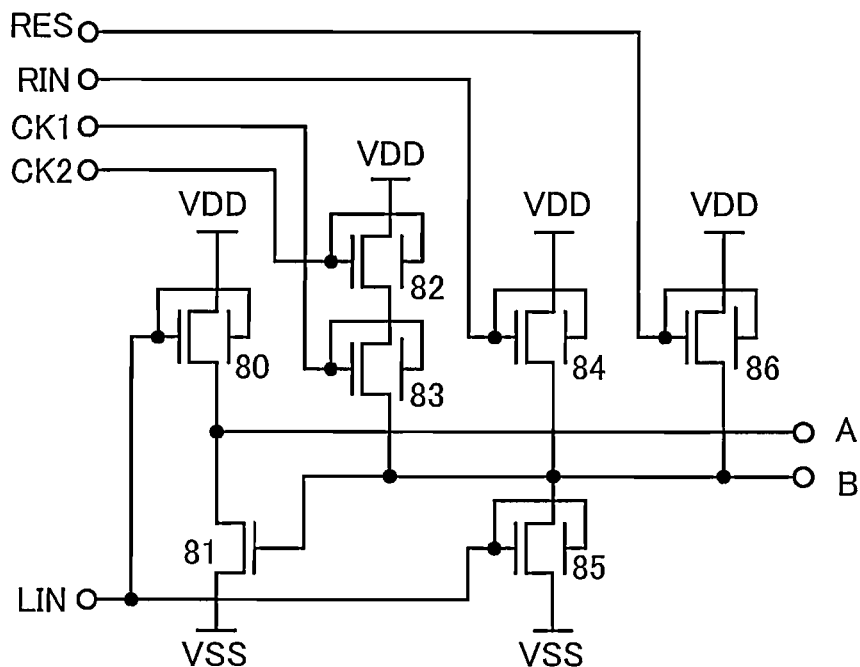
FIGS. 7A and 7B illustrate configurations of a sequential circuit.

FIG. 7A illustrates a configuration example of the sequential circuit 10 of one embodiment of the present invention. The sequential circuit 10 in FIG. 7A includes a transistor 80, a transistor 81, a transistor 82, a transistor 83, a transistor 84, a transistor 85, and a transistor 86. A signal RES, the signal LIN, the signal RIN, a signal CK1, and a signal CK2 are input to the sequential circuit 10. In addition, the high-level potential VDD and the low-level potential VSS are applied to the sequential circuit 10. The on/off states of the transistors 80 to 86 are each determined by the potentials of the signals, whereby a signal including the potential VSS or the potential VDD is output from an output terminal A and an output terminal B included in the sequential circuit 10.

Specifically, a gate of the transistor 80 is connected to a wiring to which the signal LIN is input. One of a source and a drain of the transistor 80 is connected to the output terminal A, and the other is connected to a wiring to which the potential VDD is applied. A gate of the transistor 81 is connected to the output terminal B. One of a source and a drain of the transistor 81 is connected to a wiring to which the potential VSS is applied, and the other is connected to the output terminal A. A gate of the transistor 82 is connected to a wiring to which the signal CK2 is input. One of a source and a drain of the transistor 82 is connected to one of a source and a drain of the transistor 83, and the other is connected to the wiring to which the potential VDD is applied. A gate of the transistor 83 is connected to a wiring to which the signal CK1 is input. The one of the source and the drain of the transistor 83 is connected to the one of the source and the drain of the transistor 82, and the other is connected to the output terminal B. A gate of the transistor 84 is connected to a wiring to which the signal RIN is input. One of a source and a drain of the transistor 84 is connected to the output terminal B, and the other is connected to the wiring to which the potential VDD is applied. A gate of the transistor 85 is connected to the wiring to which the signal LIN is input. One of a source and a drain of the transistor 85 is connected to the wiring to which the potential VSS is applied, and the other is connected to the output terminal B. A gate of the transistor 86 is connected to a wiring to which the signal RES is input. One of a source and a drain of the transistor 86 is connected to the output terminal B, and the other is connected to the wiring to which the potential VDD is applied.

Note that the output terminal A included in the sequential circuit 10 in FIG. 7A corresponds to the output terminal OUT illustrated in FIG. 1A. The transistor 80 serves as the transistor 12 in FIG. 1A. The transistor 81 serves as the transistor 13 in FIG. 1A. The transistors 82 to 86 serve as the circuit 11 in FIG. 1A.

In one embodiment of the present invention, at least any one of the transistors 80, 82, 83, 84, 85, and 86 includes a pair of gate electrodes that are electrically connected to each other and overlap with each other with a semiconductor film provided therebetween. FIG. 7A illustrates the case where all of the transistors 80, 82, 83, 84, 85, and 86 include the above-described pair of gate electrodes. By providing the pair of gate electrodes electrically connected to each other in one or all of the transistors, even when a positive fixed charge is generated in the vicinity of the surface of the element substrate, a negative charge can be prevented from being generated in the vicinity of the surface of the semiconductor film due to the fixed charge, resulting in suppression of a shift in the threshold voltage of the transistors in a negative direction. Thus, the reliability of the sequential circuit 10 can be increased, leading to an increase in the reliability of a semiconductor device using the sequential circuit 10.

In the case where the pair of gate electrodes is electrically connected to each other, the same potential is applied to the pair of gate electrodes, which is different from the case where a constant potential is applied to one of the pair of gate electrodes. Thus, a channel formation region is increased, which makes is possible to increase drain current of the transistors. Consequently, a decrease in on-state current can be suppressed and the transistors can be reduced in size; thus, the area of the sequential circuit 10 can be reduced, resulting in a reduction in the area of a driver circuit using the sequential circuit 10.

Furthermore, with the pair of gate electrodes electrically connected to each other, a depletion layer is easily formed in the semiconductor film, which makes it possible to improve the subthreshold values (S values) of the transistors.

Figure 8:
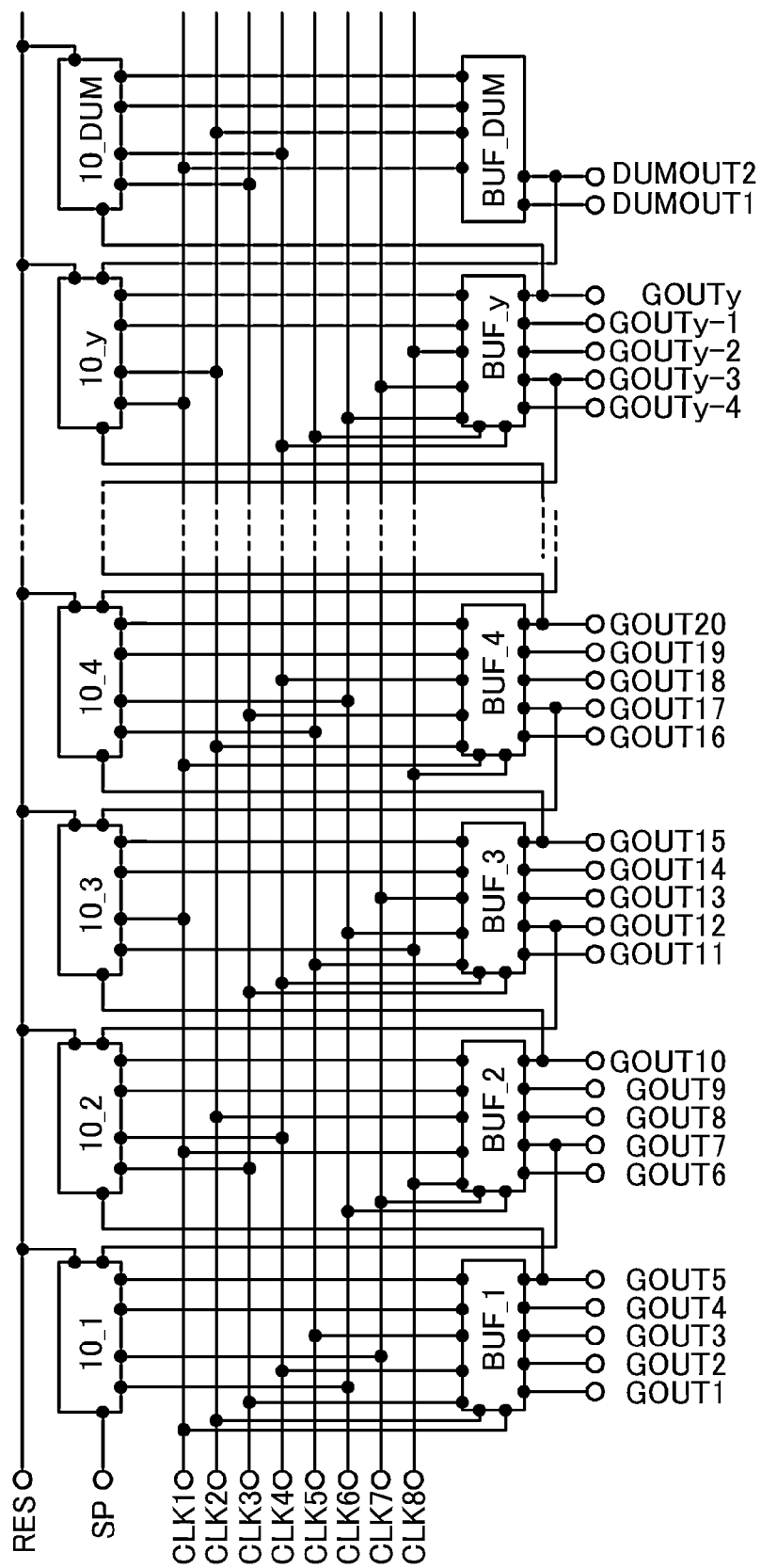
FIG. 8 illustrates a configuration of a shift register.

FIG. 8 illustrates an example of a shift register in which a plurality of sequential circuits 10 illustrated in FIG. 7A are connected in series.

The shift register illustrated in FIG. 8 includes sequential circuits 10_1 to 10_y. Each of the sequential circuits 10_1 to 10_y has the same configuration as the sequential circuit 10 illustrated in FIG. 7A. Note that in the sequential circuits 10_1 to 10_y in FIG. 8, any two of signals CLK1 to CLK8 are used as the signal CK1 and the signal CK2. The shift register in FIG. 8 further includes a plurality of buffers BUF (buffers BUF_1 to BUF_y). Output signals from the sequential circuits 10_1 to 10_y are input to the buffers BUF_1 to BUF_y, respectively. The shift register in FIG. 8 further includes a sequential circuit 10_DUM and a buffer BUF_DUM which are used as a dummy sequential circuit and the dummy buffer, respectively. An output signal from the sequential circuit 10_DUM is input to the buffer BUF_DUM.

Specifically, in the sequential circuit 10_8 m+1, the signal CLK6 and the signal CLK7 are used as the signal CK1 and the signal CK2, respectively. In the sequential circuit 10_8 m+2, the signal CLK3 and the signal CLK4 are used as the signal CK1 and the signal CK2, respectively. In the sequential circuit 10_8 m+3, the signal CLK8 and the signal CLK1 are used as the signal CK1 and the signal CK2, respectively. In the sequential circuit 10_8 m+4, the signal CLK5 and the signal CLK6 are used as the signal CK1 and the signal CK2, respectively. In the sequential circuit 10_8 m+5, the signal CLK2 and the signal CLK3 are used as the signal CK1 and the signal CK2, respectively. In the sequential circuit 10_8 m+6, the signal CLK7 and the signal CLK8 are used as the signal CK1 and the signal CK2, respectively. In the sequential circuit 10_8 m+7, the signal CLK4 and the signal CLK5 are used as the signal CK1 and the signal CK2, respectively. In the sequential circuit 10_8m, the signal CLK1 and the signal CLK2 are used as the signal CK1 and the signal CK2, respectively. Note that 8m to 8m+7 are natural numbers that meet the condition that the total number of the sequential circuits 10 is y.

In the sequential circuit 10_DUM, signals used as the signal CK1 and the signal CK2 depend on the number of the stage of the sequential circuit 10 in the previous stage. For example, when there is the sequential circuit 10_8m+1 in the previous stage, the signal CLK3 and the signal CLK4 are used as the signal CK1 and the signal CK2, respectively in the sequential circuit 10_DUM. When there is the sequential circuit 10_8m+2 in the previous stage, the signal CLK8 and the signal CLK1 are used as the signal CK1 and the signal CK2, respectively in the sequential circuit 10_DUM. When there is the sequential circuit 10_8m+3 in the previous stage, the signal CLK5 and the signal CLK6 are used as the signal CK1 and the signal CK2, respectively in the sequential circuit 10_DUM. When there is the sequential circuit 10_8m+4 in the previous stage, the signal CLK2 and the signal CLK3 are used as the signal CK1 and the signal CK2, respectively in the sequential circuit 10_DUM. When there is the sequential circuit 10_8m+5 in the previous stage, the signal CLK7 and the signal CLK8 are used as the signal CK1 and the signal CK2, respectively in the sequential circuit 10_DUM. When there is the sequential circuit 10_8m+6 in the previous stage, the signal CLK4 and the signal CLK5 are used as the signal CK1 and the signal CK2, respectively in the sequential circuit 10_DUM. When there is the sequential circuit 10_8m+7 in the previous stage, the signal CLK1 and the signal CLK2 are used as the signal CK1 and the signal CK2, respectively in the sequential circuit 10_DUM. When there is the sequential circuit 10_8m in the previous stage, the signal CLK6 and the signal CLK7 are used as the signal CK1 and the signal CK2, respectively in the sequential circuit 10_DUM.

Figure 7B:
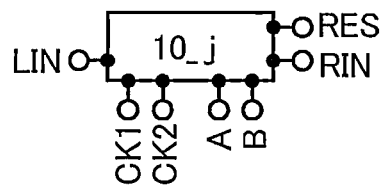

Furthermore, FIG. 7B schematically illustrates the positions of the wirings connected to the sequential circuit 10_j (j is a natural number of y or less) in the shift register illustrated in FIG. 8. As illustrated in FIG. 8 and FIG. 7B, in the sequential circuit 10_j, an output signal from an output terminal GOUT5(j−2)+5 included in the buffer BUF that is connected to the output terminal A and the output terminal B of the sequential circuit 10_j−1 in the previous stage is used as the signal LIN. Note that in the sequential circuit 10_1 in the first stage, a signal SP is used as the signal LIN.

In the sequential circuit 10_j, an output signal from an output terminal GOUT5j+2 included in the buffer BUF that is connected to the output terminal A and the output terminal B of the sequential circuit 10_j+1 in the subsequent stage is used as the signal RIN. Note that in the sequential circuit 10_y in the y-th stage, an output signal from the output terminal OUT2 included in the buffer BUF_DUM that is connected to the output terminal A and the output terminal B of the sequential circuit 10_DUM is used.

Figure 9A:
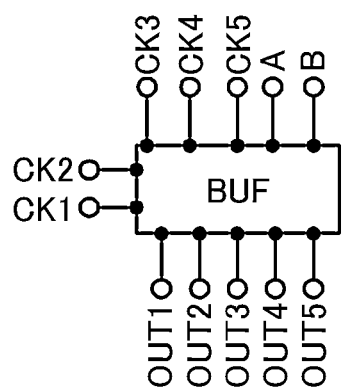
FIGS. 9A to 9D each illustrate a buffer.

FIG. 9A schematically illustrates positions of the wirings connected to the buffer BUF in the shift register in FIG. 8. As illustrated in FIG. 9A, in addition to the output signals from the output terminal A and the output terminal B of the sequential circuit 10, the signals CK1 to CK5 are input to the buffer BUF. In the buffer BUF, any five of the signals CLK1 to CLK8 are used as the signals CK1 to CK5.

Specifically, in the buffer BUF_8m+1, the signals CLK1 to CLK5 are used as the signals CK1 to CK5, respectively. In the buffer BUF_8m+2, the signals CLK6 to CLK8, the signal CLK1, and the signal CLK2 are used as the signals CK1 to CK5, respectively. In the buffer BUF_8m+3, the signals CLK3 to CLK7 are used as the signals CK1 to CK5, respectively. In the buffer BUF_8m+4, the signal CLK8 and the signals CLK1 to CLK4 are used as the signals CK1 to CK5, respectively. In the buffer BUF_8m+5, the signals CLK5 to CLK8 and the signal CLK1 are used as the signals CK1 to CK5, respectively. In the buffer BUF_8m+6, the signals CLK2 to CLK6 are used as the signals CK1 to CK5, respectively. In the buffer BUF_8m+7, the signal CLK7, the signal CLK8, and the signals CLK1 to CLK3 are used as the signals CK1 to CK5, respectively. In the buffer BUF_8m, the signals CLK4 to CLK8 are used as the signals CK1 to CK5, respectively.

Figure 9B:
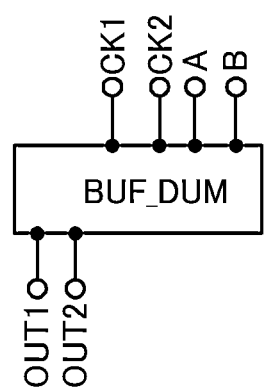

FIG. 9B schematically illustrates positions of the wirings connected to the buffer BUF_DUM in the shift register in FIG. 8. As illustrated in FIG. 9B, in addition to the output signals from the output terminal A and the output terminal B of the sequential circuit 10, the signals CK1 and CK2 are input to the buffer BUF_DUM. In the buffer BUF_DUM, any two of the signals CLK1 to CLK8 are used as the signals CK1 and CK2.

In the buffer BUF_DUM, signals used as the signal CK1 and the signal CK2 depend on the number of the stage of the buffer BUF in the previous stage. For example, when there is the buffer BUF_8 m+1 in the previous stage, the signal CLK6 and the signal CLK7 are used as the signal CK1 and the signal CK2, respectively in the buffer BUF_DUM. When there is the buffer BUF_8 m+2 in the previous stage, the signal CLK3 and the signal CLK4 are used as the signal CK1 and the signal CK2, respectively in the buffer BUF_DUM. When there is the buffer BUF_8m+3 in the previous stage, the signal CLK8 and the signal CLK1 are used as the signal CK1 and the signal CK2, respectively in the buffer BUF_DUM. When there is the buffer BUF_8m+4 in the previous stage, the signal CLK5 and the signal CLK6 are used as the signal CK1 and the signal CK2, respectively in the buffer BUF_DUM. When there is the buffer BUF_8m+5 in the previous stage, the signal CLK2 and the signal CLK3 are used as the signal CK1 and the signal CK2, respectively in the buffer BUF_DUM. When there is the buffer BUF_8m+6 in the previous stage, the signal CLK7 and the signal CLK8 are used as the signal CK1 and the signal CK2, respectively in the buffer BUF_DUM. When there is the buffer BUF_8m+7 in the previous stage, the signal CLK4 and the signal CLK5 are used as the signal CK1 and the signal CK2, respectively in the buffer BUF_DUM. When there is the buffer BUF_8m in the previous stage, the signal CLK1 and the signal CLK2 are used as the signal CK1 and the signal CK2, respectively in the buffer BUF_DUM.

The buffers BUF_1 to BUF_y each include output terminals OUT1 to OUT5. Output signals GOUT1 to GOUTy are output from the output terminals OUT1 to OUT5 included in each of the buffers BUF_1 to BUF_y. The buffer BUF_DUM includes an output terminal DUMOUT1 and an output terminal DUMOUT2.

Figure 9C:
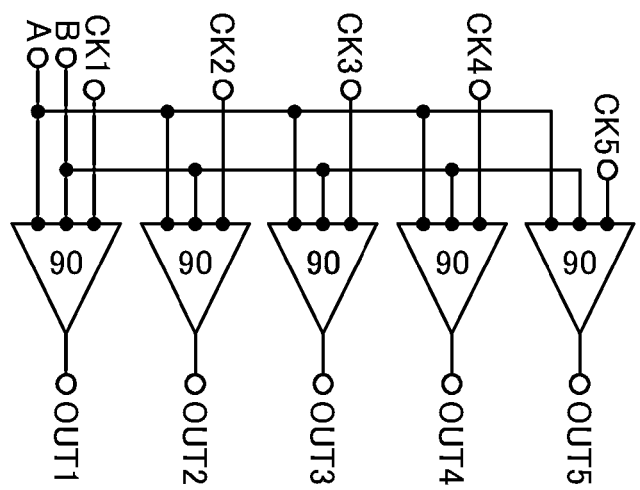

FIG. 9C illustrates an example of a specific configuration of the buffer BUF. The buffer BUF in FIG. 9C includes five buffers 90. To each of the buffers 90, in addition to the output signals from the output terminal A and the output terminal B of the sequential circuit 10, any one of the signals CK1 to CK5 is input. Output terminals of the five buffers 90 correspond to the output terminals OUT1 to OUT5 of the buffer BUF, respectively.

Note that in FIG. 8, FIG. 9A, and FIG. 9C, the buffer BUF includes the five buffers 90; however, the number of buffers 90 included in the buffer BUF may be one or less than five and more than five. As the number of the buffers 90 included in the buffer BUF is increased, the number of sequential circuits 10 included in the shift register can be small; therefore, the area of a driver circuit including the shift register can be reduced to enable the semiconductor display device to have a narrower frame width.

Figure 9D:
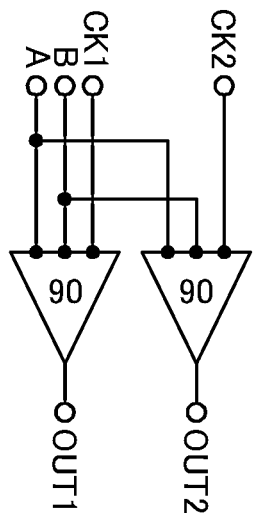

FIG. 9D illustrates an example of a specific configuration of the buffer BUF_DUM. The buffer BUF_DUM in FIG. 9D includes two buffers 90. To each of the buffers 90, in addition to the output signals from the output terminal A and the output terminal B of the sequential circuit 10_DUM, the signals CK1 or CK2 is input. Output terminals of the two buffers 90 correspond to the output terminals OUT1 and OUT2 of the buffer BUF_DUM, respectively. Note that in FIG. 8, FIG. 9B, and FIG. 9D, the buffer BUF_DUM includes the two buffers 90; however, the number of buffers 90 included in the buffer BUF_DUM may be one or more than two.

Figure 10:
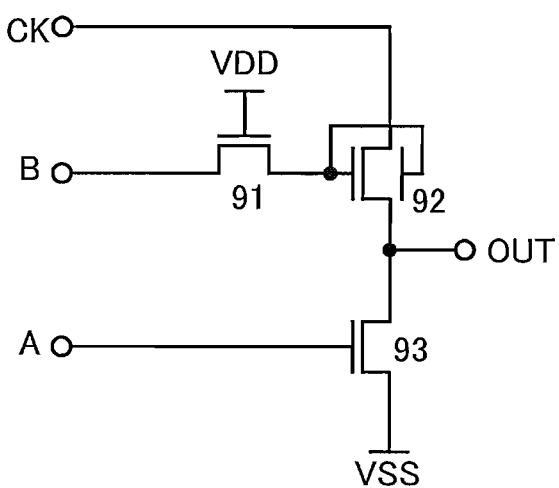
FIG. 10 illustrates a configuration of a buffer.

FIG. 10 illustrates a specific configuration example of the buffer 90. The buffer 90 in FIG. 10 includes a transistor 91, a transistor 92, and a transistor 93. A gate of the transistor 91 is connected to the wiring to which the potential VDD is applied. One of a source and a drain of the transistor 91 is connected to the output terminal B of the sequential circuit 10_DUM, and the other is connected to a gate of the transistor 92. One of a source and a drain of the transistor 92 is connected to any one of the output terminals OUT1 to OUT5 (which is illustrated as the output terminal OUT in FIG. 10) of the buffer 90, and the other is connected to the wiring to which any one of the signals CK1 to CK5 (which is illustrated as a signal CK in FIG. 10) is input. A gate of the transistor 93 is connected to the output terminal A of the sequential circuit 10_DUM. One of a source and a drain of the transistor 93 is connected to the wiring to which the potential VSS is applied, and the other is connected to any one of the output terminals OUT1 to OUT5 (which is illustrated as the output terminal OUT in FIG. 10).

In view of the above, in one embodiment of the present invention, the transistor 92 in which the other of the source and the drain is supplied with the signal CK includes a pair of gate electrodes that are electrically connected to each other and overlap with each other with a semiconductor film provided therebetween. With the transistor 92 including the pair of gate electrodes electrically connected to each other, even when a positive fixed charge is generated in the vicinity of the surface of the element substrate, a negative charge can be prevented from being generated in the vicinity of the surface of the semiconductor film due to the fixed charge, resulting in suppression of a shift in the threshold voltage of the transistor 92 in a negative direction. Thus, the reliability of the buffer BUF can be increased, leading to an increase in the reliability of a semiconductor device using a buffer BUF.

In the case where the pair of gate electrodes is electrically connected to each other, the same potential is applied to the pair of gate electrodes, which is different from the case where a constant potential is applied to one of the pair of gate electrodes. Thus, a channel formation region is increased, which makes is possible to increase drain current of the transistor 92. Consequently, a decrease in on-state current can be suppressed and the transistor 92 can be reduced in size; thus, the area of the buffer BUF can be reduced, resulting in a reduction in the area of a driver circuit using the buffer BUF. In particular, the transistor 92 provided on the output terminal side of the buffer BUF needs to have a higher capacity for supplying voltage than the transistor 91 does; therefore, it can be said that the case where the transistor 92 includes the pair of gate electrodes enables the area of the buffer BUF or the driver circuit to be small as compared to the case where the transistor 91 includes the pair of electrodes.

Furthermore, with the pair of gate electrodes electrically connected to each other, a depletion layer is easily formed in the semiconductor film, which makes it possible to improve the subthreshold value (S value) of the transistor 92.

<Semiconductor Film>

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely low off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a small off-state current of a transistor having a channel formation region in a highly purified oxide semiconductor. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at a voltage (drain voltage) between the source electrode and the drain electrode of 1 V to 10 V. In that case, it can be seen that off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly purified oxide semiconductor film was used for a channel formation region of the transistor, and the off-state current of the transistor was measured from a change in the amount of charge of the capacitor per unit hour. As a result, it was found that, in the case where the voltage between the source electrode and the drain electrode of the transistor is 3 V, a lower off-state current of several tens of yA/μm is obtained. Accordingly, the off-state current of the transistor in which the highly purified oxide semiconductor film is used as a channel formation region is considerably lower than that of a transistor in which silicon having crystallinity is used.

In the case where an oxide semiconductor film is used as a semiconductor film, an oxide semiconductor preferably contains at least indium (In) or zinc (Zn). As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn-based oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Ce—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, with an In—Sn—Zn-based oxide, high mobility can be relatively easily obtained. However, even with an In—Ga—Zn-based oxide, mobility can be increased by lowering defect density in the bulk.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a CAAC-OS film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

In a transistor using the CAAC-OS film, a change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is higher than or equal to 100° C. and lower than or equal to 740° C., preferably higher than or equal to 200° C. and lower than or equal to 500° C. When the substrate heating temperature during the deposition is increased and flat-plate-like or pellet-like sputtered particles reach the substrate, migration occurs on the substrate, so that a flat plane of each sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn-based oxide target is described below.

The In—Ga—Zn-based oxide target, which is polycrystalline, is made by mixing InO$_X$ powder, GaO$_Y$ powder, and ZnO$_Z$ powder in a predetermined molar ratio, applying pressure, and performing heat treatment at a temperature higher than or equal to 1000° C. to and lower than or equal to 1500° C. Note that X, Y, and Z are each a given positive number. Here, the predetermined molar ratio of InO$_X$ powder to GaO$_Y$ powder and ZnO$_Z$ powder is, for example, 2:1:3, 2:2:1, 8:4:3, 3:1:1, 1:1:1, 4:2:3, or 3:1:2. The kinds of powder and the molar ratio for mixing powder may be determined as appropriate depending on the desired target.

An alkali metal is not an element included in an oxide semiconductor and thus is an impurity. Also, alkaline earth metal is an impurity in the case where the alkaline earth metal is not a component of the oxide semiconductor. Alkali metal, in particular, Na becomes Na$^+$ when an insulating film in contact with the oxide semiconductor film is an oxide and Na diffuses into the insulating film. Further, in the oxide semiconductor film, Na cuts or enters a bond between metal and oxygen which are components of the oxide semiconductor. As a result, the electrical characteristics of the transistor deteriorate, for example, the transistor is placed in a normally-on state because of a negative shift of the threshold voltage or the mobility is decreased. In addition, the characteristics of transistors vary. Specifically, the Na concentration measured by secondary ion mass spectrometry is preferably $5\times10^{16}$/cm$^3$ or lower, further preferably $1\times10^{16}$/cm$^3$ or lower, still further preferably $1\times10^{15}$/cm$^3$ or lower. Similarly, the measured Li concentration is preferably $5\times10^{15}$/cm$^3$ or lower, further preferably $1\times10^{15}$/cm$^3$ or lower. Similarly, the measured K concentration is preferably $5\times10^{15}$/cm$^3$ or lower, further preferably $1\times10^{15}$/cm$^3$ or lower.

In the case where metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor film, the electric characteristics of the transistor are likely to deteriorate as in the case of using alkali metal or alkaline earth metal. Thus, the concentrations of silicon and carbon in the oxide semiconductor film are preferably low. Specifically, the C concentration or the Si concentration measured by secondary ion mass spectrometry is preferably less than or equal to $1\times10^{18}/cm^3$. In this case, the deterioration of the electric characteristics of the transistor can be prevented, so that the reliability of a semiconductor device can be improved.

A metal in the source and drain electrodes might extract oxygen from the oxide semiconductor film depending on a conductive material used for the source and drain electrodes. In such a case, regions of the oxide semiconductor film in contact with the source and drain electrodes become n-type regions because of the formation of an oxygen vacancy.

The n-type regions serves as source and drain regions, resulting in a decrease in the contact resistance between the oxide semiconductor film and the source electrode or the drain electrode. Accordingly, the formation of the n-type regions increases the mobility and the on-state current of the transistor, which achieves high-speed operation of a semiconductor device using the transistor.

Note that the extraction of oxygen by a metal in the source and drain electrodes is probably caused when the source and drain electrodes are formed by a sputtering method or when heat treatment is performed after the formation of the source and drain electrodes.

The n-type regions are more likely to be formed when the source and drain electrodes are formed using a conductive material that is easily bonded to oxygen. Examples of such a conductive material include Al, Cr, Cu, Ta, Ti, Mo, and W.

The oxide semiconductor film is not limited to a single-layer metal oxide film and may have a stacked structure of a plurality of metal oxide films. In a semiconductor film in which first to third metal oxide films are stacked in this order, for example, the first metal oxide film and the third metal oxide film are each an oxide film that contains at least one of the metal elements contained in the second metal oxide film and whose conduction band minimum is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Furthermore, the second metal oxide film preferably contains at least indium, in which case the carrier mobility of the second metal oxide film is increased.

In the transistor including the above oxide semiconductor film, when a voltage is applied to the gate electrode so that an electric field is applied to the semiconductor film, a channel region is formed in the second metal oxide film whose conduction band minimum is small in the semiconductor film. That is, since the third metal oxide film is provided between the second metal oxide film and the gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, resulting in an increase in the field-effect mobility of the transistor.

When an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure can reduce variations in the electrical characteristics of the transistor, such as the threshold voltage.

Further, a plurality of metal oxide films are preferably stacked so that an interface level that inhibits carrier flow is not formed at the interface between the metal oxide films due to an impurity existing between the metal oxide films. This is because when an impurity exists between the stacked metal oxide films, the continuity of the conduction band minimum between the metal oxide films is lost, and carriers are trapped or disappear by recombination in the vicinity of the interface. By reducing an impurity existing between the films, a continuous junction (here, particularly a U-shape well structure whose conduction band minimum is changed continuously between the films) is formed more easily than the case of merely stacking a plurality of metal oxide films that contain at least one common metal as a main component.

In order to form such a continuous junction, the films need to be stacked successively without being exposed to the air by using a multi-chamber deposition system (sputtering system) provided with a load lock chamber. Each chamber of the sputtering apparatus is preferably evacuated to a high vacuum (from $5\times10^{-7}$ Pa to ca. $1\times10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the sputtering gas has a dew point of $-40°$ C. or lower, preferably $-80°$ C. or lower, further preferably $-100°$ C. or lower and is highly purified, moisture and the like can be prevented from entering the oxide semiconductor film as much as possible. Specifically, when the second metal oxide film is an In—M-Zn oxide film (M is Ga, Y, Zr, La, Ce, or Nd) and a target having an atomic ratio of metal elements of In:M:Zn=$x_1$:$y_1$:$z_1$ is used to form the second metal oxide film, $x_1/y_1$ ranges preferably from ⅓ to 6, further preferably from 1 to 6, and $z_1/y_1$ ranges preferably from ⅓ to 6, further preferably from 1 to 6. Note that when $z_1/y_1$ ranges from 1 to 6, a CAAC-OS film is likely to be formed as the second metal oxide film. Typical examples of the atomic ratio of the metal elements in the target are In:M:Zn=1:1:1, In:M:Zn=1:1:1.2, and In:M:Zn=3:1:2.

Specifically, when the first and third metal oxide films are each an In—M-Zn oxide film (M is Ga, Y, Zr, La, Ce, or Nd) and a target used for depositing the first and third metal oxide films has an atomic ratio of metal elements of In:M:Zn=$x_2$:$y_2$:$z_2$, $x_2/y_2<x_1/y_1$ is satisfied and $z_2/y_2$ ranges preferably from ⅓ to 6, further preferably from 1 to 6. Note that when $z_2/y_2$ ranges from 1 to 6, CAAC-OS films are likely to be formed as the first and third metal oxide films. Typical examples of the atomic ratio of the metal elements of the target are In:M:Zn=1:3:2, In:M:Zn=1:3:4, In:M:Zn=1:3:6, In:M:Zn=1:3:8, and the like.

The first and third metal oxide films each have a thickness of 3 nm to 100 nm, preferably 3 nm to 50 nm. The second metal oxide film has a thickness of 3 nm to 200 nm, preferably 3 nm to 100 nm, further preferably 3 nm to 50 nm.

In the three-layer semiconductor film, each of the first to third metal oxide films can be amorphous or crystalline. Note that the second metal oxide film in which a channel region is formed is preferably crystalline, in which case the transistor can have stable electrical characteristics.

Note that a channel formation region refers to a region of a semiconductor film of a transistor that overlaps with a gate electrode and is located between a source electrode and a drain electrode. Further, a channel region refers to a region through which current mainly flows in the channel formation region.

For example, when an In—Ga—Zn-based oxide film formed by a sputtering method is used as each of the first and third metal oxide films, the first and third metal oxide films can be deposited with use of an In—Ga—Zn-based oxide target containing In, Ga, and Zn in an atomic ratio of 1:3:2. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the second metal oxide film is a CAAC-OS film, the second metal oxide film is preferably deposited with use of a polycrystalline In—Ga—Zn-based oxide target containing In, Ga, and Zn in an atomic ratio of 1:1:1. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that the end portion of the semiconductor film included in the transistor may be inclined or may be rounded.

Also in the case where a semiconductor film including stacked metal oxide films is used in the transistor, a region in contact with the source electrode or the drain electrode can be an n-type region. Such a structure increases the mobility and the on-state current of the transistor and achieves high-speed operation of a semiconductor device using the transistor. Furthermore, when the semiconductor film including the stacked metal oxide films is used in the transistor, the n-type region particularly preferably reaches the second metal oxide film part of which is to be a channel region, because the mobility and the on-state current of the transistor are further increased and higher-speed operation of the semiconductor device is achieved.

<Manufacturing Method>

Next, an example of a method for manufacturing a semiconductor display device of one embodiment of the present invention is described with reference to FIGS. 11A and 11B, FIGS. 12A and 12B, FIGS. 13A and 13B, and FIGS. 14A and 14B. A liquid crystal display device is described as an example of the semiconductor display device. Note that in FIGS. 11A and 11B, FIGS. 12A and 12B, FIGS. 13A and 13B, and FIGS. 14A and 14B, description is given of a method for manufacturing an element substrate including the transistor 56 in FIG. 5 included in the pixel 55 and the transistor 20 in FIGS. 2A to 2C included in a driver circuit.

As illustrated in FIG. 11A, a conductive film is formed over the substrate 31 and then, the shape of the conductive film is processed (patterning) by etching, for example, whereby the conductive films 21 and 40 are formed.

As the substrate 31, a substrate having heat resistance high enough to withstand a later manufacturing step is preferable. Examples of the substrate include a glass substrate, a quartz substrate, a ceramic substrate, and a sapphire substrate.

Each of the conductive films 21 and 40 may be formed using a single layer or a stacked layer of a conductive film containing one or more kinds selected from aluminum, titanium, chromium, cobalt, nickel, copper, yttrium, zirconium, molybdenum, ruthenium, silver, tantalum, and tungsten. For example, the conductive films 21 and 40 may be a single-layer tungsten film or a conductive film in which a copper film is stacked over a tungsten nitride film. In this embodiment, a 200-nm-thick tungsten film is used as the conductive film 21 and the conductive film 40.

Next, as illustrated in FIG. 11B, the insulating film 22 is formed to cover the conductive film 21 and the conductive film 40 and then, the oxide semiconductor film 23, the oxide semiconductor film 41, and an oxide semiconductor film 42a are formed over the insulating film 22. Note that the oxide semiconductor film 23 is formed to overlap with the conductive film 21, and the oxide semiconductor film 41 is formed to overlap with the conductive film 40.

The insulating film 22 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

Note that in this specification, oxynitride contains more oxygen than nitrogen, and nitride oxide contains more nitrogen than oxygen.

For example, in the case where the insulating film 22 has a two-layer structure, a silicon nitride film and a silicon oxide film may be used as the first layer and the second layer, respectively. A silicon oxynitride film may be used as the second layer instead of the silicon oxide film. A silicon nitride oxide film may be used as the first layer instead of the silicon nitride film. In this embodiment, a 400-nm-thick silicon nitride film and a 50-nm-thick silicon oxynitride film are stacked in this order to be used as the insulating film 22.

As the silicon oxide film, a silicon oxide film with a low defect density is preferably used. Specifically, a silicon oxide film which has a spin density of $3 \times 10^{17}$ spins/cm$^3$ or less, preferably $5 \times 10^{16}$ spins/cm$^3$ or less corresponding to a signal at a g-factor of 2.001 in electron spin resonance (ESR) spectroscopy is used. As the silicon oxide film, a silicon oxide film having excess oxygen is preferably used. As the silicon nitride film, a silicon nitride film from which a small amount of hydrogen and ammonia is released is used. The amount of released hydrogen and ammonia can be measured by thermal desorption spectroscopy (TDS).

An oxide semiconductor film can be used as the oxide semiconductor film 23, the oxide semiconductor film 41, and the oxide semiconductor film 42a. When the oxide semiconductor film used as the oxide semiconductor films 23 and 41 contains a large amount of hydrogen, the hydrogen and the oxide semiconductor are bonded to each other, so that part of the hydrogen becomes donors and generates electrons serving as carriers. As a result, the threshold voltages of the transistor 20 and the transistor 56 are each shifted in a negative direction. Therefore, it is preferable that, after forming the oxide semiconductor film, dehydration treatment (dehydrogenation treatment) be performed to remove hydrogen or moisture from the oxide semiconductor film so that the oxide semiconductor film contains impurities as little as possible.

In this embodiment, a 35-nm-thick In—Ga—Zn-based oxide semiconductor film formed using a target containing a metal oxide including metal elements of In, Ga, and Zn in an atomic ratio of 3:1:2 is used as the oxide semiconductor films 23, 41, and 42a.

The thickness of the oxide semiconductor films 23, 41, and 42a are each preferably greater than or equal to 1 nm and less than or equal to 100 nm, more preferably greater than or equal to 1 nm and less than or equal to 50 nm, still more preferably greater than or equal to 1 nm and less than or equal to 30 nm, further preferably greater than or equal to 3 nm and less than or equal to 20 nm.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film.

Next, a conductive film is formed over the oxide semiconductor film 23, the oxide semiconductor film 41, the oxide semiconductor film 42a, and the insulating film 22 and then, the conductive film is processed by etching, for example, whereby the conductive film 24 and the conductive film 25 that are in contact with the oxide semiconductor film 23, and the conductive film 43 and the conductive film 44 that are in contact with the oxide semiconductor film 41 are formed (see FIG. 12A). The conductive films 24 and 25 and the conductive films 43 and 44 can be formed using the same conductive material as the conductive films 21 and 40.

In this embodiment, a 50-nm-thick tungsten film, a 400-nm-thick aluminum film, and a 200-nm-thick titanium film are stacked in this order to be used as each of the conductive films 24, 25, 43, and 44.

Then, an oxide film or an insulating film is formed to cover the substrate 31. FIG. 12B illustrates an example in which the insulating film 26 and the insulating film 27 are stacked in order.

The insulating film 27 is preferably formed without exposure to the atmosphere following the formation of the insulating film 26. After the insulating film 26 is formed, the insulating film 27 is formed in succession by adjusting at least one of the flow rate of a source gas, pressure, a high-frequency power, and a substrate temperature without exposure to the air, whereby the concentration of impurities at the interface between the insulating film 26 and the insulating film 27 can be reduced and oxygen in the insulating film 27 can be moved to the oxide semiconductor film 23 and the oxide semiconductor film 41; accordingly, the number of oxygen vacancies in the oxide semiconductor film 23 and the oxide semiconductor film 41 can be reduced.

As the insulating film 26, a silicon oxide film or a silicon oxynitride film is formed under the following conditions: the substrate placed in a treatment chamber of a plasma-enhanced CVD apparatus that is vacuum-evacuated is held at 180° C. or higher and 400° C. or lower, preferably 200° C. or higher and 370° C. or lower, the pressure in the treatment chamber is 30 Pa or higher and 250 Pa or lower, preferably 40 Pa or higher and 200 Pa or lower with introduction of a source gas into the treatment chamber, and high-frequency power is supplied to an electrode provided in the treatment chamber.

A deposition gas containing silicon and an oxidizing gas are preferably used as the source gases of the insulating film 26. Typical examples of the deposition gas containing silicon include silane, disilane, trisilane, and silane fluoride. As the oxidizing gas, oxygen, ozone, dinitrogen monoxide, and nitrogen dioxide can be given as examples.

With the use of the above conditions, an oxide insulating film through which oxygen is passed can be formed as the insulating film 26. By providing the insulating film 26, damage to the oxide semiconductor films 23, 41, and 42a can be reduced in a step of forming the insulating film 27 which is formed later.

Note that by setting the ratio of the amount of the oxidizing gas to the amount of the deposition gas containing silicon 100 or higher, the hydrogen content in the insulating film 26 can be reduced and the dangling bonds contained in the insulating film 26 can be reduced. Oxygen moving from the insulating film 27 is captured by the dangling bonds contained in the insulating film 26 in some cases; thus, oxygen contained in the insulating film 27 can move to the oxide semiconductor films 23 and 41 efficiently to fill the oxygen vacancies in the oxide semiconductor films 23 and 41. As a result, the amount of hydrogen entering the oxide semiconductor films 23 and 41 can be reduced, and oxygen vacancies in the oxide semiconductor films 23 and 41 can be reduced. Consequently, a negative shift in the threshold voltage of the transistors 20 and 56 can be reduced, and off-state current of the transistors 20 and 56 can be reduced; accordingly, the electrical characteristics of the transistors can be improved.

In this embodiment, as the insulating film 26, a 50-nm-thick silicon oxynitride film is formed by a plasma CVD method under the following conditions: silane with a flow rate of 20 sccm and dinitrogen monoxide with a flow rate of 3000 sccm are used as the source gases, the pressure in the treatment chamber is 200 Pa, the substrate temperature is 350° C., and a high-frequency power of 100 W is supplied to parallel plate electrodes with a high-frequency power supply of 27.12 MHz. Note that a plasma CVD apparatus is a parallel plate plasma CVD apparatus in which the electrode area is 6000 cm$^2$, and the power per unit area (power density) into which the supplied power is converted is $1.6 \times 10^{-2}$ W/cm$^2$. Under the above conditions, a silicon oxynitride film that passes oxygen can be formed.

As the insulating film 27, a silicon oxide film or a silicon oxynitride film is formed under the following conditions: the substrate placed in a treatment chamber of the plasma-enhanced CVD apparatus that is vacuum-evacuated is held at 180° C. or higher and 260° C. or lower, preferably 180° C. or higher and 230° C. or lower, the pressure is 100 Pa or higher and 250 Pa or lower, preferably 100 Pa or higher and 200 Pa or lower with introduction of a source gas into the treatment chamber, and a high-frequency power of 0.17 W/cm$^2$ or higher and 0.5 W/cm$^2$ or lower, preferably 0.25 W/cm$^2$ or higher and 0.35 W/cm$^2$ or lower is supplied to an electrode provided in the treatment chamber.

As for the formation conditions of the insulating film 27, the high-frequency power having the above power density is supplied to the treatment chamber having the above pressure, whereby the decomposition efficiency of the source gas in plasma is increased, oxygen radicals are increased, and oxidation of the source gas proceeds; therefore, the oxygen content in the insulating film 27 is higher than that in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen at a higher proportion than the stoichiometric composition and from which part of oxygen is released by heating. Since the insulating film 26 is provided over the oxide semiconductor films 23, 41, and 42a, the insulating film 26 has a function of protecting the oxide semiconductor films 23, 41, and 42a in the step of forming the insulating film 27. Consequently, the insulating film 27 can be formed using the high-frequency power having a high power density while damage to the oxide semiconductor films 23, 41, and 42a is reduced.

In this embodiment, as the insulating film 27, a 400-nm-thick silicon oxynitride film is formed by a plasma CVD method under the following conditions: silane with a flow rate of 160 sccm is used as the source gas, the pressure in the treatment chamber is 200 Pa, the substrate temperature is 220° C., and a high-frequency power of 1500 W is supplied to parallel plate electrodes with a high-frequency power supply of 27.12 MHz. Note that a plasma CVD apparatus is a parallel plate plasma CVD apparatus in which the electrode area is 6000 cm$^2$, and the power per unit area (power density) into which the supplied power is converted is $2.5 \times 10^{-1}$ W/cm$^2$.

Next, oxygen vacancies in the oxide semiconductor film 23 and the oxide semiconductor film 41 are preferably filled by performing heat treatment at least after the insulating film 27 is formed to move oxygen contained in the insulating film 26 or the insulating film 27 to the oxide semiconductor film 23 and the oxide semiconductor film 41. Note that the heat treatment can be performed as heat treatment for dehydration or dehydrogenation of the oxide semiconductor films 23 and 41. Specifically, in this embodiment, the heat treatment is performed at 350° C. for 1 hour in an atmosphere of nitrogen and oxygen.

Through the series of steps, the transistor 20 and the transistor 56 are formed.

Next, as illustrated in FIG. 13A, the insulating film 26 and the insulating film 27 are partly etched to form the opening 58. In the opening 58, the oxide semiconductor film 42a is exposed partly or entirely.

Then, the nitride insulating film 28 and the insulating film 29 are stacked in this order over the insulating films 26 and 27 to cover the opening 58. The nitride insulating film 28 is in contact with the oxide semiconductor film 42a in the opening 58.

For the nitride insulating film 28, silicon nitride, silicon nitride oxide, aluminum nitride, or aluminum nitride oxide can be used, for example. In comparison with an oxide insulating film such as a silicon oxide film and an aluminum oxide film, the nitride insulating film 28 containing any of the above materials can further prevent impurities from outside, such as water, alkali metal, and alkaline-earth metal, from being diffused into the oxide semiconductor films 23 and 41. The nitride insulating film 28 is formed to be in contact with the oxide semiconductor film 42a in the opening 58, which enables the conductivity of the oxide semiconductor film 42a to be increased. In FIG. 13B, the oxide semiconductor film 42a having the increased conductivity is illustrated as the metal oxide film 42.

In one embodiment of the present invention, as the nitride insulating film 28, a 100-nm-thick silicon nitride film is formed by a plasma CVD method under the following conditions: silane with a flow rate of 50 sccm, nitrogen with a flow rate of 5000 sccm, and ammonia with a flow rate of 100 sccm are used as a source gas; the pressure in the treatment chamber is 100 Pa; the substrate temperature is 350° C.; and high-frequency power of 1000 W (the power density was $1.6 \times 10^{-1}$ W/cm$^2$) is supplied to parallel-plate electrodes with a high-frequency power supply of 27.12 MHz.

As the insulating film 29, an insulating film which has a lower dielectric constant and smaller internal stress than the nitride insulating film 28 is preferably used. Specific examples of the insulating film 29 include a silicon oxide film, a silicon oxynitride film, and an aluminum oxide film.

For example, a silicon oxide film formed by a CVD method using an organosilane gas can also be used as the insulating film 29. Examples of the organosilane gas include tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), trisdimethylaminosilane (chemical formula: $SiH(N(CH_3)_2)_3$) and the like.

In this embodiment, a 200-nm-thick silicon oxide film formed by a CVD method using tetraethoxysilane is used as the insulating film 29.

Figure 14A:
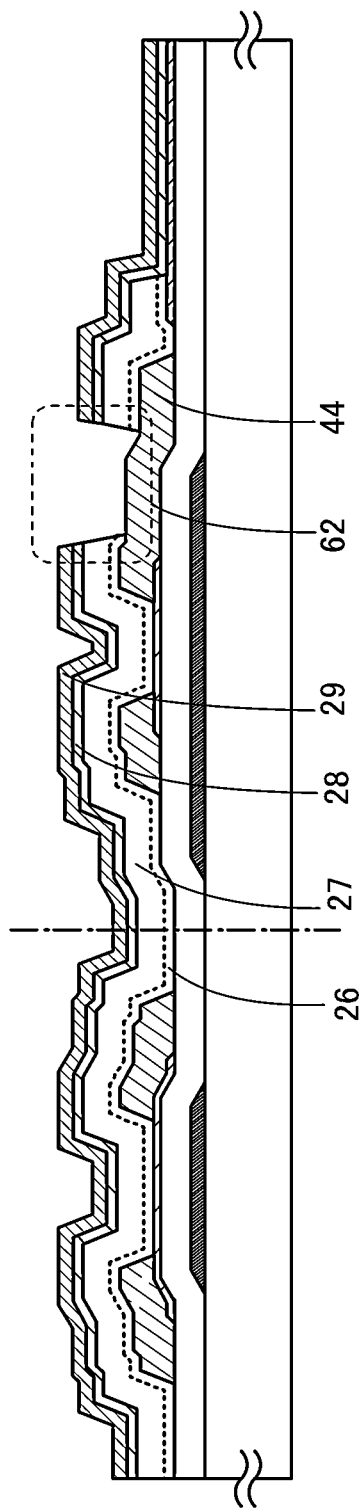
FIGS. 14A and 14B illustrate the method for manufacturing the element substrate.

Next, as illustrated in FIG. 14A, the nitride insulating film 28 and the insulating film 29 are partly etched to form the opening 62. In the opening 62, at least part of the conductive film 44 is exposed.

Figure 14B:
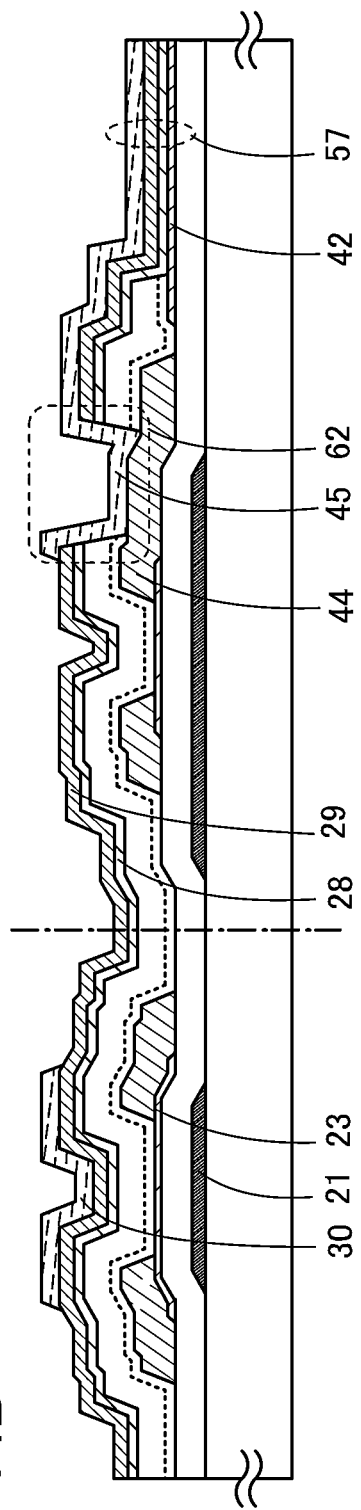

Next, as illustrated in FIG. 14B, a transparent conductive film is formed over the insulating film 29 and the shape thereof is processed by etching, for example, whereby the conductive films 30 and 45 are formed. The conductive film 30 overlaps with the conductive film 21 with the oxide semiconductor film 23 sandwiched therebetween. The conductive film 45 is electrically connected to the conductive film 44 in the opening 62.

As the transparent conductive film used for forming the conductive film 21 and the conductive film 45, a conductive film containing the following can be used: indium oxide containing tungsten oxide, indium zinc oxide containing tungsten oxide, indium oxide containing titanium oxide, indium tin oxide containing titanium oxide, indium tin oxide, indium zinc oxide, zinc oxide, zinc oxide to which gallium is added, or indium tin oxide to which silicon oxide is added.

In this embodiment, a 100-nm-thick conductive film containing indium tin oxide to which silicon oxide is added is used, for example, to form the conductive film 21 and the conductive film 45.

Heat treatment may be performed after the conductive film 21 and the conductive film 45 are formed. The heat treatment is performed at 250° C. under a nitrogen atmosphere for 1 hour, for example.

Next, the alignment film 52 is formed over the conductive film 45 as illustrated in FIG. 5. Thus, the element substrate can be formed.

The alignment film 52 can be formed using an organic resin such as polyimide or polyvinyl alcohol. Alignment treatment such as rubbing is performed on a surface of the alignment film 52 in order to align liquid crystal molecules in a certain direction. A roller wrapped with cloth of nylon or the like is rolled in a certain direction while being in contact with the alignment film 52 so that the surface of the alignment film 52 can be rubbed. Note that it is also possible to form the alignment film 52 that has alignment characteristics with the use of an inorganic material such as silicon oxide by deposition, without alignment treatment.

After the element substrate and a counter substrate are formed, the liquid crystal layer 53 is sealed between the substrate 31 and the substrate 46 as illustrated in FIG. 5; thus, a panel of the liquid crystal display device is completed. Injection of liquid crystal for forming the liquid crystal layer 53 may be performed by a dispenser method (dripping method) or a dipping method (pumping method).

<Top View and Cross-Sectional View of Semiconductor Display Device>

Figure 15:
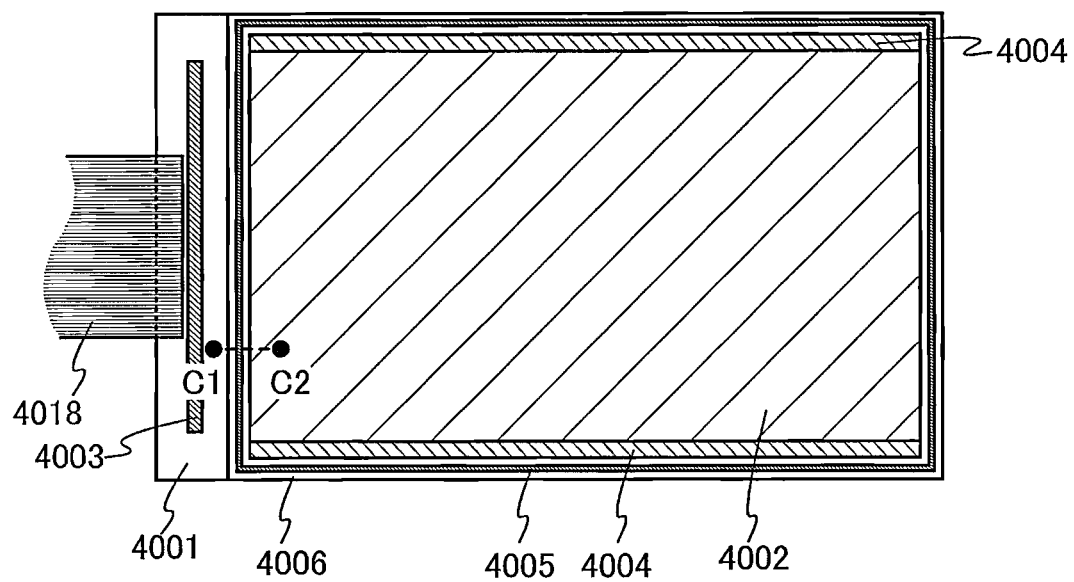
FIG. 15 is a top view of a liquid crystal display device.
Figure 16:
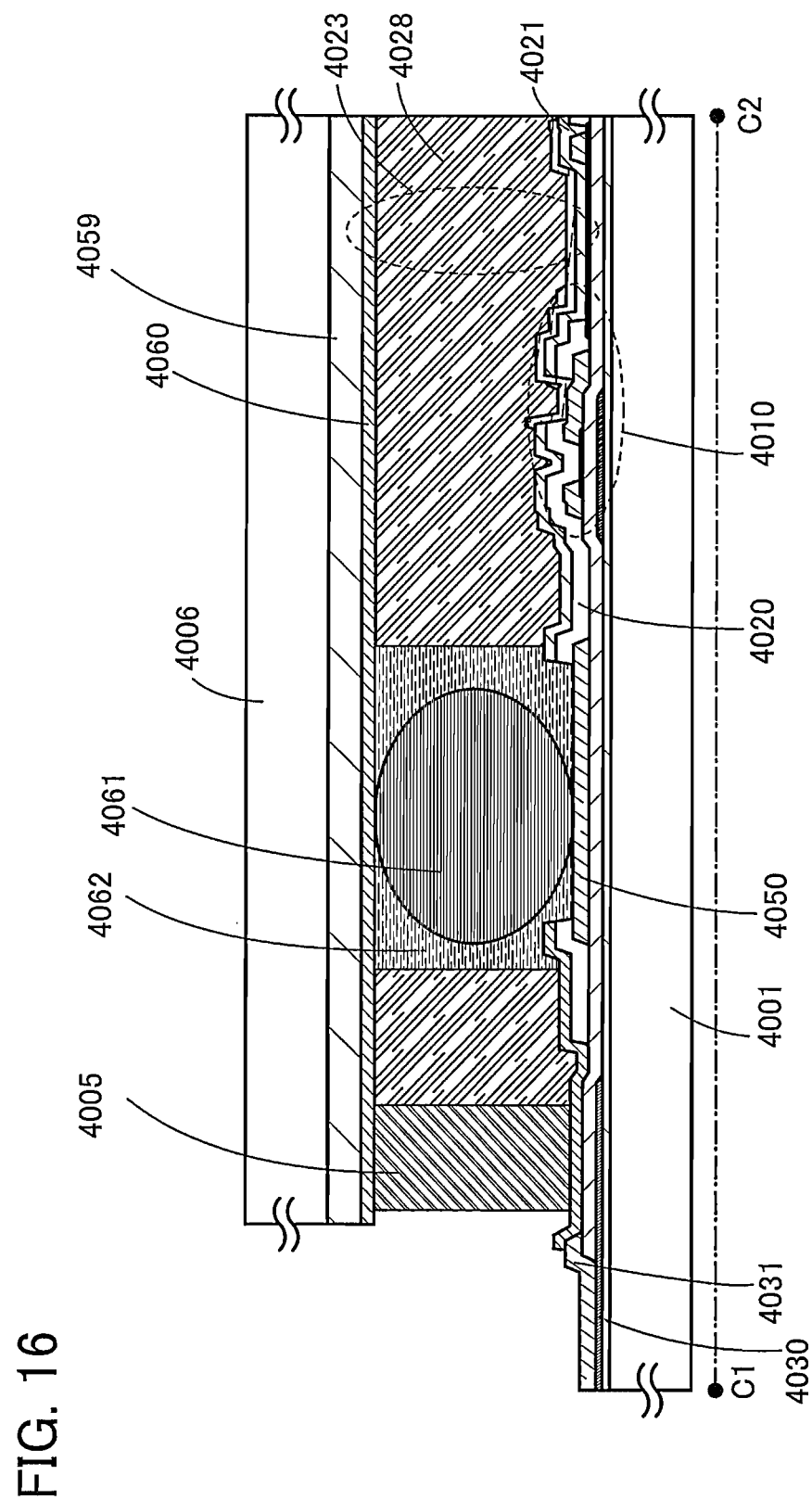
FIG. 16 is a cross-sectional view of the liquid crystal display device.

Next, the appearance of the semiconductor display device of one embodiment of the present invention is described with reference to FIG. 15. FIG. 15 is a top view of a liquid crystal display device in which a substrate 4001 and a substrate 4006 are bonded to each other with a sealant 4005. FIG. 16 is a cross-sectional view along dashed line C1-C2 in FIG. 15.

The sealant 4005 is provided to surround a pixel portion 4002 and a pair of driver circuits 4004 provided over the substrate 4001. The substrate 4006 is provided over the pixel portion 4002 and the driver circuits 4004. Thus, the pixel portion 4002 and the driver circuits 4004 are sealed by the substrate 4001, the sealant 4005, and the substrate 4006.

A driver circuit 4003 is mounted in a region which is different from a region surrounded by the sealant 4005 over the substrate 4001.

A plurality of transistors are included in the pixel portion 4002 and the driver circuits 4004 provided over the substrate 4001. FIG. 16 illustrates a transistor 4010 included in the pixel portion 4002. An insulating film 4020 formed of insulating films which includes a nitride insulating film is provided over the transistor 4010, and a pixel electrode 4021 is provided over the insulating film 4020. The transistor 4010 is connected to the pixel electrode 4021 in an opening provided in the insulating film 4020.

A resin film 4059 is provided on the substrate 4006, and a common electrode 4060 is formed on the resin film 4059. Between the substrate 4001 and the substrate 4006, a liquid crystal layer 4028 is provided to be sandwiched between the pixel electrode 4021 and the common electrode 4060. A liquid crystal element 4023 includes the pixel electrode 4021, the common electrode 4060, and the liquid crystal layer 4028.

The transmittance of the liquid crystal element 4023 changes when the alignment of liquid crystal molecules included in the liquid crystal layer 4028 changes in accordance with the level of voltage applied between the pixel electrode 4021 and the common electrode 4060. Accordingly, when the transmittance of the liquid crystal element 4023 is controlled by the potential of an image signal supplied to the pixel electrode 4021, gray-scale images can be displayed.

As illustrated in FIG. 16, in one embodiment of the present invention, the insulating film 4020 is removed at an end portion of the panel. In the region where the insulating film 4020 is removed, a conductive film 4050 is formed. The conductive film 4050 and a conductive film serving as a source and a drain of the transistor 4010 can be formed by etching one conductive film.

A resin film 4062 in which a conductive particle 4061 is dispersed is provided between the substrate 4001 and the substrate 4006. The conductive film 4050 is electrically connected to the common electrode 4060 through the conductive particle 4061. That is, the common electrode 4060 and the conductive film 4050 are electrically connected to each other through the conductive particle 4061 at the end portion of the panel. The resin film 4062 can be formed using a thermosetting resin or an ultraviolet curable resin. As the conductive particle 4061, a particle of a spherical organic resin coated with thin-film metal of Au, Ni, Co, or other metals can be used, for example.

An alignment film is not illustrated in FIG. 16. In the case of providing an alignment film on the pixel electrode 4021 and on the common electrode 4060, the alignment film on the common electrode 4060 is partly removed and the alignment film on the conductive film 4050 is partly removed; thus, electrical connection can be obtained among the common electrode 4060, the conductive particle 4061, and the conductive film 4050.

Note that in the liquid crystal display device of one embodiment of the present invention, a color image may be displayed by using a color filter or by sequentially turning on a plurality of light sources emitting light with different hues.

Image signals from the driver circuit 4003 and a variety of control signals and potentials from an FPC 4018 are supplied to the driver circuits 4004 or the pixel portion 4002 through lead wirings 4030 and 4031.

<Structure Example of Electronic Device Using Semiconductor Device>

The semiconductor device of one embodiment of the present invention can be used for display devices, personal computers, or image reproducing devices provided with recording media (typically, devices which include displays, and can reproduce the content of recording media such as digital versatile discs (DVDs) and display the reproduced images). In addition, examples of electronic devices in which the semiconductor device of one embodiment of the present invention can be used include cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), and vending machines. Specific examples of these electronic devices are illustrated in FIGS. 18A to 18F.

Figure 18A:
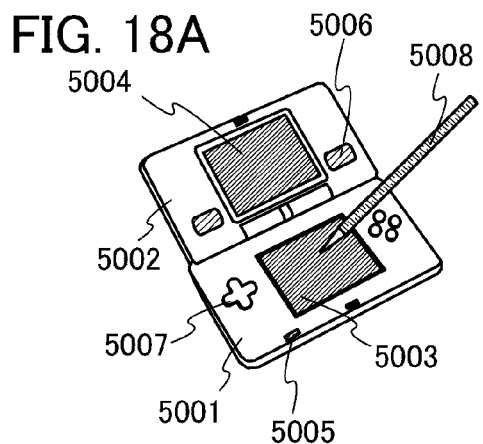
FIGS. 18A to 18F illustrate electronic devices.

FIG. 18A illustrates a portable game machine, which includes a housing 5001, a housing 5002, a display portion 5003, a display portion 5004, a microphone 5005, speakers 5006, an operation key 5007, a stylus 5008, and the like. The semiconductor device of one embodiment of the present invention can be used for the display portion 5003, the display portion 5004, or an integrated circuit in another portion. Note that although the portable game machine in FIG. 18A has the two display portions 5003 and 5004, the number of display portions included in the portable game machine is not limited thereto.

Figure 18B:
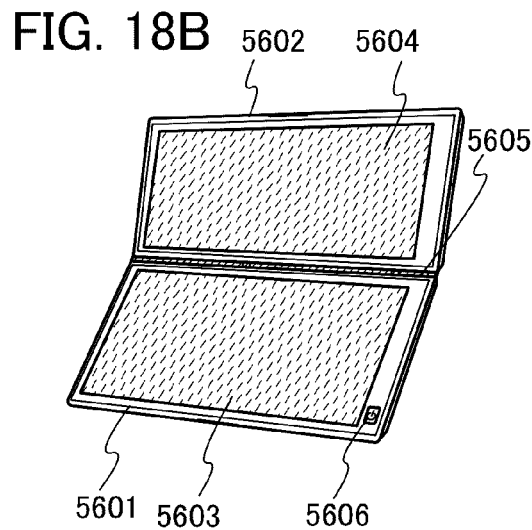

FIG. 18B illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. Images on the first display portion 5603 may be switched in accordance with the angle at the joint 5605 between the first housing 5601 and the second housing 5602. The semiconductor device of one embodiment of the present invention can be used for the first display portion 5603, the second display portion 5604, or an integrated circuit in another portion.

Figure 18C:
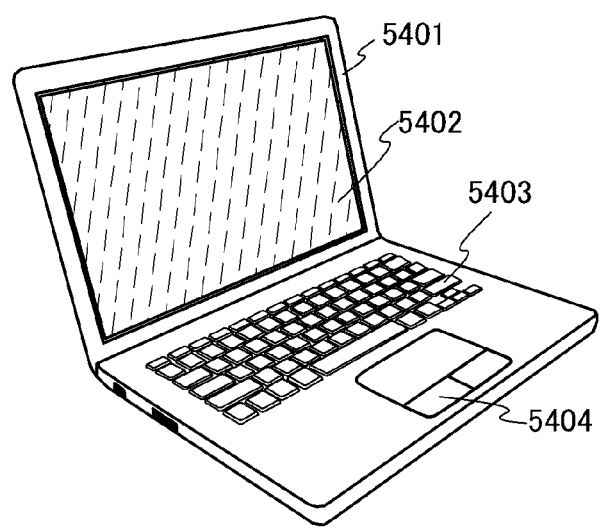

FIG. 18C illustrates a laptop personal computer, which includes a housing 5401, a display portion 5402, a keyboard 5403, a pointing device 5404, and the like. The semiconductor device of one embodiment of the present invention can be used for the display portion 5402 or an integrated circuit in another portion.

Figure 18D:
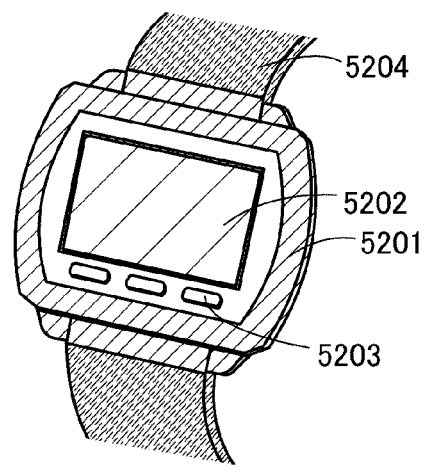

FIG. 18D illustrates a wristwatch, which includes a housing 5201, a display portion 5202, an operation button 5203, and a bracelet 5204. The semiconductor device of one embodiment of the present invention can be used for the display portion 5202 or an integrated circuit in another portion.

Figure 18E:
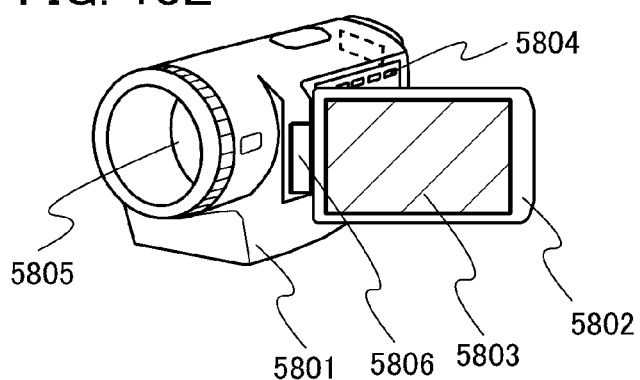

FIG. 18E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 is connected to the second housing 5802 with the joint 5806, and the angle between the first housing 5801 and the second housing 5802 can be changed at the joint 5806. Images on the display portion 5803 may be switched in accordance with the angle at the joint 5806 between the first housing 5801 and the second housing 5802. The semiconductor device of one embodiment of the present invention can be used for the display portion 5803 or an integrated circuit in another portion.

Figure 18F:
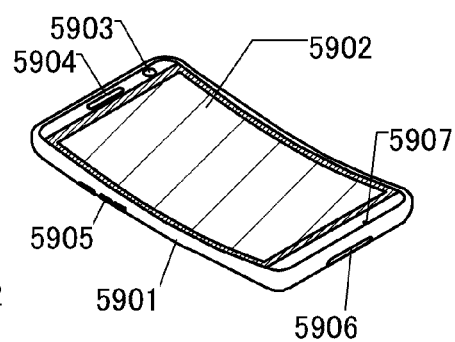

FIG. 18F illustrates a cellular phone. In the cellular phone, a display portion 5902, a microphone 5907, a speaker 5904, a camera 5903, an external connection portion 5906, and an operation button 5905 are provided in a housing 5901. The semiconductor device of one embodiment of the present invention can be used for the display portion 5902 or an integrated circuit in another portion. When the semiconductor device of one embodiment of the present invention is provided over a flexible substrate, the semiconductor device can be used as the display portion 5902 having a curved surface, as illustrated in FIG. 18F.

[Example]

In this example, examination results of the $V_g$–$I_d$ characteristics and the reliabilities of formed transistors are described.

[Formation of Samples]

In this example, samples 1 and 2 each of which is one embodiment of the present invention, and a sample 3 for comparison were formed. Specifically, a transistor having a structure corresponding to that illustrated in FIGS. 2A to 2C was formed as the sample 1, which is one embodiment of the present invention. A transistor having a structure corresponding to that illustrated in FIGS. 19A to 19C was formed as the sample 2, which is one embodiment of the present invention. As the sample 3 for comparison, a transistor which has a structure similar to the structure illustrated in FIGS. 2A to 2C, except that the conductive film 30 was not included was formed.

[Sample 1]

First, a glass substrate was used as a substrate, and a gate electrode was formed over the substrate.

The gate electrode was formed in the following manner: a 200-nm-thick tungsten film was formed by a sputtering method, a mask was formed over the tungsten film by a photolithography process, and the tungsten film was partly etched with the use of the mask.

Next, a gate insulating film was formed over the gate electrode.

As the gate insulating film, a stack including a 400-nm-thick silicon nitride film and a 50-nm-thick silicon oxynitride film was used.

Note that the silicon nitride film was formed to have a three-layer structure of a first silicon nitride film, a second silicon nitride film, and a third silicon nitride film.

The first silicon nitride film was formed to have a thickness of 50 nm in the following conditions: silane at a flow rate of 200 sccm, nitrogen at a flow rate of 2000 sccm, and an ammonia gas at a flow rate of 100 sccm were supplied to a treatment chamber of a plasma CVD apparatus as a source gas; the pressure in the treatment chamber was controlled to 100 Pa, and power of 2000 W was supplied with the use of a 27.12 MHz high-frequency power source. The second silicon nitride film was formed to have a thickness of 300 nm in the following conditions: silane at a flow rate of 200 sccm, nitrogen at a flow rate of 2000 sccm, and an ammonia gas at a flow rate of 2000 sccm were supplied to the treatment chamber of the plasma CVD apparatus as a source gas; the pressure in the treatment chamber was controlled to 100 Pa, and power of 2000 W was supplied with the use of a 27.12 MHz high-frequency power source. The third silicon nitride film was formed to have a thickness of 50 nm in the following conditions: silane at a flow rate of 200 sccm and nitrogen at a flow rate of 5000 sccm were supplied to the treatment chamber of the plasma CVD apparatus as a source gas; the pressure in the treatment chamber was controlled to 100 Pa, and power of 2000 W was supplied with the use of a 27.12 MHz high-frequency power source. Note that the first silicon nitride film, the second silicon nitride film, and the third silicon nitride film were each formed at a substrate temperature of 350° C.

The silicon oxynitride film was formed in the following conditions: silane at a flow rate of 20 sccm and dinitrogen monoxide at a flow rate of 3000 sccm were supplied to the treatment chamber of the plasma CVD apparatus as a source gas; the pressure in the treatment chamber was controlled to 40 Pa, and power of 100 W was supplied with the use of a 27.12 MHz high-frequency power source. Note that the silicon oxynitride film was formed at a substrate temperature of 350° C.

Next, an oxide semiconductor film was formed to overlap with the gate electrode with the gate insulating film positioned therebetween.

In this example, a 35-nm-thick oxide semiconductor film was formed over the gate insulating film by a sputtering method.

The oxide semiconductor film was formed in the following conditions: a sputtering target containing In, Ga, and Zn at an atomic ratio of 1:1:1 was used; oxygen at a flow rate of 100 sccm was supplied as a sputtering gas into a treatment chamber of a sputtering apparatus; the pressure in the treatment chamber was controlled to 0.6 Pa; and direct-current power of 5 kW was supplied. Note that the oxide semiconductor film was formed at a substrate temperature of 170° C.

Next, a source electrode and a drain electrode were formed in contact with the oxide semiconductor film.

First, a conductive film was formed over the gate insulating film and the oxide semiconductor film. As the conductive film, a 400-nm-thick aluminum film was formed over a 50-nm-thick tungsten film, and a 200-nm-thick titanium film was formed over the aluminum film. Then, a mask was formed over the conductive film by a photolithography process, and the conductive film was partly etched with the use of the mask. Through the above steps, the source electrode and the drain electrode were formed.

Next, the substrate was transferred to a treatment chamber in a reduced pressure and heated at 350° C. Then, the oxide semiconductor film was exposed to oxygen plasma that was generated in a dinitrogen monoxide atmosphere by supply of a high-frequency power of 150 W to an upper electrode in the treatment chamber with the use of a 27.12 MHz high-frequency power source.

After that, a protective film was formed over the oxide semiconductor film, the source electrode, and the drain electrode. In this example, the protective film was formed to have a three-layer structure of a first oxide insulating film, a second oxide insulating film, and a nitride insulating film.

The first oxide insulating film was formed by a plasma CVD method in the following conditions: silane at a flow rate of 20 sccm and dinitrogen monoxide at a flow rate of 3000 sccm were used as a source gas; the pressure in the treatment chamber was 200 Pa; the substrate temperature was 350° C.; and high-frequency power of 100 W was supplied to parallel-plate electrodes.

The second oxide insulating film was formed by a plasma CVD method in the following conditions: silane at a flow rate of 160 sccm and dinitrogen monoxide at a flow rate of 4000 sccm were used as a source gas, the pressure in the treatment chamber was 200 Pa, the substrate temperature was 220° C., and high-frequency power of 1500 W was supplied to the parallel-plate electrodes. Under the above conditions, it is possible to form a silicon oxynitride film which contains oxygen at a higher proportion than the stoichiometric composition so that part of oxygen is released by heating.

Next, heat treatment was performed to release water, nitrogen, hydrogen, and the like from the first oxide insulating film and the second oxide insulating film and to supply part of oxygen contained in the second oxide insulating film into the oxide semiconductor film. In this example, the heat treatment was performed at 350° C. in a mixed atmosphere of nitrogen and oxygen for one hour.

Then, a 100-nm-thick nitride insulating film was formed over the second oxide insulating film. The nitride insulating film was formed by a plasma CVD method in the following conditions: silane at a flow rate of 50 sccm, nitrogen at a flow rate of 5000 sccm, and an ammonia gas at a flow rate of 100 sccm were used as a source gas, the pressure in the treatment chamber was 100 Pa, the substrate temperature was 350° C., and high-frequency power of 1000 W was supplied to the parallel-plate electrodes.

Subsequently, in a region where the oxide semiconductor film, the source electrode, and the drain electrode were not provided, an opening that reaches the gate electrode was formed in the gate insulating film and the protective film. The opening was formed in the following manner: a mask was formed over the protective film by a photolithography process, and the gate insulating film and the protective film were partly etched using the mask.

After that, a gate electrode was formed over the protective film. The gate electrode was electrically connected to the gate electrode which is under the oxide semiconductor film through the opening provided in the gate insulating film and the protective film. Note that hereinafter, the gate electrode over the protective film is called a back gate electrode.

In this example, as the back gate electrode, a 100-nm-thick conductive film of an indium oxide-tin oxide compound (ITO—$SiO_2$) containing silicon oxide was formed by a sputtering method. Note that the composition of a target used for forming the conductive film was $In_2O_3$:$SnO_2$: $SiO_2$=85:10:5 [wt %]. After that, heat treatment was performed at 250° C. in a nitrogen atmosphere for one hour.

Through the above process, the sample 1 of this example was formed.

[Sample 2]

The sample 2 includes a protective film and a back gate electrode having structures different from those in the sample 1. Specifically, the sample 2 has a structure in which the back gate electrode covers side surfaces of a first oxide insulating film and a second oxide insulating film in the channel width direction of the transistor.

The formation process of the sample 2 is detailed. The first oxide insulating film and the second oxide insulating film were formed, heat treatment was performed, and then a mask was formed over the second oxide insulating film by a photolithography process. Subsequently, the first oxide insulating film and the second oxide insulating film were partly etched using the mask. The sample 2 was formed in the same manner as the sample 1, except for the above; thus, the descriptions for the sample 1 can be referred to.

[Sample 3]

The sample 3 for comparison is different from the sample 1 in that a back gate electrode is not included.

The sample 3 was formed using the above-described formation process of the sample 1, excluding the step for forming the back gate electrode. The sample 3 was formed in the same manner as the sample 1, except for the above; thus, the descriptions for the sample 1 can be referred to.

Note that as each of the samples 1 to 3, three kinds of transistors were formed in which channel widths W were 50 μm and channel lengths L were 2 μm, 3 μm, and 6 μm. The transistors as the samples 1 to 3 each had a channel width (W) of 50 μm.

[$V_g$–$I_d$ Characteristics]

Next, the initial $V_g$–$I_d$ characteristics of transistors, the samples 1 to 3 were measured. In this example, changes in characteristics of current flowing between a source electrode and a drain electrode (hereinafter referred to as drain current: $I_d$), that is, $V_g$–$I_d$ characteristics were measured in the following conditions: the substrate temperature was 25° C., the potential difference between the source and drain electrodes (hereinafter also referred to as drain voltage: $V_d$) was 1 V or 10 V, and the potential difference between the source and the back gate electrodes (hereinafter also referred to as gate voltage: $V_g$) was changed from −15 V to 15 V.

Here, the sample 1 and the sample 2 were driven by a method in which gate voltage is applied in a state where the gate electrode and the back gate electrode are electrically short-circuited. In the dual-gate driving, the gate electrode always has the same gate voltage as the back gate electrode.

Figure 26A:
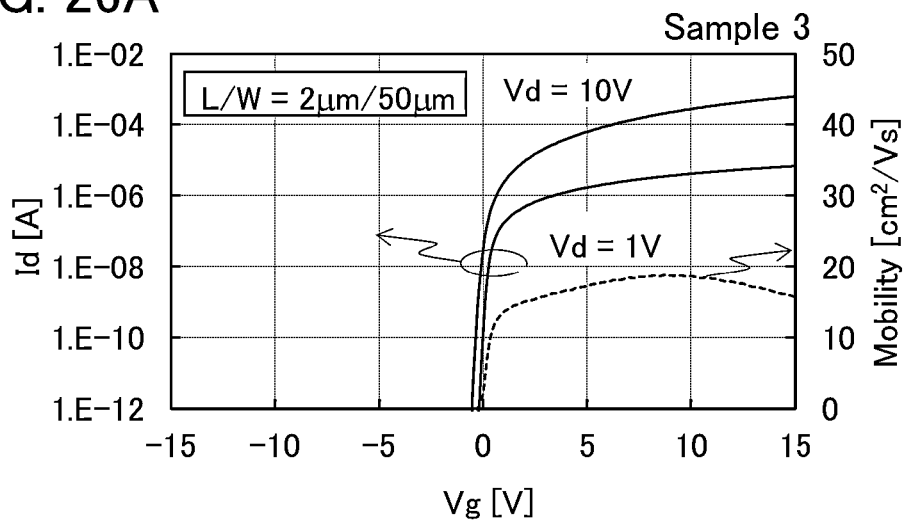
FIGS. 26A to 26C show $V_g$-$I_d$ characteristics of a transistor in Example.
Figure 26B:
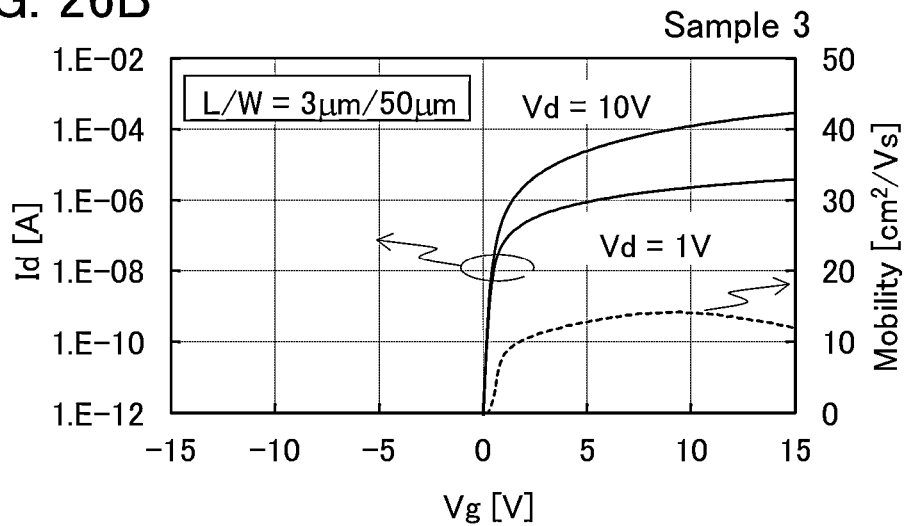
Figure 26C:
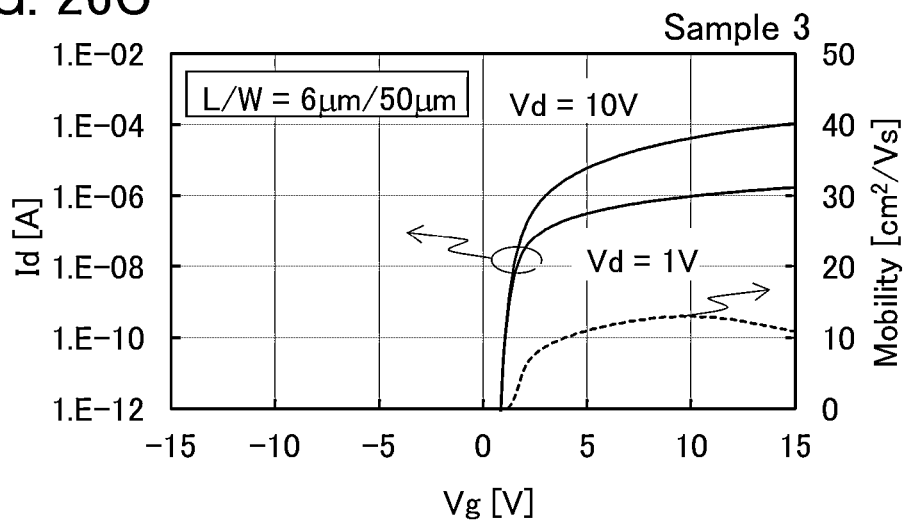

FIGS. 26A to 26C show the $V_g$–$I_d$ characteristics of the sample 3. FIGS. 26A to 26C show results of the transistors with channel lengths L of 2 μm, 3 μm, and 6 μm, respectively. Similarly, FIGS. 27A to 27C show the $V_g$–$I_d$ characteristics of the sample 1 and FIGS. 28A to 28C show the $V_g$–$I_d$ characteristics of the sample 2.

In each of FIGS. 26A to 26C, FIGS. 27A to 27C, and FIGS. 28A to 28C, the lateral axis, the first longitudinal axis, and the second longitudinal axis represent gate voltage $V_g$, drain current $I_d$, and field-effect mobility, respectively. Here, to show field-effect mobility in a saturation region, field-effect mobility calculated when $V_d$=10 V is shown.

As shown in FIGS. 26A to 26C, the field-effect mobility hardly changes regardless of the channel length L in the sample 3 for comparison. It is shown that as the channel length L becomes smaller and the drain voltage $V_d$ is increased, a shift in the threshold voltage in a negative direction proceeds.

Figure 27A:
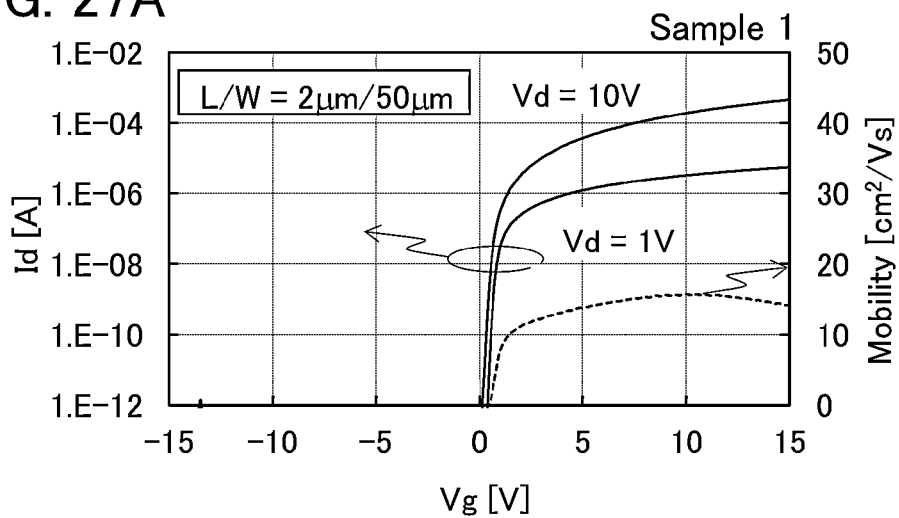
FIGS. 27A to 27C show $V_g$-$I_d$ characteristics of a transistor in Example.
Figure 27B:
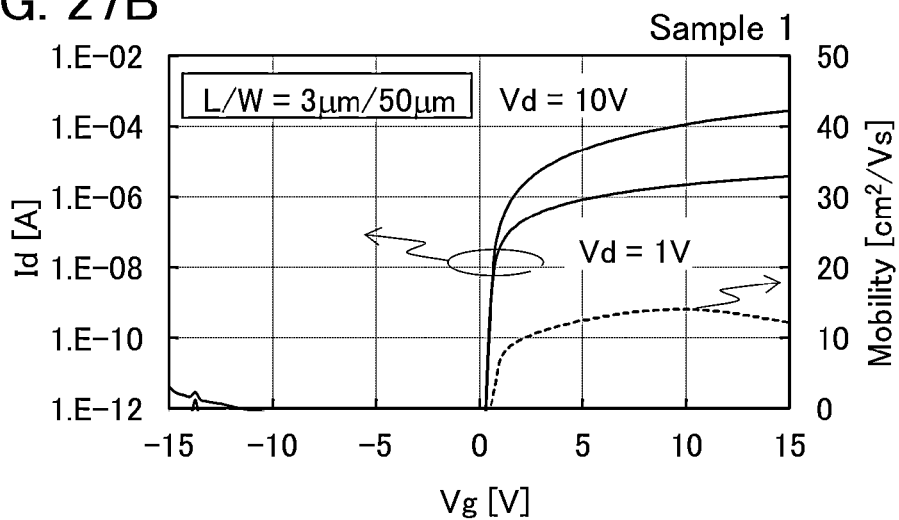
Figure 27C:
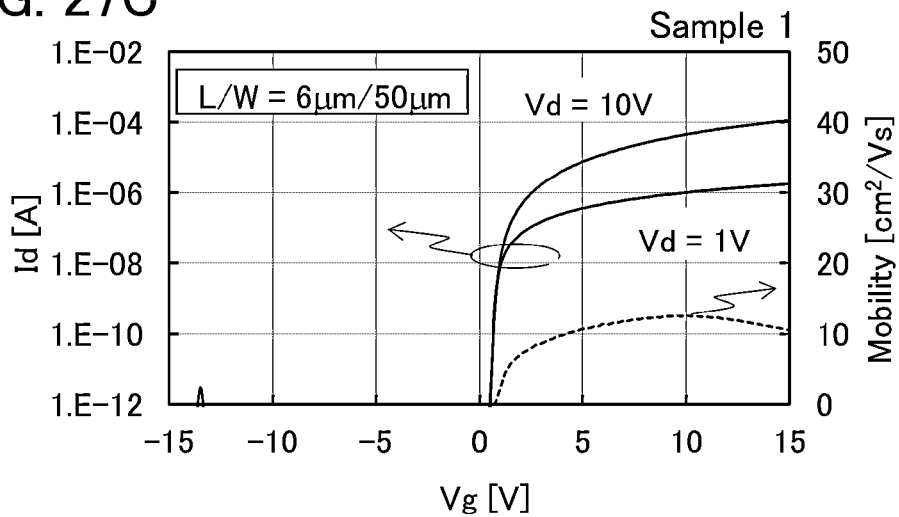
Figure 28A:
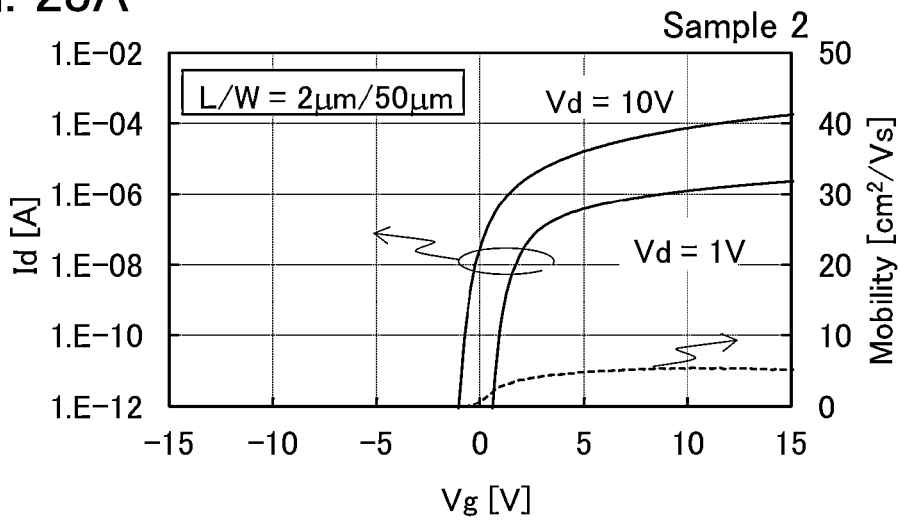
FIGS. 28A to 28C show $V_g$-$I_d$ characteristics of a transistor in Example.
Figure 28B:
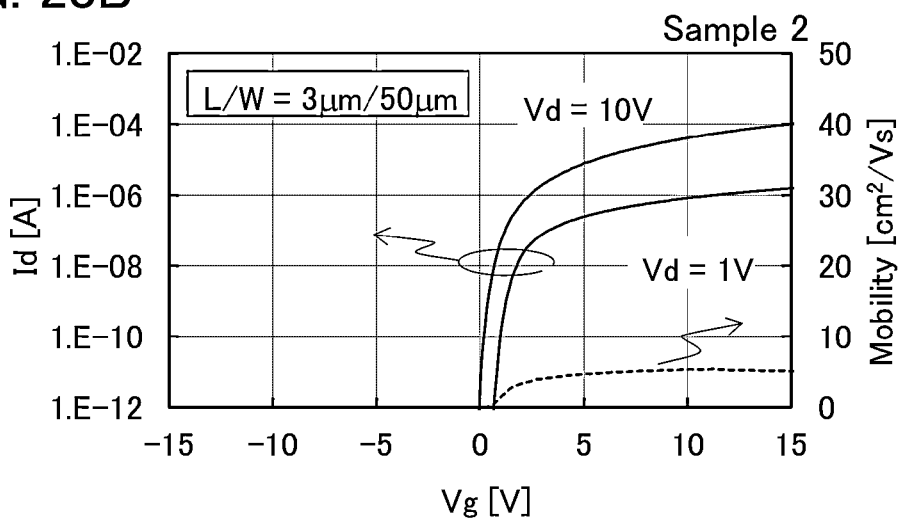
Figure 28C:
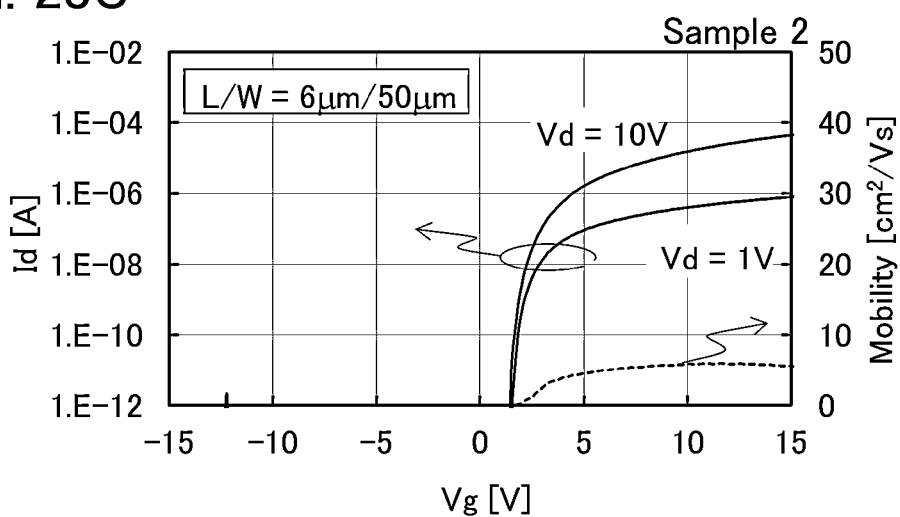

As shown in FIGS. 27A to 27C, in any of the cases of channel lengths L, the field-effect mobility of the sample 1, which is one embodiment of the present invention, is improved in comparison with the sample 3. In addition, the field-effect mobility is further improved as the channel length L becomes smaller. Furthermore, even in the case of the smallest channel length L (i.e., L=2 µm), a change in the threshold voltage with respect to the drain voltage Vd in the sample 1 is much smaller than that in the sample 3.

As shown in FIGS. 28A to 28C, in any of the cases of channel lengths L, the field-effect mobility of the sample 2, which is one embodiment of the present invention, is improved in comparison with the sample 3. In addition, the field-effect mobility is further improved as the channel length L becomes smaller. Furthermore, even in the case of the smallest channel length L (i.e., L=2 µm), a change in the threshold voltage with respect to the drain voltage Vd in the sample 2 is much smaller than that in the sample 3.

Owing to the dual-gate driving, an electric field can be applied to an oxide semiconductor where a channel is formed more effectively in the samples 1 and 2 than in the sample 3; consequently, a change in the threshold voltage with respect to the drain voltage $V_d$ can be small in each of the samples 1 and 2 even when the channel length L is small. For the same reason, owing to the dual-gate driving, the samples 1 and 2 are less likely to be affected by the drain voltage $V_d$, and the threshold voltage can be further saturated in the saturation region.

The above results suggest that in the semiconductor device of one embodiment of the present invention, the field-effect mobility of a transistor is increased as the channel length L becomes smaller, and the threshold voltage can have a favorable value even in the case of a small channel length L. The use of such a transistor enables a semiconductor display device to have a narrower frame width.

EXPLANATION OF REFERENCE

10: sequential circuit, 10_DUM: sequential circuit, 10_j: sequential circuit, 10_j-1: sequential circuit, 10_y: sequential circuit, 10_1: sequential circuit, 10_8m: sequential circuit, 11: circuit, 12: transistor, 13: transistor, 14: transistor, 15: transistor, 16: transistor, 17: transistor, 20: transistor, 21: conductive film, 22: insulating film, 23: oxide semiconductor film, 23a: oxide semiconductor film, 23b: oxide semiconductor film, 23c: oxide semiconductor film, 24: conductive film, 25: conductive film, 26: insulating film, 27: insulating film, 28: nitride insulating film, 29: insulating film, 30: conductive film, 31: substrate, 32: opening, 32a: opening, 32b: opening, 34: conductive film, 40: conductive film, 41: oxide semiconductor film, 42: metal oxide film, 42a: oxide semiconductor film, 43: conductive film, 44: conductive film, 45: conductive film, 46: substrate, 47: shielding film, 48: coloring layer, 50: resin film, 51: alignment film, 52: alignment film, 53: liquid crystal layer, 55: pixel, 56: transistor, 57: capacitor, 58: opening, 59: conductive film, 60: liquid crystal element, 61: conductive film, 62: opening, 70: semiconductor display device, 71: pixel portion, 72: driver circuit, 73: driver circuit, 80: transistor, 81: transistor, 82: transistor, 83: transistor, 84: transistor, 85: transistor, 86: transistor, 90: buffer, 91: transistor, 92: transistor, 93: transistor, 95: transistor, 96: transistor, 97: capacitor, 98: light-emitting element, 4001: substrate, 4002: pixel portion, 4003: driver circuit, 4004: driver circuit, 4005: sealant, 4006: substrate, 4010: transistor, 4018: FPC, 4020: insulating film, 4021: pixel electrode, 4023: liquid crystal element, 4028: liquid crystal layer, 4030: wiring, 4050: conductive film, 4059: resin film, 4060: common electrode, 4061: conductive particle, 4062: resin film, 5001: housing, 5002: housing, 5003: display portion, 5004: display portion, 5005: microphone, 5006: speaker, 5007: operation key, 5008: stylus, 5201: housing, 5202: display portion, 5203: operation button, 5204: bracelet, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, 5806: joint, 5901: housing, 5902: display portion, 5903: camera, 5904: speaker, 5905: button, 5906: external connection portion, and 5907: microphone.

This application is based on Japanese Patent Application serial no. 2013-119037 filed with Japan Patent Office on Jun. 5, 2013, the entire contents of which are hereby incorporated by reference.

The invention claimed is:

1. A semiconductor device comprising:
   a first insulating film comprising a nitride;
   a driver circuit comprising:
     a first transistor including a first gate, a second gate, a semiconductor film between the first gate and the second gate, a second insulating film, and a third insulating film comprising a nitride, each of the second insulating film and the third insulating film between the second gate and the semiconductor film; and
     a second transistor; and
   a pixel portion comprising:
     a third transistor;
     a liquid crystal element comprising:
       a first transparent conductive film electrically connected to the third transistor;
       a first conductive film over the first transparent conductive film; and
       a liquid crystal layer between the first transparent conductive film and the first conductive film; and
     a capacitor comprising:
       a second transparent conductive film;
       the first transparent conductive film over the second transparent conductive film; and
       the third insulating film between the first transparent conductive film and the second transparent conductive film, the third insulating film is in contact with the second transparent conductive film,
   wherein a first portion of the first insulating film comprises the second insulating film and the third insulating film over the second insulating film,
   wherein a second portion of the first insulating film comprises the third insulating film in the capacitor,
   wherein the first gate of the first transistor is electrically connected to the second gate of the first transistor,
   wherein one of a source and a drain of the first transistor is configured to receive a first potential,
   wherein one of a source and a drain of the second transistor is configured to receive a second potential,
   wherein the second potential is lower than the first potential, and
   wherein the other of the source and the drain of the second transistor is electrically connected to the other of the source and the drain of the first transistor.

2. The semiconductor device according to claim 1,
wherein the one of the source and the drain of the first transistor is further configured to receive the second potential, and
wherein the one of the source and the drain of the first transistor is configured to receive the first potential and the second potential alternately.

3. The semiconductor device according to claim 1, wherein each of a first channel formation region of the first transistor, a second channel formation region of the second transistor and a third channel formation region of the third transistor comprises an oxide semiconductor film.

4. The semiconductor device according to claim 3, wherein the oxide semiconductor film comprises In, Zn and O.

5. The semiconductor device according to claim 1, wherein the first insulating film comprises a height difference between the first portion of the first insulating film and the second portion of the first insulating film.

6. The semiconductor device according to claim 1, wherein the second transparent conductive film comprises In, Zn and O.

7. The semiconductor device according to claim 3, wherein end portions of the oxide semiconductor film of the first transistor overlap the first gate of the first transistor and the second gate of the first transistor in a channel width direction.

8. The semiconductor device according to claim 1, wherein the first transistor has a channel length greater than or equal to 0.5 μm, and less than or equal to 4.5 μm.

9. A semiconductor device comprising:
a first insulating film comprising a nitride;
a driver circuit comprising:
  a first transistor including a first gate, a second gate, a semiconductor film between the first gate and the second gate, a second insulating film, and a third insulating film comprising a nitride, each of the second insulating film and the third insulating film between the second gate and the semiconductor film; and
  a second transistor;
a pixel portion comprising:
  a third transistor;
  a liquid crystal element comprising:
    a first transparent conductive film electrically connected to the third transistor;
    a first conductive film over the first transparent conductive film; and
    a liquid crystal layer between the first transparent conductive film and the first conductive film; and
  a capacitor comprising:
    a second transparent conductive film;
    the first transparent conductive film over the second transparent conductive film; and
    the third insulating film between the first transparent conductive film and the second transparent conductive film, the third insulating film is in contact with the second transparent conductive film,
wherein a first portion of the first insulating film comprises the second insulating film and the third insulating film over the second insulating film,
wherein a second portion of the first insulating film comprises the third insulating film in the capacitor,
wherein the first gate of the first transistor is electrically connected to the second gate of the first transistor,
wherein the second gate of the first transistor is in contact with the first insulating film,
wherein the first transparent conductive film is in contact with the first insulating film,
wherein one of a source and a drain of the first transistor is configured to receive a first potential,
wherein one of a source and a drain of the second transistor is configured to receive a second potential,
wherein the second potential is lower than the first potential, and
wherein the other of the source and the drain of the second transistor is electrically connected to the other of the source and the drain of the first transistor.

10. The semiconductor device according to claim 9,
wherein the one of the source and the drain of the first transistor is further configured to receive the second potential, and
wherein the one of the source and the drain of the first transistor is configured to receive the first potential and the second potential alternately.

11. The semiconductor device according to claim 9, wherein each of a first channel formation region of the first transistor, a second channel formation region of the second transistor and a third channel formation region of the third transistor comprises an oxide semiconductor film.

12. The semiconductor device according to claim 10, wherein the oxide semiconductor film comprises In, Zn and O.

13. The semiconductor device according to claim 10, wherein the first insulating film comprises a height difference between the first portion of the first insulating film and the second portion of the first insulating film.

14. The semiconductor device according to claim 9, wherein the second transparent conductive film comprises In, Zn and O.

15. The semiconductor device according to claim 10, wherein end portions of the oxide semiconductor film of the first transistor overlap the first gate of the first transistor and the second gate of the first transistor in a channel width direction.

16. The semiconductor device according to claim 9, wherein the first transistor has a channel length greater than or equal to 0.5 μm, and less than or equal to 4.5 μm.

17. The semiconductor device according to claim 9, wherein the second gate of the first transistor and the first transparent conductive film comprise the same material.

18. The semiconductor device according to claim 1, wherein the second insulating film comprises an opening in the second portion of the first insulating film.

19. The semiconductor device according to claim 9, wherein the second insulating film comprises an opening in the second portion of the first insulating film.

20. A semiconductor device comprising:
a first insulating film comprising a nitride;
a driver circuit comprising:
  a first transistor including a first gate, a second gate, a semiconductor film between the first gate and the second gate, a second insulating film, and a third insulating film comprising a nitride, each of the second insulating film and the third insulating film between the second gate and the semiconductor film; and
  a second transistor; and
a pixel portion comprising:
  a third transistor;
  a liquid crystal element comprising:
    a first transparent conductive film electrically connected to the third transistor;

a first conductive film over the first transparent conductive film; and
a liquid crystal layer between the first transparent conductive film and the first conductive film; and
a capacitor comprising:
the first transparent conductive film;
a second transparent conductive film;
the first transparent conductive film over the second transparent conductive film; and
the third insulating film between the first transparent conductive film and the second transparent conductive film, the third insulating film is in contact with the second transparent conductive film,
wherein a first portion of the first insulating film comprises the second insulating film and the third insulating film over the second insulating film,
wherein a second portion of the first insulating film comprises the third insulating film in the capacitor,
wherein the first gate of the first transistor is electrically connected to the second gate of the first transistor,
wherein the second gate of the first transistor is in contact with the first insulating film,
wherein the first transparent conductive film is in contact with the first insulating film, and
wherein one of a source and a drain of the second transistor is electrically connected to one of a source and a drain of the first transistor.

21. The semiconductor device according to claim 20, wherein each of a first channel formation region of the first transistor, a second channel formation region of the second transistor and a third channel formation region of the third transistor comprises an oxide semiconductor film.

22. The semiconductor device according to claim 21, wherein the oxide semiconductor film comprises In, Zn and O.

23. The semiconductor device according to claim 21, wherein the second transparent conductive film comprises In, Zn and O.

24. The semiconductor device according to claim 21, wherein end portions of the oxide semiconductor film of the first transistor overlap the first gate of the first transistor and the second gate of the first transistor in a channel width direction.

* * * * *

UNITED STATES PATENT AND TRADEMARK OFFICE
CERTIFICATE OF CORRECTION

PATENT NO.         : 9,494,830 B2
APPLICATION NO.    : 14/290263
DATED              : November 15, 2016
INVENTOR(S)        : Yamazaki et al.

It is certified that error appears in the above-identified patent and that said Letters Patent is hereby corrected as shown below:

In the Claims

Claim 12, Column 56, Line 24, "claim 10," should be --claim 11,--;

Claim 13, Column 56, Line 27, "claim 10," should be --claim 11,--;

Claim 15, Column 56, Line 34, "claim 10," should be --claim 11,--.

Signed and Sealed this
Twenty-eighth Day of February, 2017

Michelle K. Lee
*Director of the United States Patent and Trademark Office*